United States Patent
Hanzawa

(10) Patent No.: US 8,289,764 B2
(45) Date of Patent: Oct. 16, 2012

(54) SEMICONDUCTOR DEVICE

(75) Inventor: Satoru Hanzawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/139,297

(22) PCT Filed: Dec. 7, 2009

(86) PCT No.: PCT/JP2009/070452
§ 371 (c)(1),
(2), (4) Date: Jun. 11, 2011

(87) PCT Pub. No.: WO2010/067768
PCT Pub. Date: Jun. 17, 2010

(65) Prior Publication Data
US 2011/0242872 A1    Oct. 6, 2011

(30) Foreign Application Priority Data

Dec. 11, 2008  (JP) ................................. 2008-315608

(51) Int. Cl.
*G11C 11/00* (2006.01)
(52) U.S. Cl. .................... 365/163; 365/148; 365/175
(58) Field of Classification Search ............. 365/51, 365/63, 171–173, 175, 163, 148
See application file for complete search history.

(56) References Cited

U.S. PATENT DOCUMENTS

| 2004/0004875 | A1* | 1/2004 | Hanzawa et al. | ............. 365/202 |
| 2005/0270883 | A1 | 12/2005 | Cho et al. | |
| 2006/0197115 | A1 | 9/2006 | Toda | |
| 2006/0215440 | A1 | 9/2006 | Cho et al. | |

FOREIGN PATENT DOCUMENTS

| JP | 2005-353257 | A | 12/2005 |
| JP | 2006-079756 | A | 3/2006 |
| JP | 2006-514440 | A | 4/2006 |
| JP | 2006-269062 | A | 10/2006 |

OTHER PUBLICATIONS

Kwang-Jin Lee et al., "A 90nm 1.8V 512Mb Diode-Switch PRAM with 266MB/s Read Throughput", IEEE International Solid-State Circuits Conference, Digest of Technical Papers, Feb. 2007, pp. 472-473.

Kwang-Jin Lee et al., "A 90 nm 1.8 V 512 Mb Diode-Switch PRAM With 266 MB/s Read Throughput", IEEE Journal of Solid-State Circuits, vol. 43, No. 1, Jan. 2008, pp. 150-161.

* cited by examiner

*Primary Examiner* — VanThu Nguyen
*Assistant Examiner* — Hien Nguyen
(74) *Attorney, Agent, or Firm* — Miles & Stockbridge P.C.

(57) ABSTRACT

A highly-reliable, highly-integrated large-capacity phase-change memory is achieved. For this purpose, for example, memory tiles MT0, MT1 are provided respectively at points of intersection of global bit line GBL0 and global word lines GWL00B, GWL01B. Word lines WL000 of MT0, MT1 are commonly connected to an output from a word-line driving circuit WD0 which is controlled by GWL00B, and word lines WL001 of MT0, MT1 are commonly connected to an output from a word-line driving circuit WD1 controlled by GWL01B. For example, when WD0 is activated in accordance with a rewrite operation, an output from WD0 is connected to GBL0 via any one of four memory cells MC00, MC01 connected to WL000 of MT0, MT1.

19 Claims, 49 Drawing Sheets

| State | DX00 | XIJTCRG | DISCRGB | GWL00B | WL000 |
|---|---|---|---|---|---|
| Standby | Don't care | VSS | VWT | VSS | VA (= VWT or VRD) |
| All unselected | Don't care | VSS | VSS | VWT | VSS |
| Selected | VWT | VWT | VSS | VSS | VA (= VWT or VRD) |

| X1 | X0 | DX | | | | GWLB | | | | WL | | | |
|---|---|---|---|---|---|---|---|---|---|---|---|---|---|
| | | 00 | 01 | 10 | 11 | 00 | 01 | 10 | 11 | 00 | 01 | 10 | 11 |
| 0 | 0 | VWT | VSS | VSS | VSS | VSS | VWT | VWT | VWT | VA | VSS | VSS | VSS |
| 0 | 1 | VSS | VWT | VSS | VSS | VWT | VSS | VWT | VWT | VSS | VA | VSS | VSS |
| 1 | 0 | VSS | VSS | VWT | VSS | VWT | VWT | VSS | VWT | VSS | VSS | VA | VSS |
| 1 | 1 | VSS | VSS | VSS | VWT | VWT | VWT | VWT | VSS | VSS | VSS | VSS | VA |

FIG. 8

| X1 | Y1 | Y0 | DY 00 | 01 | 02 | 03 | 10 | 11 | 12 | 13 | BLS 00 | 01 | 02 | 03 | 10 | 11 | 12 | 13 |
|---|---|---|---|---|---|---|---|---|---|---|---|---|---|---|---|---|---|---|
| 0 | 0 | 0 | VWT | VSS | VSS | VSS | VSS | VSS | VSS | VSS | VWT | VSS | VSS | VSS | VSS | VSS | VSS | VSS |
| 0 | 0 | 1 | VSS | VWT | VSS | VSS | VSS | VSS | VSS | VSS | VSS | VWT | VSS | VSS | VSS | VSS | VSS | VSS |
| 0 | 1 | 0 | VSS | VSS | VWT | VSS | VSS | VSS | VSS | VSS | VSS | VSS | VWT | VSS | VSS | VSS | VSS | VSS |
| 0 | 1 | 1 | VSS | VSS | VSS | VWT | VSS | VSS | VSS | VSS | VSS | VSS | VSS | VWT | VSS | VSS | VSS | VSS |
| 1 | 0 | 0 | VSS | VSS | VSS | VSS | VWT | VSS | VSS | VSS | VSS | VSS | VSS | VSS | VWT | VSS | VSS | VSS |
| 1 | 0 | 1 | VSS | VSS | VSS | VSS | VSS | VWT | VSS | VSS | VSS | VSS | VSS | VSS | VSS | VWT | VSS | VSS |
| 1 | 1 | 0 | VSS | VSS | VSS | VSS | VSS | VSS | VWT | VSS | VSS | VSS | VSS | VSS | VSS | VSS | VWT | VSS |
| 1 | 1 | 1 | VSS | VSS | VSS | VSS | VSS | VSS | VSS | VWT | VSS | VSS | VSS | VSS | VSS | VSS | VSS | VWT |

FIG. 15

| X2 | Y1 | Y0 | BLS | | | | | | | |
|---|---|---|---|---|---|---|---|---|---|---|
| | | | 00 | 01 | 02 | 03 | 10 | 11 | 12 | 13 |
| 0 | 0 | 0 | VWT | VSS | VSS | VSS | VSS | VSS | VSS | VSS |
| | | 1 | VSS | VWT | VSS | VSS | VSS | VSS | VSS | VSS |
| | 1 | 0 | VSS | VSS | VWT | VSS | VSS | VSS | VSS | VSS |
| | | 1 | VSS | VSS | VSS | VWT | VSS | VSS | VSS | VSS |
| 1 | 0 | 0 | VSS | VSS | VSS | VSS | VWT | VSS | VSS | VSS |
| | | 1 | VSS | VSS | VSS | VSS | VSS | VWT | VSS | VSS |
| | 1 | 0 | VSS | VSS | VSS | VSS | VSS | VSS | VWT | VSS |
| | | 1 | VSS | VSS | VSS | VSS | VSS | VSS | VSS | VWT |

FIG. 16

| X2 | X1 | X0 | GWLB | | | | | | | | | | | | | | WL | | | | | | | | | | |
|---|---|---|---|---|---|---|---|---|---|---|---|---|---|---|---|---|---|---|---|---|---|---|---|---|---|---|---|
| | | | 00 | 01 | 02 | 03 | 10 | 11 | 12 | 13 | | | | | | 000 | 001 | 002 | 003 | 100 | 101 | 102 | 103 | | | |
| 0 | 0 | 0 | VSS | VWT | VWT | VWT | VWT | VWT | VWT | VWT | | | | | | VWT | VSS | VSS | VSS | VSS | VSS | VSS | VSS | | | |
| 0 | 0 | 1 | VWT | VSS | VWT | VWT | VWT | VWT | VWT | VWT | | | | | | VSS | VWT | VSS | VSS | VSS | VSS | VSS | VSS | | | |
| 0 | 1 | 0 | VWT | VWT | VSS | VWT | VWT | VWT | VWT | VWT | | | | | | VSS | VSS | VWT | VSS | VSS | VSS | VSS | VSS | | | |
| 0 | 1 | 1 | VWT | VWT | VWT | VSS | VWT | VWT | VWT | VWT | | | | | | VSS | VSS | VSS | VWT | VSS | VSS | VSS | VSS | | | |
| 1 | 0 | 0 | VWT | VWT | VWT | VWT | VSS | VWT | VWT | VWT | | | | | | VSS | VSS | VSS | VSS | VWT | VSS | VSS | VSS | | | |
| 1 | 0 | 1 | VWT | VWT | VWT | VWT | VWT | VSS | VWT | VWT | | | | | | VSS | VSS | VSS | VSS | VSS | VWT | VSS | VSS | | | |
| 1 | 1 | 0 | VWT | VWT | VWT | VWT | VWT | VWT | VSS | VWT | | | | | | VSS | VSS | VSS | VSS | VSS | VSS | VWT | VSS | | | |
| 1 | 1 | 1 | VWT | VWT | VWT | VWT | VWT | VWT | VWT | VSS | | | | | | VSS | VSS | VSS | VSS | VSS | VSS | VSS | VWT | | | |

FIG. 17

|  | WE | RE | Y1 | DE | | WE | | RE | |
|---|---|---|---|---|---|---|---|---|---|
|  |  |  |  | 0 | 1 | 0 | 1 | 0 | 1 |
| Standby | 0 | 0 | 0 | VWT | VWT | VSS | VSS | VSS | VSS |
|  |  |  | 1 | VWT | VWT | VSS | VSS | VSS | VSS |
| Write | 1 | 0 | 0 | VSS | VWT | VWT | VSS | VSS | VSS |
|  |  |  | 1 | VWT | VSS | VSS | VWT | VSS | VSS |
| Read | 0 | 1 | 0 | VSS | VWT | VSS | VSS | VWT | VSS |
|  |  |  | 1 | VWT | VSS | VSS | VSS | VSS | VWT |

FIG. 27

| X1 | Y2 | Y0 | LS | | | | | | | |
|---|---|---|---|---|---|---|---|---|---|---|
| | | | 00 | 01 | 02 | 03 | 10 | 11 | 12 | 13 |
| 0 | 0 | 0 | VWT | VSS | VSS | VSS | VSS | VSS | VSS | VSS |
| | | 1 | VSS | VWT | VSS | VSS | VSS | VSS | VSS | VSS |
| | 1 | 0 | VSS | VSS | VWT | VSS | VSS | VSS | VSS | VSS |
| | | 1 | VSS | VSS | VSS | VWT | VSS | VSS | VSS | VSS |
| 1 | 0 | 0 | VSS | VSS | VSS | VSS | VWT | VSS | VSS | VSS |
| | | 1 | VSS | VSS | VSS | VSS | VSS | VWT | VSS | VSS |
| | 1 | 0 | VSS | VSS | VSS | VSS | VSS | VSS | VWT | VSS |
| | | 1 | VSS | VSS | VSS | VSS | VSS | VSS | VSS | VWT |

FIG. 28

| X1 | Y2 | Y1 | BLS | | | | | | | |
|---|---|---|---|---|---|---|---|---|---|---|
| | | | 00 | 01 | 02 | 03 | 10 | 11 | 12 | 13 |
| 0 | 0 | 0 | VWT | VSS | VSS | VSS | VSS | VSS | VSS | VSS |
| | | 1 | VSS | VWT | VSS | VSS | VSS | VSS | VSS | VSS |
| | 1 | 0 | VSS | VSS | VWT | VSS | VSS | VSS | VSS | VSS |
| | | 1 | VSS | VSS | VSS | VWT | VSS | VSS | VSS | VSS |
| 1 | 0 | 0 | VSS | VSS | VSS | VSS | VWT | VSS | VSS | VSS |
| | | 1 | VSS | VSS | VSS | VSS | VSS | VWT | VSS | VSS |
| | 1 | 0 | VSS | VSS | VSS | VSS | VSS | VSS | VWT | VSS |
| | | 1 | VSS | VSS | VSS | VSS | VSS | VSS | VSS | VWT |

SEMICONDUCTOR DEVICE

TECHNICAL FIELD

The present invention relates to semiconductor devices and, in particular, to an effective technology applicable to semiconductor devices including a storage device in which each memory cell stores information based on a difference in resistance values, typically, a storage device such as a phase-change memory in which each memory cell stores information by using a state change of a chalcogenide material.

BACKGROUND ART

For example, in Non-Patent Document 1 and Non-Patent Document 2, a phase-change memory with a chalcogenide material as a storage element and a diode as a selecting element is described. As a chalcogenide material, a Ge—Sb—Te group, an Ag—In—Sb—Te group, or the like containing at least antimony (Sb) and tellurium (Te) is used.

FIG. 51 is a drawing of local cell arrays LCA0 to LCAn from a memory core structure described in FIG. 2 of Non-Patent Document 1. Each of the local cell arrays, as typified by the local cell array LCA0, has a structure in which memory cells MC00 to MCnn each having a resistive storage element R and a diode for selection D using a phase-change material serially connected are disposed respectively at points of intersection of (n+1) local bit lines LBL0 to LBLn and (n+1) word lines WL0 to WLn.

The local bit lines LBL0 to LBLn are connected to a global bit line GBL0 via NMOS transistors MNYS0 to MNYSn, respectively, MNYS0 to MNYSn are controlled by local column selection signals LY0 to LYn, respectively, connected to gate electrodes. That is, with one of MNYS0 to MNYSn being activated to conduction, one of LBL0 to LBLn is electrically connected to GBL0. Note that NMOS transistors MND0 to MNDn are respectively inserted between LBL0 to LBLn and a ground voltage VSS. MND0 to MNDn are controlled by a local-bit-line discharge signal LBLDIS connected to each gate electrode.

FIG. 52 is a drawing of blocks selected in a read operation from a circuit block diagram in a read route described in FIG. 6 of Non-Patent Document 2. A selected block BLOCK_i is configured of four input/output blocks IO-block0 to IO-block3. Above and below each input/output block, a circuit controlling a connection between a bit line and a global bit line GBL (a local column decoder) LYDEC is disposed. Also, on the left and right of each input/output block, a section-word-line driving circuit SWD is disposed. To suppress fluctuations of voltage of a word line that is to be at a ground voltage, each section-word-line driving circuit SWD drives the word line extending over the input/output blocks on the left and right. Note that each section-word-line driving circuit SWD is controlled by a common main word line.

Also, FIG. 7 of Patent Document 1 depicts a block structure when a multibank scheme is adopted to a cross-point memory. In this document, a semiconductor storage device having a memory cell array structure in which a memory cell does not include an element for selection other than a storage element, and the storage element is directly connected to a data line (a row selection line) and a bit line (a column selection line) in a memory cell is referred to as a cross-point memory. In particular, in FIG. 7, a variable resistance element is used as a storage element. Also, in the multibank scheme in this document, a small-sized memory cell array is called one memory bank, and a plurality of such memory banks are disposed in a matrix in a row direction and a column direction to achieve a desired memory capacity (the number of memory cells).

In this memory cell array, the number of memory cells that are connected to one data line and one bit line is restricted to any value. In this multibank scheme, main data lines GD as many as the number of data lines of each of banks BKk arranged along a row direction each cross over each bank to extend in a row direction, and are respectively connected to data lines DLi via a bank selection transistor BDk. Also, main bit lines GBLj as many as the number of bit lines of each of the banks arranged along a column direction each cross over each bank to extend in a column direction, and are respectively connected to bit lines BLj via a bank selection transistor BBk. Here, i represents a data line number, j represents a bit line number, and k represents a bank number. Each bank is configured of the same number of main data lines GDLi and data lines DLi and the same number of main bit lines GBLj and bit lines BLj.

In this structure, a predetermined data line voltage supplied from a data line driver 10 connected to the main data line GDLj is supplied to each data line DLi of the selected bank via the main data line GDLi. Also, a predetermined bit line voltage supplied from a bit line driver 20 connected to the main bit line GBLi is supplied to each bit line BLj of the selected bank via the main bit line GBLj. Thus, a desired memory cell can be selected. Also, in the cross-point memory of the multibank scheme, a predetermined voltage is applied to each data line DLi and each bit line BLj of only the selected bank, thereby letting a current flow. Such voltage application is not performed on the other unselected banks, and current consumption does not occur, thereby contributing to low power consumption.

Also, FIG. 8 of Patent Document 1 depicts an example, where a plurality of above-described banks (memory cell arrays) are disposed in a mask ROM having a memory cell array structure of a general virtual ground type, of a current route when a memory cell in one bank is read and a current route when a pre-charge voltage is supplied to the same bank. A drain in a memory cell transistor of a memory cell of a virtual ground type is connected to a bit line, and its source is connected to a virtual ground line, the bit line and the virtual ground line alternately extending in a column direction. Memory cells adjacent to each other in a row direction across the bit line share the bit line, and memory cells adjacent to each other in a row direction across the virtual ground line share the virtual ground line. The gate of the memory cell transistor is connected to a word line extending in a row direction.

In the multibank scheme depicted in the drawing, the word lines of each bank are configured such that corresponding word lines are connected to each other to be shared by a common word driver, and bank selection is performed with a bit line and a virtual ground line. That is, a main bit line and a main virtual ground line are provided so as to go across each of the banks arranged in a column direction. In each bank, one main bit line is provided for two bit lines, and one main virtual ground line is provided for two virtual ground lines. One main bit line is connected individually to two bit lines via two bank selection transistors with different bank selection lines as gate inputs. Simultaneously, one main virtual ground line is connected individually to two virtual ground lines via two bank selection transistors with different bank selection lines as gate inputs.

In the structure exemplarily depicted in the drawing, for example, in each of the banks BK0 to 3, 32 memory cells in a row direction and 32 memory cells in a column direction are arranged in a matrix. Furthermore, the banks BK0 to 3 are also arranged in a matrix of 2×2. For example, when a memory cell to be read is present in the bank BK0, all of the bank selection transistors connected to the bank BK1 to 3 are turned OFF. With this, no current is supplied to the banks BK1 to 3 except the bank BK0, and reduction in consumed current can be achieved, which is the same as the cross-point memory. In the drawing, to read a memory cell current of the selected memory cell to be read in the bank BK0, which is surrounded by a circle mark in the drawing, one bank selection line is activated to turn one bank selection transistor ON and turn the other bank selection transistor OFF. A solid arrow indicates a memory cell current route. The signal levels of two bank selection lines for bit line selection and for virtual ground line selection are determined when the selected memory cell is read. Thus, a pre-charge voltage is supplied to a bit line three lines away from the selected memory cell to the right in the drawing. The current route to which this pre-charge voltage is supplied is indicated by a broken arrow.

Furthermore, FIG. 1 of Patent Document 1 depicts an example of a multibank scheme in which the number of main data lines GDLm to be connected to each of banks disposed on the same row is half (four) the number (eight) of data lines DLi of each bank. Here, m in a main data lines GDLm represents a main data line number. To main data lines GDLm, a data line driver 10 individually driving the lines and supplying a predetermined data line voltage is connected. A data-line selection transistor TDik is disposed between the main data lines and the data lines. The data-line selection transistor TDik is controlled by a bank data selection line SDik connected to its gate. By appropriately controlling the bank data selection line SDik, any one of banks BKk is selected, and either one or both of two data lines DL corresponding to one main data line GDL are selected.

PRIOR ART DOCUMENTS

Patent Document
Patent Document 1: Japanese Patent Application Laid-Open Publication No. 2006-079756
Non-Patent Documents
Non-Patent Document 1: "IEEE International Solid-State Circuits Conference, Digest of Technical Papers", February 2007, pp. 472-473
Non-Patent Document 2: "IEEE Journal of Solid-State Circuits, Vol. 43, No. 1", January 2008, pp. 150-161

DISCLOSURE OF THE INVENTION

Problems to be Solved by the Invention

Prior to the present invention, the inventor of the present invention studied a phase-change memory using memory cells each formed of a recording layer made of a chalcogenide material and a diode. As a result, it was found as a main problem that, when a current is supplied to a memory cell for access, an IR drop occurs in that current supply route, thereby possibly degrading reliability. It was also found as another main problem that further contrivance is required for speedup and increase in capacity.

For example, in the cross-point memory formed of a variable resistance element depicted in FIG. 7 of Patent Document 1, to reduce a leak current in an unselected cell on the selection data line, the data lines are hierarchically structured, and a predetermined data line voltage is supplied only to the data line disposed in an arbitrary bank. Also, to reduce the number of main data lines, in FIG. 1 of the same document, a main data line is provided to every plurality of data lines. When this structure is applied to a phase-change memory, a voltage drop occurring in a data-line selection transistor inserted between a data line and the main data line poses a problem. In the phase-change memory, since a rewrite operation is performed by using Joule heat as described above, it is required to apply a large current to a memory cell with high accuracy. To this end, it is required to apply a sufficient voltage to the memory cell. On the other hand, if a large current is caused to flow, a voltage drop (an IR drop) occurs in a wiring or the selection transistor included in a rewrite current route. This operating condition may inhibit micromachining of transistors and an improvement in reliability. Thus, a power feeding method without requiring a data line selection transistor is desired.

Furthermore, the mask ROM of a virtual-ground-type memory cell array structure depicted in FIG. 8 of Patent Document 1 is configured in a manner such that the word lines of each bank have corresponding word lines connected to each other and are driven by a common word-line driver. Here, since the mask ROM is a three-terminal element, bank selection is performed with bit lines and virtual ground lines. On the other hand, when this scheme is applied to two-terminal memory cell formed of a variable resistance element, the structure is required to be as depicted in FIG. 1 of Patent Document 1. That is, for achieving control such that a memory-cell read current is supplied from one side of the data lines or the bit lines and is let flow further through a memory cell to the other side of the data lines or the bit lines, it is required to provide a main data line for each of a plurality of data lines and provide a bank selection function to the data-line selection transistor inserted between the data line and the main data line. In this structure, the number of data line drivers 10 can be reduced, but a data line selection transistor is newly required between the data line and the main data line. Thus, in addition to the problem of an IR drop as described above, an effect of reducing an area of peripheral circuits may be decreased.

Furthermore, in the structure of FIG. 1 of Patent Document 1, as described above, by using the data-line selection transistor, any one of the plurality of banks on the same main data line is selected, and the data line in the bank is supplied with a predetermined data line voltage. Therefore, the number of cells for simultaneously performing a rewrite operation is restricted, thereby possibly making it impossible to increase a data transfer rate and making speedup difficult. Therefore, a memory cell array structure and its control scheme capable of increasing the number of cells simultaneously performing a rewrite operation are desired. Still further, in the structure of FIG. 1 of Patent Document 1, there is a problem also in view of reliability. That is, in a read operation, a plurality of unselected data lines or unselected bit lines not to be directly driven by a data line driver or a bit line driver may occur. To these unselected data lines and unselected bit lines, the read voltage (pre-charge voltage) is indirectly supplied via an unselected memory cell. However, with this feeding method, in an unselected memory cell where a current flows in, erroneous writing of stored information may occur. Thus, a control scheme or a memory cell structure preventing a current from flowing into an unselected memory cell is preferable.

On the other hand, for example, in the PRAM (phase-change random access memory) chip described in Non-Patent Document 1 and Non-Patent Document 2, while the area of the memory cells is reduced to 5.8 folds, which is the square of F, but the cell occupancy ratio is a little less than 30%. Here, F represents a minimum processing dimension. As described above, in the circuit block diagram of the read route depicted in FIG. 52, the section-word-line driving circuit SWD is disposed on the left and right of each input/output block. This distributed arrangement structure is to suppress voltage fluctuations of the word line to be set to a ground voltage. However, since a rewrite operation is performed using Joule heat is performed by letting a large current flow through the memory cell, there is a fundamental problem of increasing the area of the section-word-line driving circuit SWD.

That is, by designing a large section-word-line driving circuit SWD, for example, simultaneous current driving of a plurality of memory cells becomes possible with one section-word-line driving circuit SWD. However, this structure does not necessarily achieve a high area efficiency. For example, when a diode is applied to a selection element of a memory cell, an arrangement space between element circuits configuring the section-word-line driving circuit SWD is larger than an arrangement space between memory cells, which makes the area of the section-word-line driving circuit SWD relatively larger. Thus, a high degree of integration may not be achieved. Moreover, when a PRAM is applied to an SSD (solid-state drive), in order to increase a data transfer rate, many section-word-line driving circuits SWD have to be disposed to increase the number of cells simultaneously performing a rewrite operation. That is, in a PRAM for SSD, the number of section-word-line driving circuits SWD is simply increased. Therefore, some contrivance is thought to be required for a method of disposing the section-word-line driving circuits SWD.

The above and other preferred aims and novel characteristics of the present invention will be apparent from the description of the present specification and the accompanying drawings.

Means for Solving the Problems

The typical ones of the inventions disclosed in the present application will be briefly described as follows.

A semiconductor device according to an embodiment includes: first and second global word lines; a plurality of global bit lines including a first global bit lines; first and second memory tiles respectively provided at points of intersection of the first global bit lines and the first and second global word lines; and first and second word-line driving circuits. The first and second memory tiles each includes: a plurality of word lines including first and second word lines; a plurality of bit lines; a plurality of memory cells respectively disposed at points of intersection of these lines and including a diode for selection and a variable resistance element for storing information; and a bit-line selection circuit controlling connection between the plurality of bit lines and the first global bit line. Here, the first word-line driving circuit drives the first word lines included in the first and second memory tiles in accordance with the control of the first global word line, and the second word-line driving circuit drives the second word lines included in the first and second memory tiles in accordance with the control of the second global word line. Then, for example, when the first word-line driving circuit is activated in accordance with a rewrite operation, an output from the first word-line driving circuit is connected to only the first global bit line via only any one of the plurality of memory cells connected to the first word lines of the first and second memory tiles.

As such, with the structure in which one word-line driving circuit is shared among the word lines of the plurality of memory tiles and only one memory cell is driven in a rewrite operation or the like, high integration can be achieved. Also, an influence of an IR drop or the like in a rewrite operation or the like can be reduced.

Effects of the Invention

To describe the effects obtained by typical aspects of the present invention which will be briefly described below, in a phase-change memory using a chalcogenide material, an improvement in reliability and an increase in integration can be achieved.

BRIEF DESCRIPTIONS OF THE DRAWINGS

FIG. 8 is an operation truth table depicting an example of operation of FIG. 7;

FIG. 15 is a truth table depicting an example of operation of signals relating to a bit-line control circuit group in the memory cell array of the phase-change memory depicted in FIG. 13;

FIG. 16 is a truth table depicting an example of operation of signals relating to a global-word-line driving circuit in the memory cell array of the phase-change memory depicted in FIG. 13;

FIG. 17 is a truth table depicting an example of operation of signals relating to a read/write control circuit in the memory cell array of the phase-change memory depicted in FIG. 13;

FIG. 27 is a truth table depicting an example of operation of signals relating to a bit-line control circuit group in the memory cell array of the phase-change memory depicted in FIG. 25 (part 1);

FIG. 28 is a truth table depicting an example of operation of signals relating to the bit-line control circuit group in the memory cell array of the phase-change memory depicted in FIG. 25 (part 2);

BEST MODE FOR CARRYING OUT THE INVENTION

Figure 1:
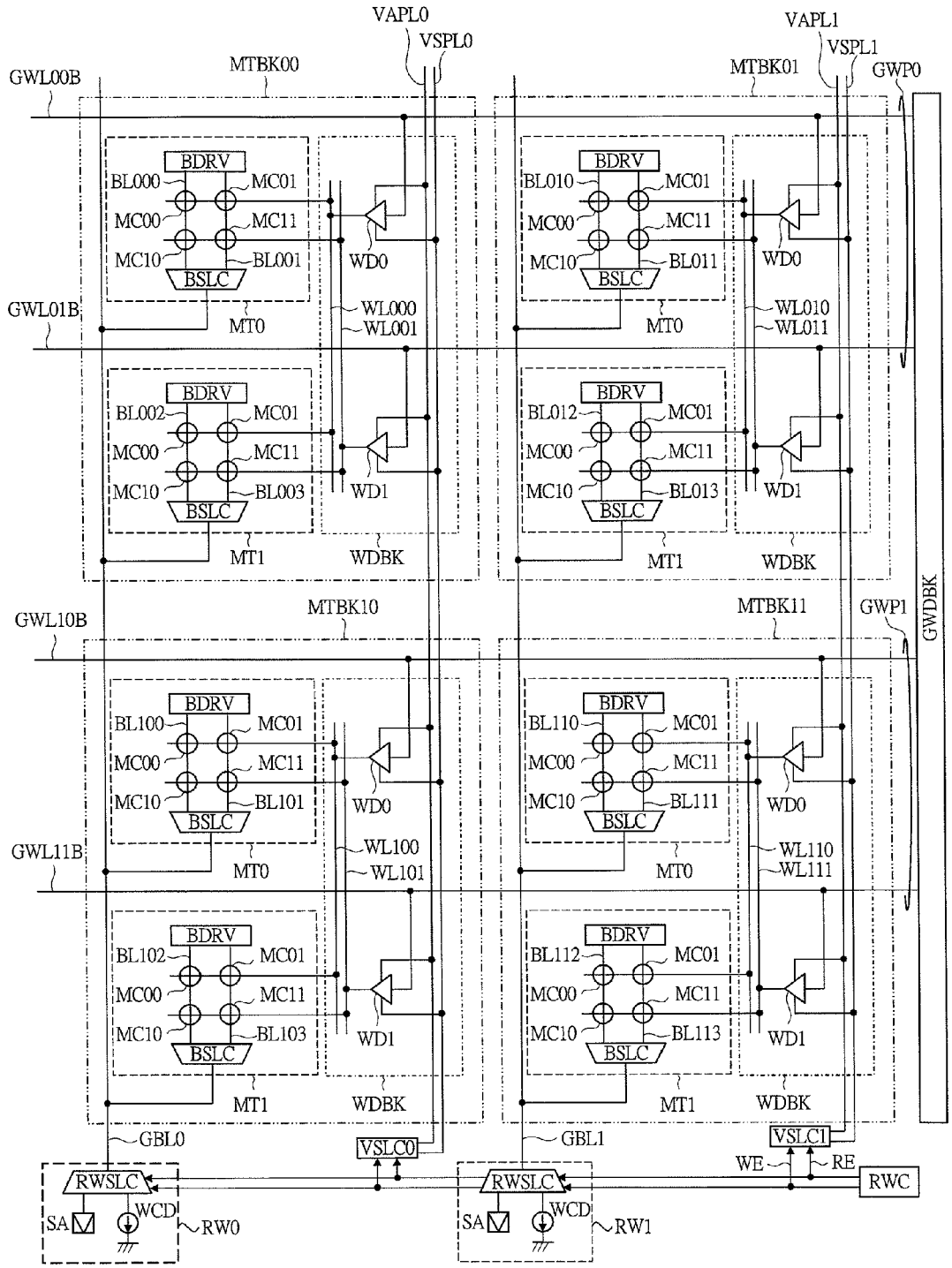
FIG. 1 is a schematic diagram depicting an example of structure of a memory cell array in a semiconductor device according to a first embodiment of the present invention.

Embodiments of the present invention are described in detail below based on the drawings. Note that in all of the drawings for describing the embodiments, in principle, the same member is provided with the same reference character and is not repeatedly described herein. Also, circuit devices configuring respective functional blocks of the embodiments are not particularly restrictive, but are formed on a semiconductor substrate, such as single-crystal silicon, by using an integrated circuit technology, such as a known CMOS (a complementary MOS transistor).

Note that a MOS (Metal Oxide Semiconductor) transistor is used in the embodiments as an example of a MISFET (Metal Insulator Semiconductor Field Effect Transistor). In the drawings, a P-channel-type MOS transistor (a PMOS transistor) has a gate provided with an arrow sign, thereby being distinguished from an N-channel-type MOS transistor (an NMOS transistor). In the drawings, although connections of substrate potentials of the MOS transistor are not particularly depicted, its connecting method is not particularly restrictive as long as the MOS transistor can normally operate.

First Embodiment

FIG. 1 is a schematic diagram depicting an example of structure of a memory cell array in a semiconductor device according to a first embodiment of the present invention. This memory cell array structure has four main features. A first feature is that, in each access cycle, the structure is such that one word-line driving circuit WD drives only one memory cell MC. A second feature is that the memory cell array is formed by arranging, in a matrix, memory tile groups MTBK each configured of two memory tiles MT and one word-line driving circuit group WDBK and one word-line driving circuit WD is shared by two memory tiles MT for use. In the following, a memory cell array sectioned with the word-line driving circuit WD and a bit-line selection circuit BSLC and a bit-line driving circuit BDRV, which will be described further below, is particularly referred to as a memory tile MT. A third feature is that each memory tile MT is configured of small-sized (here, two rows×two columns) memory cells MC. A fourth feature is that voltage feeder lines (VAPL, VSPL) to be connected to the word-line driving circuit group WDBK extend in parallel to a global bit line GBL. In the following, details of the semiconductor device of the first embodiment including these features are described.

(Structure of Memory Cell Array)

In FIG. 1, for simplification of description, four memory tile groups MTBK00 to MTBK11 are depicted. These four memory tile groups MTBK00 to MTBK11 are disposed so as to form a matrix of two rows×two columns, respectively at points of intersection of two global word line groups GWP0, GWP1 and two global bit lines GBL0, GBL1. Each of the two memory tile groups MTBK00 to MTBK11 is configured of two memory tiles MT0, MT1 and one word-line driving circuit group WDBK. Each of the memory tiles MT0, MT1 has memory cells MC00 to MC11 disposed in a matrix (here, two rows×two columns). For example, as typified by the memory tile group MTBK00, memory cells MC00 to MC11 in the memory tile MT0 are respectively disposed at points of intersection of two word lines WL000, WL001 and two bit lines BL000, BL001. Also, the memory cells MC00 to MC11 in the memory tile MT1 are respectively disposed at points of intersection of two word lines WL000, WL001 and two bit lines BL002, BL003.

Each of the memory tiles MT0, MT1 has a bit-line selection circuit BSLC and a bit-line driving circuit BDRV disposed at both ends of the memory cells MC00 to MC11. The bit-line selection circuit BSLC is a control circuit for connecting a selected bit line and its corresponding global bit line. The bit-line driving circuit BDRV is a control circuit for supplying a predetermined voltage to an unselected bit line.

A word-line driving circuit group WDBK is disposed adjacent to the memory tiles MT0 and MT1 so as to be able to be shared by the memory tiles MT0 and MT1. The word-line driving circuit group WDBK has two word-line driving circuits WD0, WD1. These word-line driving circuits WD0, WD1 drive word lines WL000, WL001, respectively, according to the voltage of the global word line group GWP0. Here, the global word line group GWP0 is configured of global word lines GWL00B, GWL01B, the word-line driving circuit WD0 drives the word line WL000 according to the voltage of GWL00B, and the word-line driving circuit WD1 drives the word line WL001 according to the voltage of GWL01B. Note that the global word line group GWP1 is similarly configured of global word lines GWL10B, GWL11B. These global word lines GWP0, GWP1 are controlled by a global-word-line driving circuit group GWDBK.

Each of the word lines WL000, WL001 extends in the regions of the memory tiles MT0 and MT1 so as to be parallel to the global word line group GWP0. Also, a wiring (word line) orthogonal to a word line passing through the regions of the memory tiles MT0 and MT1 is provided. With this wiring structure, the memory tiles MT0 and MT1 can share the same word-line driving circuit WD.

A voltage given to the word line WL is supplied by an array-voltage feeder lines VAPL0, VAPL1 and ground-voltage feeder lines VSPL0, VSPL1. These feeder lines are disposed in parallel to the global bit lines GBL0, GBL1. Among these, the array-voltage feeder line VAPL0 and the ground-voltage feeder line VSPL0 are connected to the word-line driving circuits WD0, WD1 in the word-line driving circuit group WDBK of the memory tile groups MTBK00, MTBK10, respectively. On the other hand, the array-voltage feeder line VAPL1 and the ground-voltage feeder line VSPL1 are connected to the word-line driving circuits WD0, WD1 in the word-line driving circuit group WDBK of the memory tile groups MTBK01, MTBK11, respectively.

Voltages of the array-voltage feeder lines VAPL0, VAPL1 are controlled by array-voltage selection circuits VSLC0, VSLC1, respectively. The array-voltage selection circuits VSLC0, VSLC1 supply either one of an array read voltage VRD and an array rewrite voltage VWT to the array-voltage feeder lines VAPL0, VAPL1, respectively, according to the voltage level of a read start signal RE and a rewrite start signal WE. Although details are described further below, in the memory cell array depicted in FIG. 1, either one of a set of the memory tile groups MTBK00 and MTBK01 and a set of memory tile groups MTBK10 and MTBK11 is selected according to the signal voltage of the global word line groups GWP0, GWP1, thereby performing a rewrite operation or a read operation. Thus, with the array-voltage feeder lines VAPL0, VAPL1 and the ground-voltage feeder lines VSPL0, VSPL1 disposed in a direction perpendicular to the global word line groups GWP0, GWP1, that is, a direction parallel to the global bit lines GBL0, GBL1, concentration of currents can be avoided. That is, by restricting the amount of current flowing through the array-voltage feeder lines VAPL0, VAPL1 to a value as much for driving one memory cell MC, a voltage drop (an IR drop) due to parasitic resistance in the array-voltage feeder lines VAPL0, VAPL1 can be suppressed.

The global bit lines GBL0, GBL1 are connected to read/write selection circuits RW0, RW1, respectively. A read/write selection circuit RWSLC in each of the read/write circuits RW0, RW1 is controlled by the read start signal RE and rewrite start signal WE described above. That is, according to the voltage level of the read start signal RE and the rewrite start signal WE, either one of a sense amplifier SA and a rewrite-current driving circuit WCD is connected to the global bit lines GBL0, GBL1.

(Specific Structure of Memory Tiles and Word-Line Driving Circuit)

Figure 2:
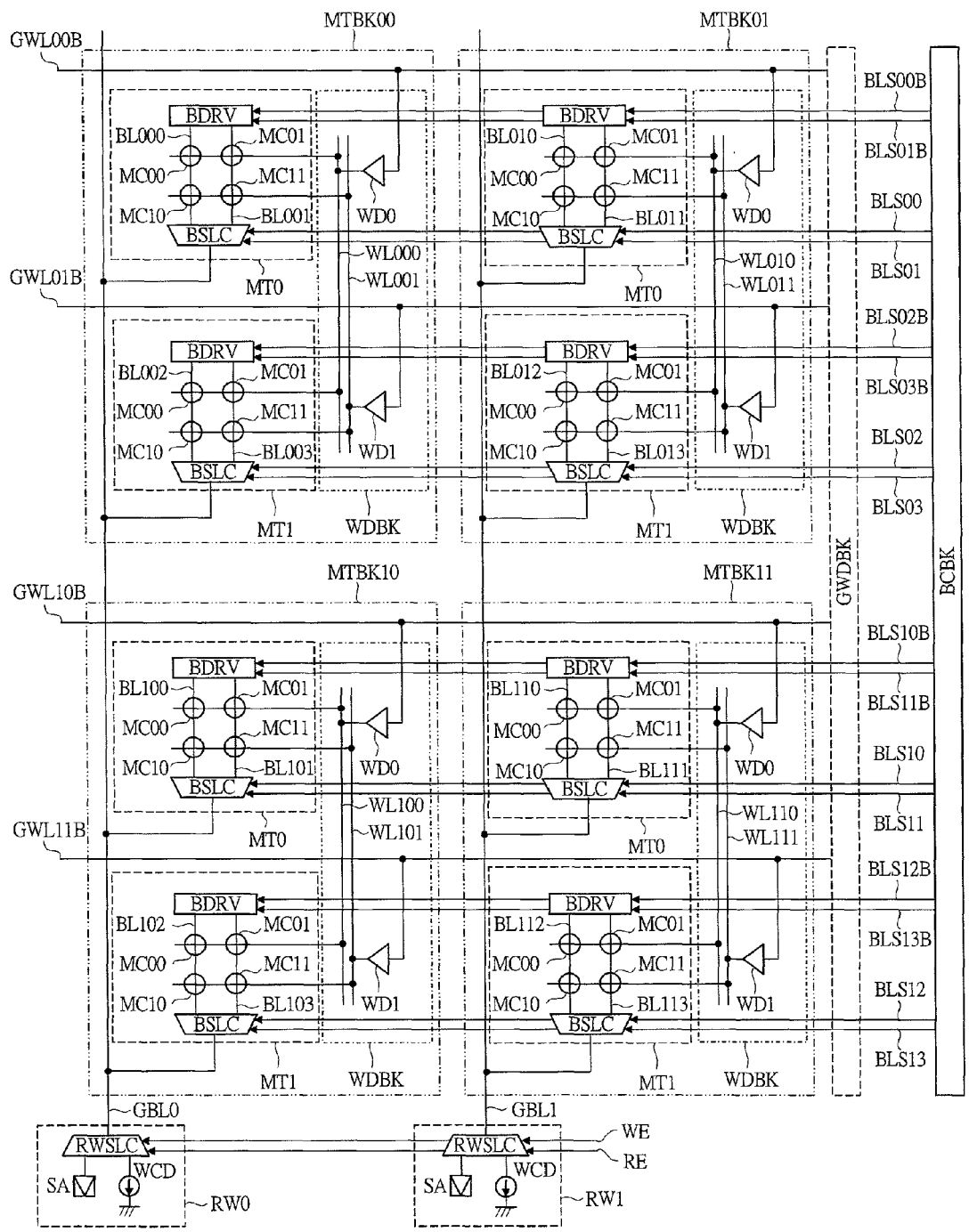
FIG. 2 is a diagram depicting an example of control signals in the memory cell array of the phase-change memory depicted in FIG. 1.

FIG. 2 depicts control signals of the bit-line selection circuit BSLC and the bit-line driving circuit BDRV in the memory cell array depicted in FIG. 1. The voltage of bit-line selection signal BLS00 to BLS13 controlling the bit-line selection circuit BSLC and the voltage of bit-line driving signal BLS00B to BLS13B controlling the bit-line driving circuit BDRV are controlled in a bit-line control circuit group BCBK. Note that, in the drawing, for the purpose of ease of viewing, the array-voltage feeder lines VAPL0, VAPL1, the ground-voltage feeder lines VSPL0, VSPL1, and the array-voltage selection circuits VSLC0, VSLC1 are omitted.

In the memory tile groups MTBK00, MTBK01, the bit-line selection circuit BSLC in the memory tile MT0 is controlled by the common bit-line selection signals BLS00, BLS01. Also, the bit-line driving circuit BDRV in this memory tile MT0 is controlled by the common bit-line driving signals BLS00B, BLS01B. A set of the bit-line selection signal BLS00 and the bit-line driving signal BLS00B and a set of the bit-line selection signal BLS01 and the bit-line driving signal BLS01B are complementary signals each other.

In the memory tile groups MTBK00, MTBK01, the bit-line selection circuit BSLC in the memory tile MT1 is controlled by the common bit-line selection signals BLS02, BLS03. Also, the bit-line driving circuit BDRV in this memory tile MT1 is controlled by the common bit-line driving signals BLS02B, BLS03B. A set of the bit-line selection signal BLS02 and the bit-line driving signal BLS02B and a set of the bit-line selection signal BLS03 and the bit-line driving signal BLS03B are complementary signals each other.

Similarly, in the memory tile groups MTBK10, MTBK11, the bit-line selection circuit BSLC in the memory tile MT0 is controlled by the common bit-line selection signals BLS10, BLS11. Also, the bit-line driving circuit BDRV in this memory tile MT0 is controlled by the common bit-line driving signals BLS10B, BLS11B. A set of the bit-line selection signal BLS10 and the bit-line driving signal BLS10B and a set of the bit-line selection signal BLS11 and the bit-line driving signal BLS11B are complementary signals each other.

Similarly, in the memory tile groups MTBK10, MTBK11, the bit-line selection circuit BSLC in the memory tile MT1 is controlled by the common bit-line selection signals BLS12, BLS13. Also, the bit-line driving circuit BDRV in this memory tile MT1 is controlled by the common bit-line driving signals BLS12B, BLS13B. A set of the bit-line selection signal BLS12 and the bit-line driving signal BLS12B and a set of the bit-line selection signal BLS13 and the bit-line driving signal BLS13B are complementary signals each other.

Figure 3:
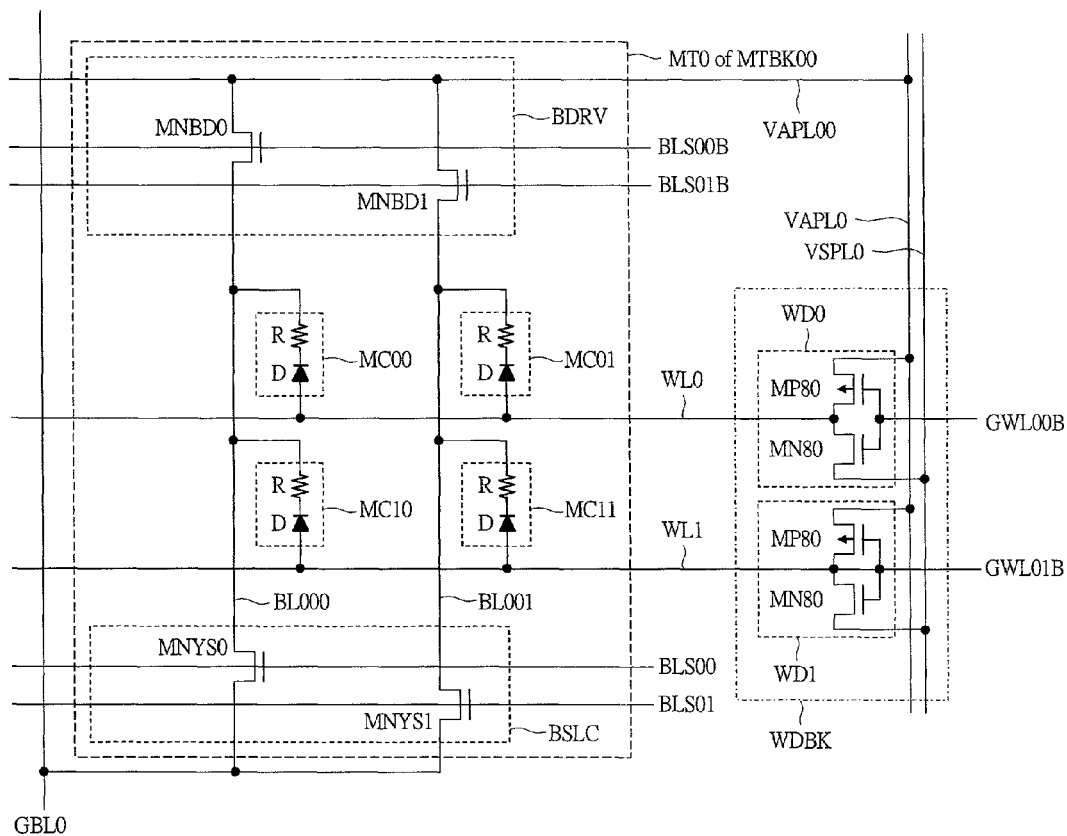
FIG. 3 is a circuit diagram depicting an example of detailed structure of memory tiles and a word-line driving circuit in the memory cell array of the phase-change memory depicted in FIG. 1.

FIG. 3 depicts an example of a specific structure of the memory tiles and the word-line driving circuit group in the memory cell array depicted in FIG. 1. In the drawing, as a typical example, the memory tile MT0 and the word-line driving circuit group WDBK in the memory tile group MTBK00 are depicted. Each of the memory cells MC00 to MC11 is configured of a diode D and a variable resistance R made of a chalcogenide material, and these are connected in the order of a word line-the diode D-the variable resistance R-a bit line. With this connection order, normally, these components are formed in the order of the diode D-the variable resistance R even at the time of manufacturing. Therefore, compared with the case in which this order is reversed, heat load applied to the variable resistance R at the time of manufacturing can be decreased.

The bit-line selection circuit BSLC is configured of NMOS transistors MNYS0 and MNYS1. Either one of the drain electrode and the source electrode of the transistor MNYS0 is connected to the bit line BL000, and the other is connected to the global bit line GBL0. Also, the bit-line selection signal BLS00 is connected to the gate electrode of the transistor MNYS0. Either one of the drain electrode and the source electrode of the transistor MNYS1 is connected to the bit line BL001, and the other is connected to the global bit line GBL0. Also, the bit-line selection signal BLS01 is connected to the gate electrode of the transistor MNYS1.

The bit-line driving circuit BDRV is configured of NMOS transistors MNBD0 and MNBD1. Either one of the drain electrode and the source electrode of the transistor MNBD0 is connected to the bit line BL000, and the other is connected to an array-voltage feeder line VAPL00 branched from the array-voltage feeder line VAPL0 described above. Also, the bit-line selection signal BLS00B is connected to the gate electrode of the transistor MNBD0. Either one of the drain electrode and the source electrode of the transistor MNDB1 is connected to the bit line BL001, and the other is connected to the array-voltage feeder line VAPL00. Also, the bit-line selection signal BLS01B is connected to the gate electrode of the transistor MNDB1. Here, the array-voltage feeder line VAPL00 is driven to the read voltage VRD in a read operation and to the rewrite voltage VWT in a rewrite operation. These operating voltages are the same as those of the feeder line (here, the array-voltage feeder line VAPL0) of the word-line driving circuit WD. Therefore, the array-voltage feeder line VAPL00 and the array-voltage feeder line VAPL0 may be connected together.

Figure 51:
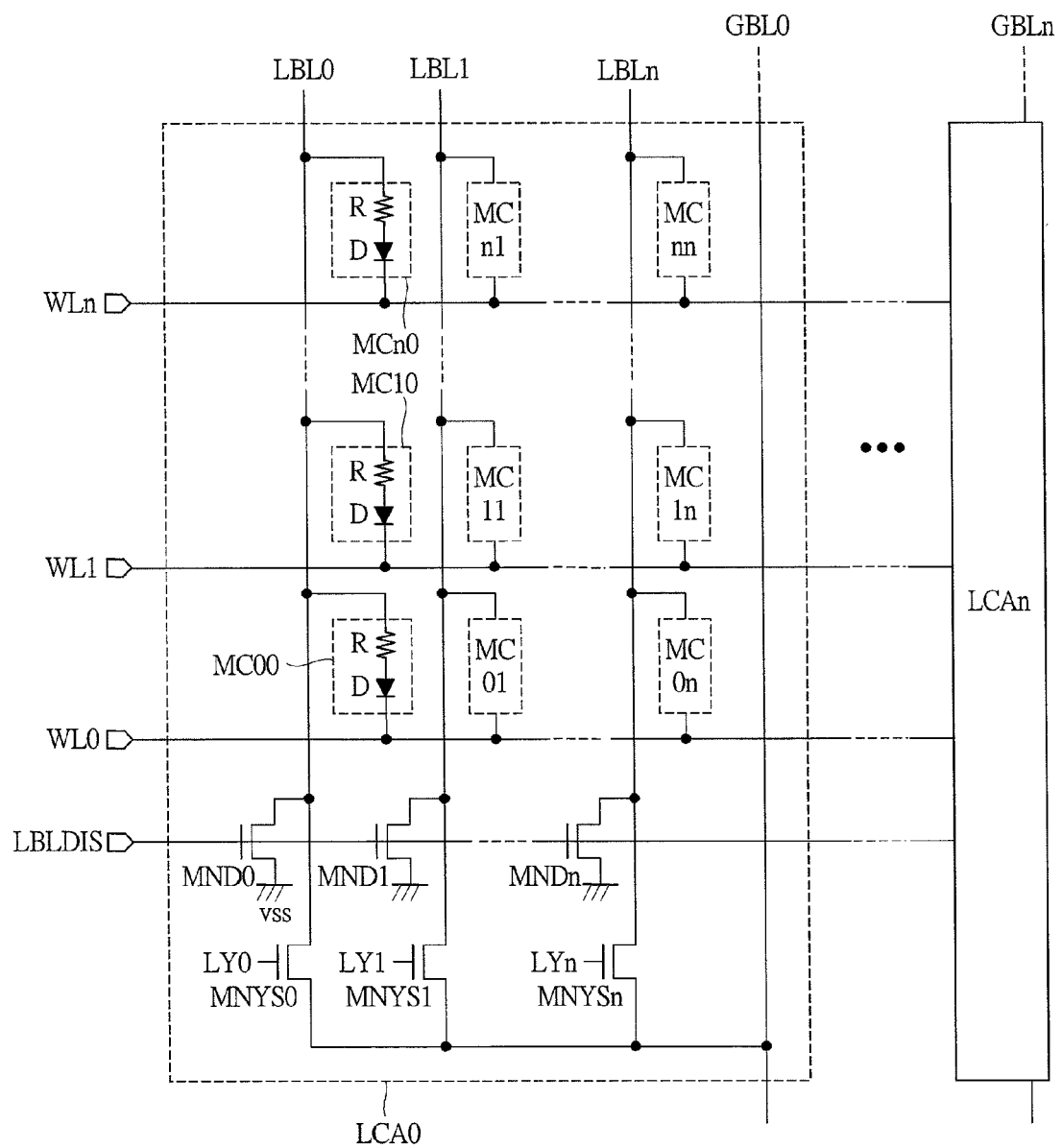
FIG. 51 is a diagram depicting the structure of a local cell array in a phase-change memory using a chalcogenide material and a diode described in Non-Patent Document 1.

Meanwhile, the structure of FIG. 3 is different from the structure of FIG. 51 described above in which the anode (P side) of the diode D is connected to the word line and the cathode (N side) is connected to the variable resistance R. To apply a sufficiently large current in a rewrite operation, it is required to apply an approximately 1 V to the variable resistance using a phase-change material and a voltage equal to or larger than a PN-junction voltage (equal to or larger than approximately 1 V) to the diode, and thus a voltage drop in the memory cell is expected to be approximately 2 V. Therefore, by inserting the diode so that a current flows in a direction from the word line to the bit line, it is possible to suppress a voltage to be applied to the drain and source of the NMOS transistors MNYS0, MNYS1 in the bit-line selection circuit BSLC. That is, it is possible to suppress a substrate bias effect in the NMOS transistors MNYS0 to MNYSn depicted in FIG. 51. Also, it is possible to suppress a loss of the voltage between the gate and source. Therefore, compared with the case of FIG. 51, conduction resistance of the NMOS transistors MNYS0, MNYS1 can be reduced, and an IR drop can be reduced. Furthermore, since the gate voltage can also be suppressed, no booster circuit is required depending on the electrical characteristics of the memory cell, thereby also reducing a chip area. Still further, in the case of a process structure, which will be described further below with FIG. 46 and FIG. 47, depositing a film of a P side on the word line also advantageously facilitates manufacturing.

(Structure of Word-Line Driving Circuit Group)

In FIG. 3, the word-line driving circuits WD0 and WD1 in the word-line driving circuit group WDBK each include a PMOS transistor MP80 and an NMOS transistor MN80. As typified by the word-line driving circuit WD0, either one of the drain electrode and the source electrode of the transistor MP80 is connected to an array-voltage feeder line (here, VAPL0), and the other is connected to a word line (here, WL000). Also, a global word line (here, GWL00B) is connected to the gate electrode of the transistor MP80. Furthermore, either one of the drain electrode and the source electrode of the transistor MN80 is connected to a ground-voltage feeder line (here, VSPL0), and the other is connected to a word line (here, WL000). Also, a global word line (here, GWL00B) is connected to the gate electrode of the transistor MN80.

Figures 4, 5:
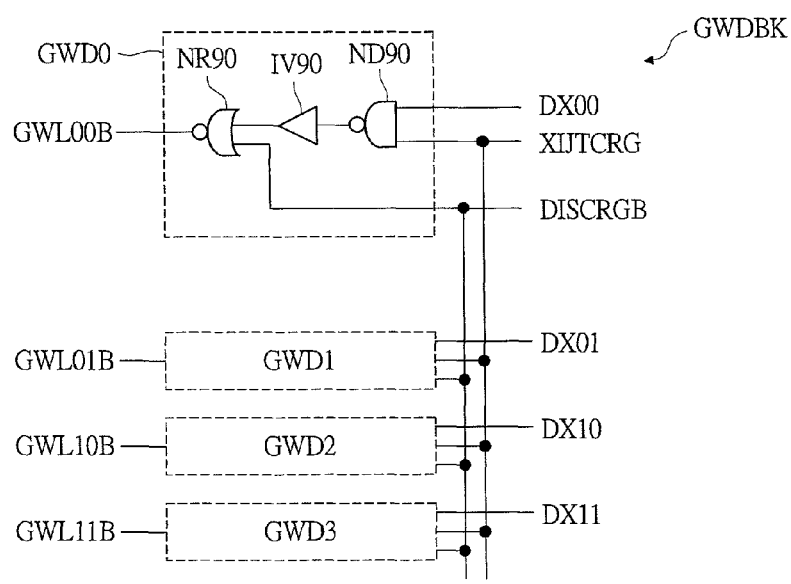
FIG. 4 is a circuit diagram depicting an example of structure of a global-word-line driving circuit group in the memory cell array of the phase-change memory depicted in FIG. 1.
FIG. 5 is an operation truth table depicting an example of operation of FIG. 4.

FIG. 4 depicts an example of structure of the global-word-line driving circuit group GWDBK depicted in FIG. 1. The global-word-line driving circuit group GWDBK is configured of four global-word-line driving circuits GWD0 to GWD3. The global-word-line driving circuits GWD0 to GWD3 drive the global word lines GWL00B to GWL11B, respectively, according to X decode address signals DX00 to 11, a current applying signal XIJTCRG, and a discharge signal DISCRGB. The global-word-line driving circuits GWD0 to GWD3 are each configured of, when the global-word-line driving circuit GWD0 is taken as a typical example, an NOR circuit NR90, an inverter circuit IV90, and an NAND circuit ND90. The X decode address signal DX00 is inputted to one input terminal of the NAND circuit ND90, and the current applying signal XIJTCRG is inputted to the other input terminal. A signal obtained by inverting an output signal from the NAND circuit ND90 described above with the inverter circuit IV90 is inputted to one input terminal of the NOR circuit NR90, and a discharge signal DISCRGB is inputted to the other input terminal. Similarly, the other global-word-line driving circuits GWD1 to GWD3 are controlled by the X decode address signals DX01 to 11, respectively, and the common current applying signal XIJTCRG and the discharge signal DISCRGB.

FIG. 5 depicts an operation truth table of the global-word-line driving circuit GWD0 among the global-word-line driving circuits GWD0 to GWD3 depicted in FIG. 4. In a standby state, the current applying signal XIJTCRG is driven to a ground voltage VSS and the discharge signal DISCRGB is driven to the rewrite voltage VWT, and therefore the global word line GWL00B is held at the ground voltage VSS. Therefore, with the PMOS transistor MP80 of the word-line driving circuit WD0 in the word-line driving circuit group WDBK in the memory tile group MTBK00 depicted in FIG. 3 becoming conducting, the same voltage VA as that of the array-voltage feeder line VAPL0 is supplied to the word line WL000. Here, VA is the rewrite voltage VWT or the read voltage VRD.

Next, when a read operation or a rewrite operation is started, with the current applying signal XIJTCRG being held at the ground voltage VSS, the discharge signal DISCRGB being at the rewrite voltage VWT is driven to the ground voltage VSS, the global word line GWL00B being at the ground voltage VSS is driven to the rewrite voltage VWT. Therefore, with the NMOS transistor MN80 of the word-line driving circuit WD0 in the word-line driving circuit group WDBK in the memory tile group MTBK00 depicted in FIG. 3 becoming conducting, the word line WL000 is discharged to the ground voltage VSS. Note that this discharging operation does not depend on the voltage of the X decode address signals DX00 to 11, and is forcefully performed in all word lines by the discharge signal DISCRGB to be commonly used for the global-word-line driving circuits GWD0 to GWD3. With this operation, all memory cells MC00 to MC11 in the memory tile once become in an unselected state.

Figures 6, 7:
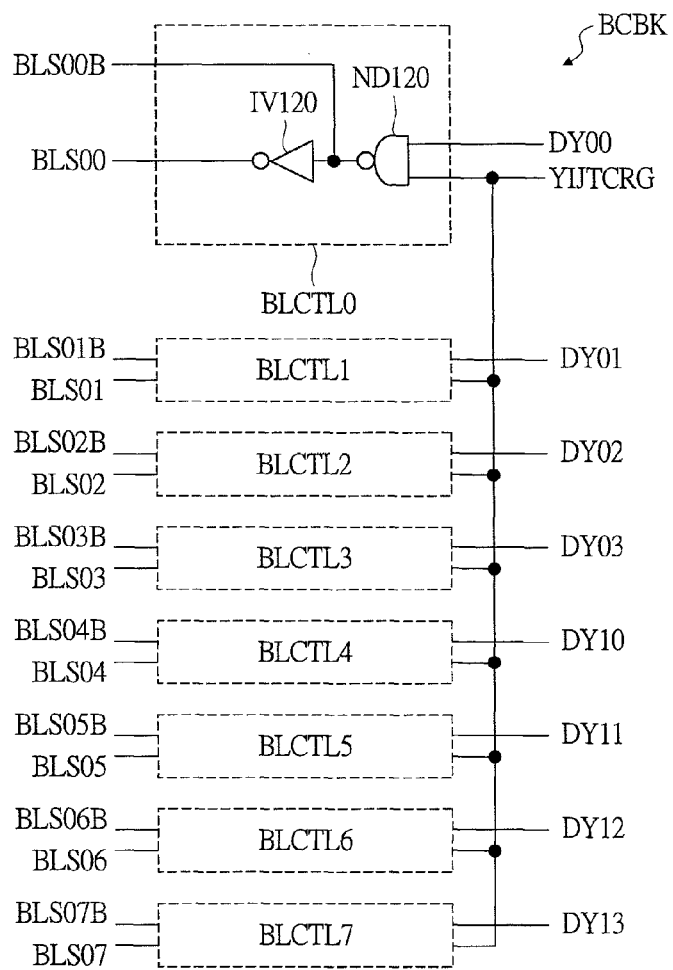
FIG. 6 is an operation truth table depicting an example of operation of signals controlled by X address signals in the memory cell array of the phase-change memory depicted in FIG. 1.
FIG. 7 is a circuit diagram depicting an example of detailed structure of a bit-line control circuit group in the memory cell array of the phase-change memory depicted in FIG. 2.

Furthermore, when an X-address decode operation is completed to cause the X decode address signal DX00 selected from the X decode address signals DX00 to 11 to be driven to the rewrite voltage VWT and cause the current applying signal XIJTCRG being at the ground voltage VSS to be driven to VWT, the global word line GWL00B being at the rewrite voltage is driven to the ground voltage VSS. Therefore, with the PMOS transistor MP80 of the word-line driving circuit WD0 in the word-line driving circuit group WDBK in the memory tile group MTBK00 depicted in FIG. 3 becoming conducting, the array voltage VA is supplied to the word line WL000. Note that global word lines corresponding to the X decode address signals DX00 to 11 held in an unselected state are continued to be in a discharge state. FIG. 6 summarizes a relation between X address signals X0, X1 and the X decode address signals DX00 to 11. In the drawing, for easy understanding, voltages of global bit lines GBL00 to GBL11 and the word lines WL000 to WL001 during a read operation or a rewrite operation are also shown.

(Structure of Bit-Line Control Circuit Group)

FIG. 7 depicts an example of structure of the bit-line control circuit group BCBK depicted in FIG. 2. The bit-line control circuit group BCBK is configured of eight bit-line control circuits BLCTL0 to BLCTL7, driving the bit-line selection signals BLS00 to BLS13 and the bit-line driving signals BLS00B to BLS13B according to Y decode address signals DY00 to 13 and a current applying signal YIJTCRG. The bit-line control circuits BLCTL0 to BLCTL7 are each configured of, when the bit-line control circuit BLCTL0 is taken as a typical example, a NAND circuit ND120 and an inverter circuit IV120. The Y decode address signal DY00 is inputted to one input terminal of the NAND circuit ND120, and the current applying signal YIJTCRG is inputted to the other input terminal. An output signal from the NAND circuit ND120 is taken as the bit-line driving signal BLS00B. Also, a signal obtained by inverting the output signal from the NAND circuit ND120 with the inverter circuit IV120 is taken as the bit-line selection signal BLS00. Similarly, the other bit-line selection signals BLS01 to BLS13 and bit-line driving signals BLS01B to BLS13B are controlled by the Y decode address signal DY01 to 13, respectively, and the common current applying signal YIJTCRG.

FIG. 8 summarizes a relation between X address signal X1, Y address signals Y0, Y1 and the Y decode address signals DY00 to 13. In the drawing, for easy understanding, voltages of the bit-line selection signals BLS00 to BLS13 during a selecting operation are also shown. Since one of eight bit-line selection signals BLS00 to BLS13 is activated, when either one of the set of the memory tile groups MTBK00, MTBK01 and the set of the memory tile groups MTBK10, MTBK11 is selected by the global word line group GWP0 and the global word line group GWP1, respectively, bit lines are selected one by one from a memory tile in the memory tile group, and each selected one is connected to a corresponding one of the global bit lines GBL0, GBL1.

(Operation of Memory Cell Array)

Figure 9:
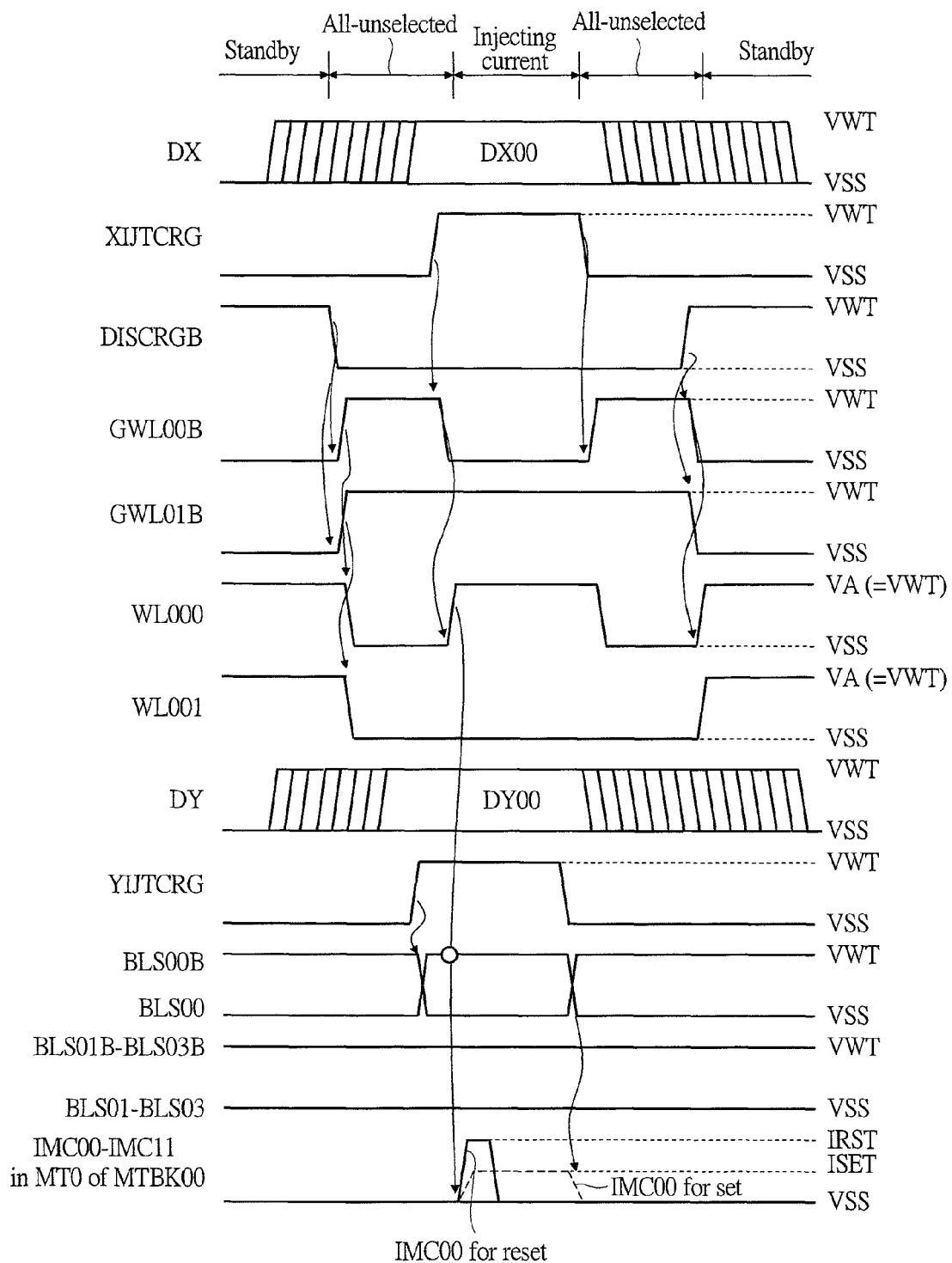
FIG. 9 is a timing chart depicting an example of operation of a rewrite operation in the memory cell array of the phase-change memory depicted in FIG. 1.

The operation of the above-structured memory cell array is described according to FIG. 9 to FIG. 12. FIG. 9 depicts control signals relating to the memory cell MC00, assuming the case of performing a rewrite operation in the memory cell MC00 in the memory the MT0 in the memory tile group MTBK00 depicted in FIG. 1. In the following, for simplification, attention is focused on the memory tile group MTBK00, and its operation is described.

First, in a standby state, since the discharge signal DISCRGB is held at the rewrite voltage VWT, the global word lines GWL00B, GWL01B are driven to the ground voltage VSS, and the word lines WL000, WL001 are driven to the rewrite voltage VWT. Also, with the bit-line selection signals BLS00 to BLS03 being driven to the ground voltage VSS and the bit-line driving signals BLS00B to BLS03B being driven to the rewrite voltage VWT, the bit lines BL000, BL001 are driven to a voltage near the rewrite voltage VWT.

Figure 10:
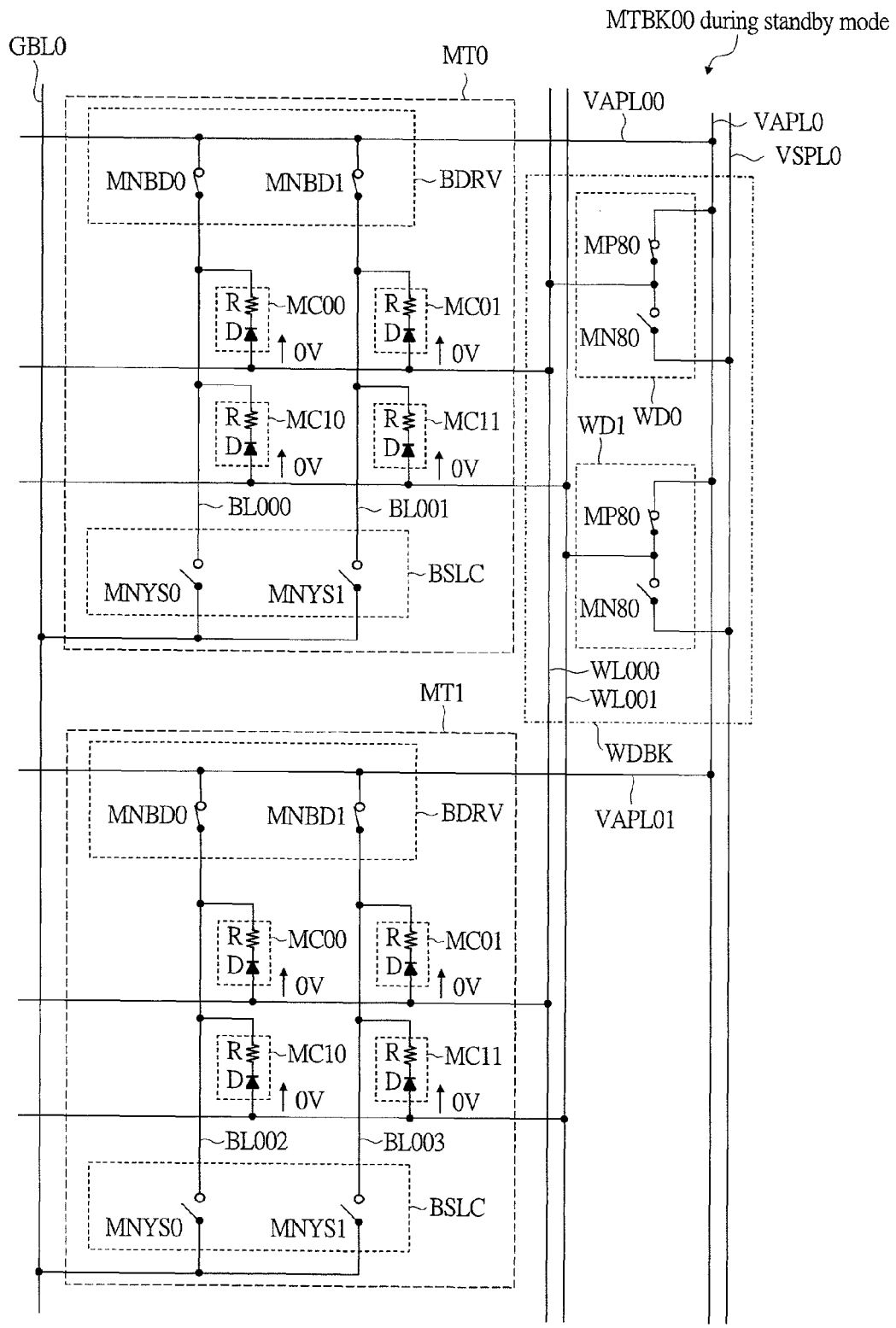
FIG. 10 is a diagram depicting an example of a conduction state in a standby state in the memory cell array of the phase-change memory depicted in FIG. 1.

FIG. 10 depicts a conduction state of the memory tile group MTBK00 in a standby state. In the drawing, for simplification, MOS transistors are each represented as a switch symbol. To the word lines WL000, WL001, the rewrite voltage VWT is supplied via the PMOS transistor MP80 in the word-line driving circuit WD0, WD1. Also, the bit lines BL000, BL001 are connected to the array-voltage feeder line VAPL00 via the NMOS transistors MNBD0, MNBD1 in the bit-line driving circuit BDRV. The array-voltage feeder line VAPL00 is connected to the array-voltage feeder line VAPL0, and the bit lines BL000 to BL003 are driven up to a voltage near the rewrite voltage VWT. Therefore, a voltage to be applied to the memory cells MC00 to MC11 in the memory tiles MT0, MT1 is approximately 0 V. Therefore, a current hardly flows through the memory cell at this time.

Referring back to FIG. 9, a rewrite operation is next started. At this time, the discharge signal DISCRGB being at the rewrite voltage VWT is driven to the ground voltage VSS, and the global word lines GWL00B, GWL01B being at the ground voltage VSS are driven to the rewrite voltage VWT. Therefore, the word lines WL000, WL001 being at the rewrite voltage VWT are driven to the ground voltage VSS.

Figure 11:
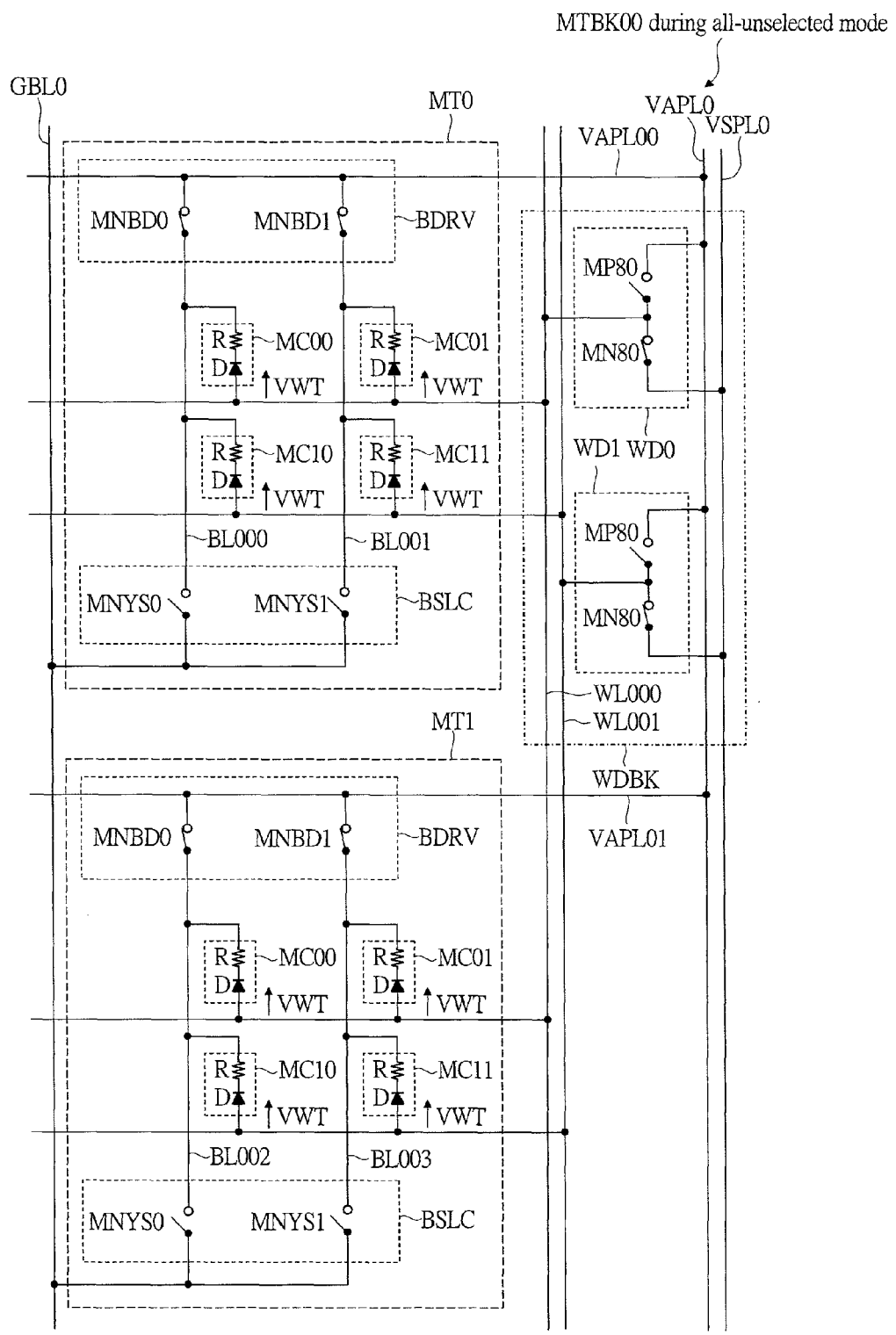
FIG. 11 is a diagram depicting an example of a conduction state in an all-bit unselected state in the memory cell array of the phase-change memory depicted in FIG. 1.

FIG. 11 depicts a conduction state of the memory tile group MTBK00 in this state. To the word lines WL000, WL001, the ground voltage VSS (here, 0 V) is supplied via the NMOS transistor MN80 in the word-line driving circuit WD0, WD1. On the other hand, the bit lines BL000 to BL003 are continuously driven up to a voltage near the rewrite voltage VWT. Therefore, a voltage to be applied to the memory cells MC00 to MC11 in the memory tiles MT0, MT1 is approximately −VWT. Since the diode D in the memory cell is in a reverse bias state, an extremely subtle current flows, but indicates an incommensurably small value compared with a current required for a rewrite operation, and therefore stored information is retained. As such, with all of the memory cells MC00 to MC11 being once made in an unselected state, erroneous writing due to an unexpected bias state in a selecting operation can be avoided. That is, for example, the diode D of the unselected memory cell is prevented from inadvertently becoming in a forward bias state due to potential fluctuations associated with a difference between near and far on a layout, noise, or the like.

Referring back to FIG. 9 again, the description of the operation continues. Upon completion of decoding the address signals, the X decode address signal DX00 is driven to the rewrite voltage VWT. Also, when the current applying signal XIJTCRG being at the ground voltage VSS is driven to the rewrite voltage VWT, the global word line GWL00B being at the rewrite voltage VWT is driven to the ground voltage VSS, thereby supplying the rewrite voltage VWT to the word line WL000 being at the ground voltage VSS. Similarly, after the Y decode address signal DY00 is driven to the rewrite voltage VWT, the current applying signal YIJTCRG being at the ground voltage VSS is driven to the rewrite voltage VWT. Then, the bit-line driving signal BLS00B being at the rewrite voltage VWT is driven to the ground voltage VSS, and the bit-line selection signal BLS00 being at the ground voltage VSS is driven to the rewrite voltage VWT.

Figure 12:
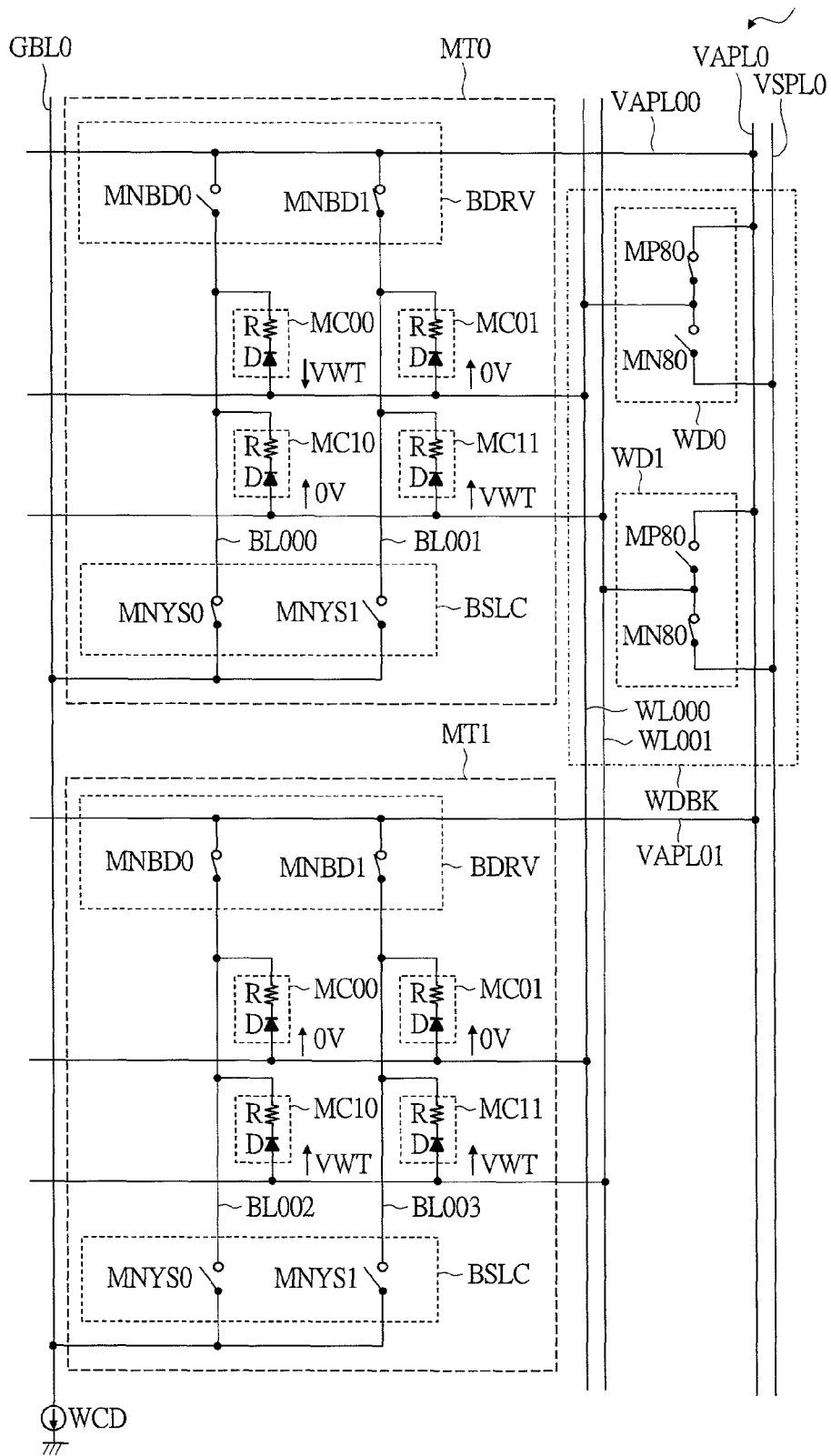
FIG. 12 is a diagram depicting an example of a conduction state in a rewrite state in the memory cell array of the phase-change memory depicted in FIG. 1.

FIG. 12 depicts a conduction state of the memory tile group MTBK00 in this state. To the word line WL000, the rewrite voltage VWT is supplied via the PMOS transistor MP80 in the word-line driving circuit WD0. Also, with the NMOS transistor MNBD0 in the bit-line driving circuit BDRV becoming in a cutoff state, a connection between the bit line BL000 and the array-voltage feeder line VAPL00 is cut off. On the other hand, with the NMOS transistor MNYS0 in the bit-line driving circuit BSLC becoming in a conduction state, the bit line BL000 is connected to the global bit line GBL0, and is driven to a voltage near the ground voltage VSS via the rewrite-current driving circuit WCD. Thus, a voltage approximately equal to the rewrite voltage VWT is applied to the memory cell MC00 in the memory tile MT0. At this time, a current IMC00 to be applied to the memory cell MC00 is controlled by the rewrite-current driving circuit WCD. That is, when the variable resistance R is rewritten to be in a high resistance state, as depicted in FIG. 9, a reset current IRST is applied for a short period of time. Conversely, when the variable resistance R is rewritten to be in a low resistance state, a set current ISET smaller than the reset current IRST is applied for a long period of time.

Note that since the bit line BL001 is supplied with the rewrite voltage VWT from the NMOS transistor MNBD1 in the bit-line driving circuit BDRV via the array-voltage feeder line VAPL00, a voltage to be applied to the memory cell MC01 on the selected word line WL000 is approximately equal to 0 V. Thus, since the current flowing through the memory cell MC01 has a negligible value, information stored in the memory cell MC01 is retained. Furthermore, since the word line WL001 is connected to the ground-voltage feeder line VSPL0 via the NMOS transistor MN80 in the word-line driving circuit WD1, a voltage to be applied to the memory cell MC10 on the selected bit line BL000 is approximately equal to 0 V. Thus, since the current flowing through the memory cell MC10 also has a negligible value, information stored in the memory cell MC10 is retained. Note that since the rewrite voltage VWT is supplied to the bit line BL002 and the bit line BL003 from the bit-line driving circuit BDRV via the array-voltage feeder lines VAPL01 and VAPL0, as with the memory cell MC01 in the memory tile MT0, a voltage to be applied to the memory cells MC00, MC01 in the memory tile MT1 is approximately equal to 0 V.

When application of the rewrite current ends, the current applying signal XIJTCRG being at the rewrite voltage VWT is driven to the ground voltage VSS. With this, the global word line GWL00B being at the ground voltage VSS is driven to the rewrite voltage VWT. Also, the current applying signal YIJTCRG being at the rewrite voltage VWT is driven to the ground voltage VSS. With this, the bit-line selection signal BLS00 being at the rewrite voltage VWT is driven to the ground voltage VSS, and the bit-line driving signal BLS00B being at the ground voltage VSS is driven to the rewrite voltage VWT. Thus, as depicted in FIG. 11, all memory cells become in an unselected state again.

Finally, the discharge signal DISCRGB being at the ground voltage VSS is driven to the rewrite voltage VWT. With this, the global word lines GWL00B, GWL01B being at the rewrite voltage VWT are driven to the ground voltage VSS. Thus, the word lines WL000, WL001 being at the ground voltage VSS are driven to the rewrite voltage VWT to be returned to a standby state depicted in FIG. 10.

In the foregoing, for simplification, attention has been focused on the memory tile group MTBK00, and its operation has been described. However, it can be easily understood that, by the global word lines GWL00B, GWL01B, the bit-line selection signals BLS00 to BLS03, and the bit-line driving signals BLS00B to BLS03B, even in the memory tile group MTBK01 that is controlled together with the memory tile group MTBK00 and can be simultaneously activated, a rewrite operation is performed simultaneously on the memory cell MC00 in the memory tile MT0.

Also, while a rewrite operation has been described so far, a selecting operation is performed also in a read operation with a similar procedure. In the case of a read operation, the voltages of the array-voltage feeder lines VAPL0, VAPL00, VAPL01 are switched to the read voltage VRD by using the array-voltage selection circuit VSLC0 depicted in FIG. 1, and a voltage to be supplied to the selected word line WL000 is taken as the read voltage VRD. Also in FIG. 12, in place of the rewrite-current driving circuit WCD, the sense amplifier SA depicted in FIG. 1 is connected to the global bit line GBL0. Furthermore, by appropriately adjusting the driving time of the control signals depicted in FIG. 9, a current detecting operation according to the stored information, that is, the value of the variable resistance R in the memory cell, can be performed.

Effects of Present Embodiment

Finally, five main effects that can be obtained from the structure and operation that have been described so far are summarized. As a first effect, the structure is such that, in each access cycle, one word-line driving circuit (for example, WD0 of FIG. 12) supplies a current only to one memory cell (for example, MC00 in MT0 of FIG. 12). Thus, for example, compared with a structure in which a current is supplied to a plurality of memory cells, a reduction of an IR drop can be achieved. With this, rewrite and read operations can be performed with high accuracy, and an improvement in reliability can be obtained.

As a second effect, since one word-line driving circuit (for example, WD0) is shared by two memory tiles (for example, MT0, MT1), an increase in integration (an increase in capacity) can be achieved. That is, if the structure is such that, as described in the first effect, the word-line driving circuits and the memory cells have a one-to-one correspondence, the number of word-line driving circuits is increased, thereby possibly increasing the area of the memory cell array. The area of the memory cell array is expected to relatively depend largely on the area of the word-line driving circuit group WDBK. Thus, with a shared structure, the area of the word-line driving circuit group WDBK can be reduced, thereby addressing an increase in capacity.

As a third effect, each memory tile MT is configured of small-sized memory cells MC and is connected to one corresponding global bit line GBL, and a plurality of such memory tiles MT are disposed in a direction in which the global word line GWL extends, thereby maintaining the number of memory cells to be activated simultaneously (the number of global bit lines GBL that can be accessed simultaneously). With this, speedups of the semiconductor device can be addressed. Note that, in relation to the second effect, there is an idea that not a word line side but a bit line side is shared for an increase in integration. In this case, however, the number of simultaneous accesses is decreased, and speedups may not be able to be made. Moreover, when each memory tile MT is configured of small-sized memory cells MC, together with speedups described above, a load of being connected to the word-line driving circuit can be reduced, and an improvement effect on an IR drop can also be obtained.

As a fourth effect, current concentration on the array-voltage feeder line VAPL can be avoided, and a voltage drop (an IR drop) in the wiring and electro-migration can be suppressed. This effect is achieved, with the array-voltage feeder line (for example, the array-voltage feeder line VAPL0) being routed in parallel to a global bit line and with power being fed to the word-line driving circuit groups WDBK in a plurality of memory tile groups (for example, MTBK00, MTBK10) disposed in a direction in which this global-bit line extends. With the memory-cell selecting operation in a one-to-one correspondence and this wiring system, the current flowing through the array-voltage feeder line can be suppressed to a rewrite current or a read current for one selected memory cell. As a fifth effect, as described above, by changing the direction of the diode D compared with the structure of FIG. 51, a reduction of an IR drop and others can be made.

Note that while the structure has been described so far in which two adjacent memory tiles in a direction in which a global bit line extends share one word-line driving circuit, how to share is not particularly restricted. For example, the word-line driving circuit can be shared by four memory tiles. In this case, the area of the word-line driving circuit as a whole chip can further be reduced to one quarter. Also in the present embodiment, the bit-line driving circuit BDRV is provided in each memory tile, thereby causing a reverse bias state of the D depicted in FIG. 11 and a 0 V state of the memory cell MC01 and others depicted in FIG. 12. In some cases, however, this bit-line driving circuit BDRV can be eliminated. In this case, since the bit line connected to an unselected memory cell becomes in a floating state, a current route from the word line to the global bit line is not formed and, ideally, the current hardly flows through the unselected memory cell. Also, the memory cell connected to the bit line that is connected to the selected memory cell (for example, MC10 of MT0 in FIG. 12) can be maintained in a 0 V state. In reality, however, if a floating state occurs frequently, concern about a reduction in reliability arises. To improve reliability, the bit-line driving circuit BDRV is preferably provided.

Second Embodiment

Figure 13:
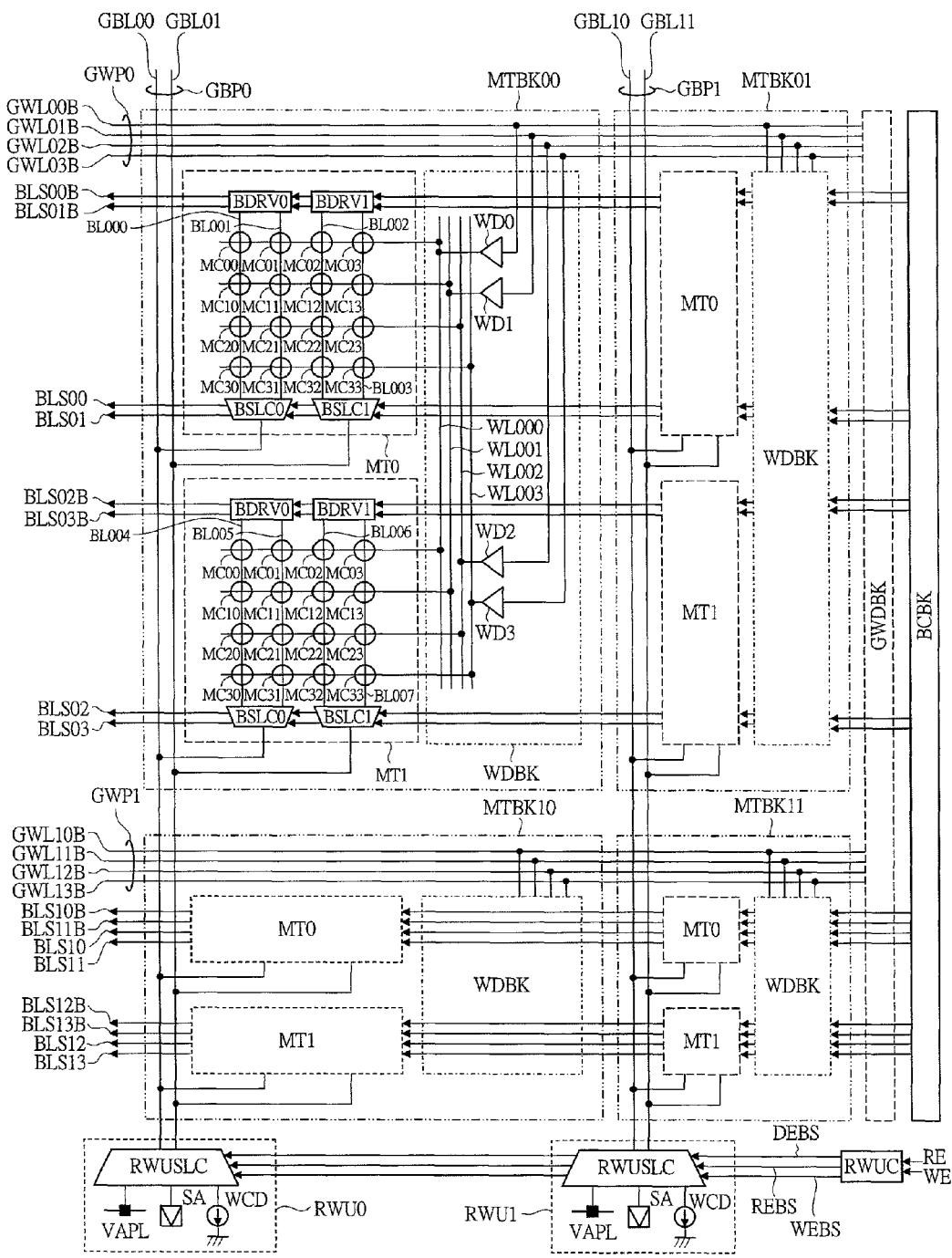
FIG. 13 is a schematic diagram depicting an example of structure of a memory cell array in a semiconductor device according to a second embodiment of the present invention.

In a second embodiment, another example of the memory cell array structure is described. FIG. 13 is a schematic diagram depicting an example of structure of a memory cell array in a semiconductor device according to the second embodiment of the present invention. A feature of this memory cell array structure is that the dimension of the memory tile MT is larger than that of the memory tile depicted in FIG. 2, having memory cells MC00 to MC33 of four rows×four columns. In accordance with this, the number of bit-line selection circuits BSLC and the number of bit-line driving circuits BDRV are each doubled. Also, the number of word-line driving circuits WD included in the word-line driving circuit group WDBK is doubled. By focusing attention on these differences, the present embodiment is described.

(Structure of Memory Cell Array)

In FIG. 13, for simplification of description, four memory tile groups MTBK00 to MTBK11 are depicted. These four memory tile groups MTBK00 to MTBK11 are disposed so as to form a matrix of two rows×two columns, respectively at points of intersection of two global word line groups GWP0, GWP1 and two global bit line groups GBP0, GBP1. Each of the memory tile groups MTBK00 to MTBK11 is configured of two memory tiles MT0, MT1 and one word-line driving circuit group WDBK. Each of the two memory tiles MT0, MT1 has sixteen memory cells MC00 to MC33 as described above. For example, as typified by the memory tile group MTBK00, memory cells MC00 to MC33 in the memory tile MT0 are respectively disposed at points of intersection of four word lines WL000 to WL003 and four bit lines BL000 to BL003. Also, the memory cells MC00 to MC33 in the memory tile MT1 are respectively disposed at points of intersection of four word lines WL000 to WL003 and four bit lines BL004 to BL007. As described with FIG. 3, the memory cells MC00 to MC33 are each connected in the order of a word line-a diode-a variable resistance-a bit line.

Each of the memory tiles MT0, MT1 has bit-line selection circuits BSLC0, BSLC1 and bit-line driving circuits BDRV0, BDRV1 disposed at both ends of the memory cells MC00 to MC33. For example, in the case of the memory tile MT0 in the memory tile group MTBK00, the bit-line selection circuit BSLC0 controls the bit lines BL000, BL001, and the bit-line selection circuit BLSC1 controls the bit lines BL002, BL003. These bit-line selection circuits BSLC0, BSLC1 are controlled by common bit-line selection signals BLS00, BLS01, respectively. Also, the bit-line driving circuit BDRV0 controls the bit lines BL000, BL001, and the bit-line driving circuit BDRV1 controls the bit lines BL002, BL003. These bit-line driving circuits BDRV0, BDRV1 are controlled by common bit-line driving signals BLS00B, BLS00B, respectively.

Similarly, in the memory tile MT1 in the memory tile group MTBK00, the bit-line selection circuit BSLC0 controls bit lines BL004, BL005, and the bit-line selection circuit BLSC1 controls bit lines BL006, BL007. These bit-line selection circuits BSLC0, BSLC1 are controlled by common bit-line selection signals BLS02, BLS03, respectively. Also, the bit-line driving circuit BDRV0 controls the bit lines BL004, BL005, and the bit-line driving circuit BDRV1 controls the bit lines BL006, BL007. These bit-line driving circuits BDRV0, BDRV1 are controlled by common bit-line driving signals BLS02B, BLS03B, respectively. Each of the voltages of the bit-line selection signals BLS00 to BLS03 and the bit-line driving signals BLS00B to BLS03B are each controlled by a bit-line control circuit group BCBK.

The word-line driving circuit group WDBK is disposed adjacent to the memory tiles MT0 and MT1 so as to be able to be shared by the memory tiles MT0 and MT1. The word-line driving circuit group WDBK has four word-line driving circuits WD0 to WD3. These word-line driving circuits WD0 to WD3 drive word lines WL000 to WL003, respectively, according to the voltage of the global word line group GWP0. Here, the global word line group GWP0 is configured of global word lines GWL00B to GWL03B, the word-line driving circuits WD0 to WD3 drive the word lines WL000 to WL003 according to the voltages of GWL00B to GWL03B, respectively. Similarly, the global word line group GWP1 is configured of global word lines GWL00B to GWL13B. These global word line groups GWP0, GWP1 are controlled by a global-word-line driving circuit group GWDBK.

Each of the word lines WL000 to WL003 extends in the regions of the memory tiles MT0 and MT1 so as to be parallel to the global word line group GWP0. Also, a wiring (word line) orthogonal to a word line passing through the regions of the memory tiles MT0 and MT1 is provided. With this wiring structure, the same voltage can be fed to both word lines of the memory tiles MT0 and MT1. Note that an array-voltage feeder line is omitted in the drawing for simplification, which is provided in parallel to global bit lines similarly to FIG. 1.

For the global bit line groups GBP0, GBP1, read/write circuits RWU0, RWU1 are disposed, respectively. A read/write selection circuit RWUSLC in each of the read/write circuits RWU0, RWU1 is controlled by a global-bit-line driving signal group DEBS, a read start signal group REBS, and a rewrite start signal group WEBS. These signal groups are generated by a read/write control circuit RWUC. According to the voltage levels of these signal groups, a sense amplifier SA, a rewrite-current driving circuit WCD, and an array voltage VA are connected to the global bit line groups GBP0, GBP1 as appropriate.

(Specific Structure of Memory Tile)

Figure 14:
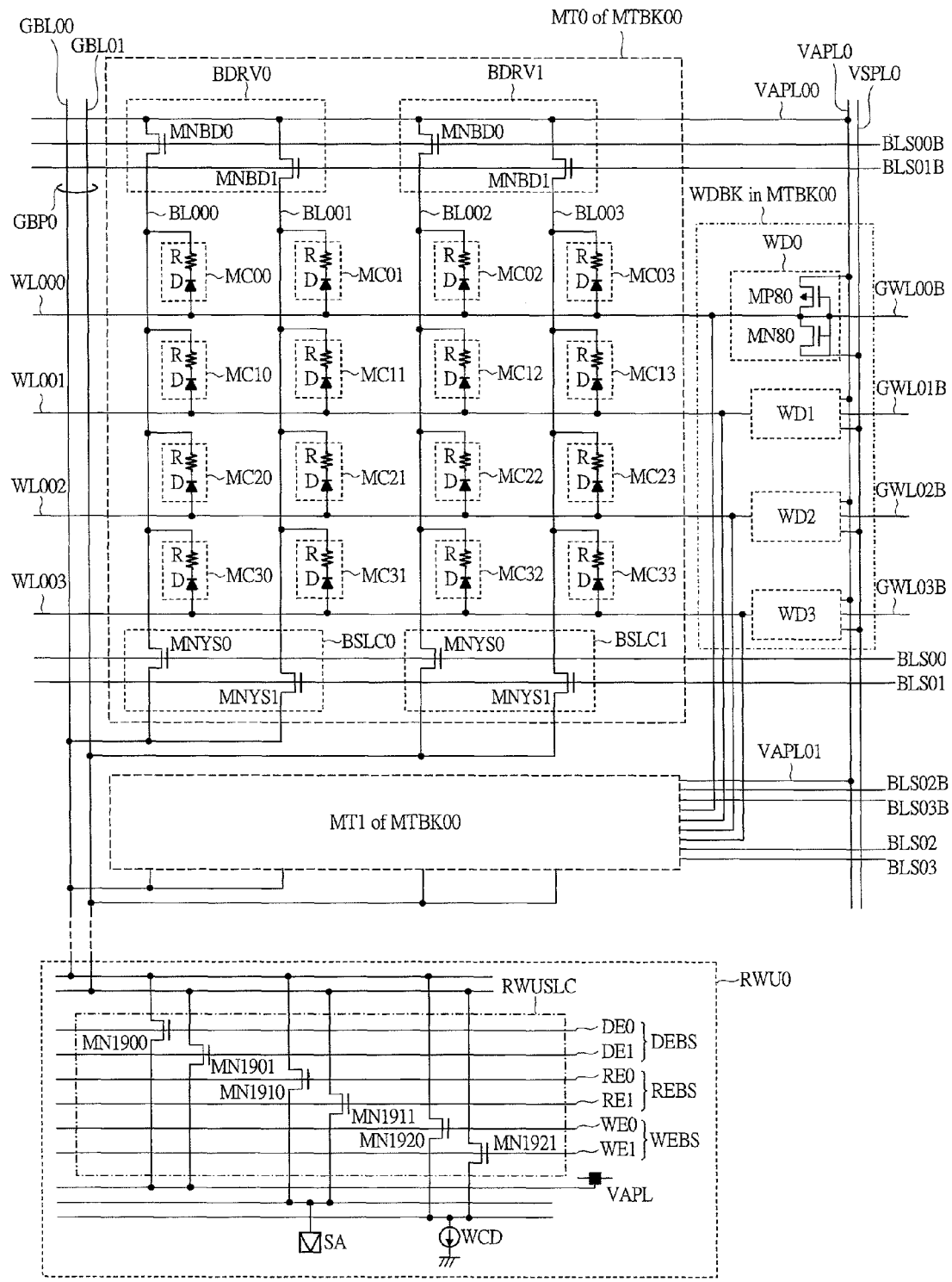
FIG. 14 is a circuit diagram depicting an example of detailed structure of memory tiles and a word-line driving circuit group in the memory cell array of the phase-change memory depicted in FIG. 13.

FIG. 14 depicts an example of a specific structure of the memory tiles and the word-line driving circuit group in the memory cell array depicted in FIG. 13. In the drawing, as a typical example, the memory tiles MT0, MT1 and the word-line driving circuit group WDBK in the memory tile group MTBK00 are depicted. Each of the memory cells MC00 to MC33 is configured to have, as with the case of FIG. 3, a diode D and a variable resistance R connected in the order of a word line-the diode D-the variable resistance R-a bit line.

The bit-line selection circuits BSLC0 and BSLC1 in the memory tile MT0 are configured of NMOS transistors MNYS0 and MNYS1, respectively, as with the bit-line selection circuit BSLC depicted in FIG. 3. To a gate electrode of the transistor MNYS0 in the bit-line selection circuits BSLC0 and BSLC1, a bit-line selection signal BLS00 is connected in common. To a gate electrode of the transistor MNYS1 in the bit-line selection circuits BSLC0 and BSLC1, a bit-line selection signal BLS01 is connected in common.

The bit-line driving circuits BDRV0 and BDRV1 in the memory tile MT0 are also configured of NMOS transistors MNBD0 and MNBD1, respectively, as with the bit-line driving circuit BDRV depicted in FIG. 3. To a gate electrode of the transistor MNBD0 in the bit-line driving circuits BDRV0 and BDRV1, a bit-line driving signal BLS00B is connected in common. To a gate electrode of the transistor MNBD1 in the bit-line driving circuits BDRV0 and BDRV1, a bit-line driving signal BLS01B is connected in common.

FIG. 15 is a truth table summarizing a relation between X address signal X2 and Y address signals Y0, Y1 inputted to the bit-line control circuit group BCBK and the bit-line selection signals BLS00 to BLS13. Since one is selectively activated from among eight bit-line selection signals BLS00 to BLS13, either one of a set of the memory tile groups MTBK00 and MTBK01 and a set of memory tile groups MTBK10 and MTBK11 is selected. Also, from each memory tile group, two bit lines are selected to be each connected to a corresponding global bit line group.

(Structure of Word-Line Driving Circuit Group)

Each of the word-line driving circuits WD0 to WD3 in the word-line driving circuit group WDBK is configured of, as depicted in FIG. 14, a PMOS transistor MP80 and an NMOS transistor MN80. The word-line driving circuits WD0 to WD3 drive the word lines WL000 to WL003 according to the voltage of global word lines GWL00B to GWL03B, which are components of the global word line group GWP0.

FIG. 16 is a truth table summarizing a relation between X address signals X0, X1, X2 inputted to the global-word-line driving circuit GWDBK and global word lines GWL00B to GWL03B, GWL10B to GWL13B and word lines WL000 to WL003, WL100 to WL103. Note that, although not shown, the word lines WL100 to WL103 are connected to the word-line driving circuit group WDBK in the memory tile group MTBK10. High-voltage values of the word lines WL000 to WL003, WL100 to WL103 are taken as a rewrite voltage VWT, assuming a selected state in a rewrite operation. In the memory cell array of FIG. 13, by using the X address signals X0, X1, X2, any one of the eight word lines WL000 to WL003, WL100 to WL103 is selectively activated.

(Structure of Read/Write Circuit)

A read/write circuit, in particular, the read/write selection circuit RWUSLC, is configured of, when the read/write circuit RWU0 is taken as a typical example, six NMOS transistors MN1900, MN1901, MN1910, MN1911, MN1920, MN1921, as depicted in FIG. 14. The transistors MN1900, MN1901 are transistors controlling a connection between the global bit line group GBP0 and an array-voltage feeder line VAPL. To the array-voltage feeder line VAPL, a read voltage VRD or the rewrite voltage VWT is supplied according to the operation. Either one of the drain electrode and the source electrode of the transistor MN1900 is connected to a global bit line GBL00, which is a component of the global bit line group GBP0, and the other is connected to the array-voltage feeder line VAPL. Also, to the gate electrode of the transistor MN1900, a global-bit-line driving signal DE0 is connected, which is a component of the global-bit-line driving signal group DEBS. Similarly, either one of the drain electrode and the source electrode of the transistor MN1901 is connected to a global bit line GBL01, which is a component of the global bit line group GBP0, and the other is connected to the array-voltage feeder line VAPL. Also, to the gate electrode of the transistor MN1901, a global-bit-line driving signal DE1 is connected, which is a component of the global-bit-line driving signal group DEBS.

The transistors MN1910, MN1911 are transistors controlling a connection between the global bit line group GBP0 and the sense amplifier SA. Either one of the drain electrode and the source electrode of the transistor MN1910 is connected to the global bit line GBL00, and the other is connected to the sense amplifier SA. Also, to the gate electrode of the transistor MN1910, a read start signal RE0 is connected, which is a component of the read signal group REBS. Similarly, either one of the drain electrode and the source electrode of the transistor MN1911 is connected to the global bit line GBL01, and the other is connected to the sense amplifier SA. Also, to the gate electrode of the transistor MN1911, a read start signal RE1 is connected, which is a component of the read state signal group REBS.

The transistors MN1920, MN1921 are transistors controlling a connection between the global bit line group GBP0 and the rewrite-current driving circuit WCD. Either one of the drain electrode and the source electrode of the transistor MN1920 is connected to the global bit line GBL00, and the other is connected to the rewrite-current driving circuit WCD. Also, to the gate electrode of the transistor MN1920, a rewrite start signal WE0 is connected, which is a component of the rewrite start signal group WEBS. Similarly, either one of the drain electrode and the source electrode of the transistor MN1921 is connected to the global bit line GBL01, and the other is connected to the rewrite-current driving circuit WCD. Also, to the gate electrode of the transistor MN1921, a rewrite start signal WE1 is connected, which is a component of the rewrite state signal group WEBS.

FIG. 17 is a truth table summarizing a relation between the read start signal RE, the rewrite start signal WE, and the Y address signal Y1, inputted to the read/write control circuit RWUC depicted in FIG. 13 and the global-bit-line driving signal group DEBS, the read start signal group REBS, and the rewrite start signal group WEBS. In a standby state, the global-bit-line driving signal group DEBS is held at the rewrite voltage VWT. Also, the read start signal group REBS and the rewrite start signal group WEBS are held at a ground voltage VSS. Thus, with only the transistors MN1900, MN1901 being brought into conduction, the global bit line groups GBP0, GBP1 are driven to an array voltage VA (the read voltage VRD or the rewrite voltage VWT).

In a rewrite operation, with the rewrite start signal WE indicating a logical value of "1", according to a Y address Y1, one of the global-bit-line driving signals DE0, DE1 is driven to the ground voltage VSS, and one of the rewrite start signals WE0, is driven to the rewrite voltage VWT. Thus, either one of the transistors MN1900, MN1901 becomes in a cutoff state, and either one of the transistors MN1910, MN1911 becomes in a conduction state. Thus, in each of the global bit line groups GBP0, GBP1, either one of the global bit lines is connected to the rewrite-current driving circuit WCD. With such control, as described in the description of FIG. 14 and FIG. 15, of any two bit lines selected from any memory tile group and connected to the global bit line group, one bit line can be supplied with the same array voltage VA (here, the rewrite voltage VWT) as that in a standby state, and the other bit line can be connected to the rewrite-current driving circuit WCD.

Similarly, in a read operation, with the read start signal RE indicating a logical value of "1", according to the Y address Y1, one of the global-bit-line driving signals becomes at the ground voltage VSS, and one of the read start signals becomes at the rewrite voltage VWT. Thus, either one of the transistors MN1900, MN1901 becomes in a cutoff state, and either one of the transistors MN1920, MN1921 becomes in a conduction state. Thus, in each of the global bit line groups GBP0, GBP1, either one of the global bit lines is connected to the sense amplifier SA. With such control, as described in the description of FIG. 14 and FIG. 15, of any two bit lines selected from any memory tile group and connected to the global bit line group, one bit line can be supplied with the same array voltage VA (here, the read voltage VRD) as that in a standby state, and the other bit line can be connected to the sense amplifier SA.

As described above, by distributing the selecting function of the bit lines into the bit-line selection circuit BSLC in the memory tile and the read/write selection circuit RWUSLC in the read/write circuit RWU, the number of signals (that is, bit-line selection signal and bit-line driving signal) for controlling the bit-line selection circuit BSLC (and the bit-line driving circuit BDRV) in the memory tile can be suppressed. With the number of wirings being suppressed, density of the disposed transistors is improved, and the area of the bit-line selection circuit BSLC (and the bit-line driving circuit BDRV) can be reduced.

More specifically, when one memory tile group MTBK in FIG. 13 is regarded as a memory cell array having a structure of four rows×eight columns, to select one from eight bit lines, eight selection signals are normally required in order to individually control eight transistors (here, a total of eight NMOS transistors included in the bit-line selection circuits BSLC0, BSLC1). Note herein that, for simplification of description, a signal for driving the bit-line driving circuit BDRV is not taken into consideration. However, in the example of structure of FIG. 13, for example, two transistors share a bit-line selection signal so that each transistor MNYS0 in the bit-line selection circuits BSLC0, BSLC1 shares the bit-line selection signal BLS00, and once select two bit lines (here, the bit lines BL000, BL002). Next, two global bit lines (here, the global bit lines GBL00, GBL01) corresponding to the two selected bit lines are selectively connected by the read/write selection circuit RWUSLC to the array-voltage feeder line, the sense amplifier, and the rewrite-current driving circuit.

With this control scheme, as depicted in FIG. 13, four selection signals (the bit-line selection signals BLS00 to BLS01) are enough to be provided in each memory tile group MTBK. When attention is focused on each memory tile MT, two selection signal wirings are enough to be provided. As such, with a reduction in the number of selection signal wirings for each memory tile MT, density of the disposed transistors is improved. Furthermore, by causing the read/write selection circuit RWUSLC to bear part of the selecting function, in addition to the reduction in the number of wirings described above, an increase in the number of transistors associated with bit-line selection is also suppressed, and therefore the area of the bit-line selection circuit BSLC (similarly, the bit-line driving circuit BDRV) can be reduced. With these, an increase in integration can be achieved.

(Operation of Memory Cell Array)

Figure 18:
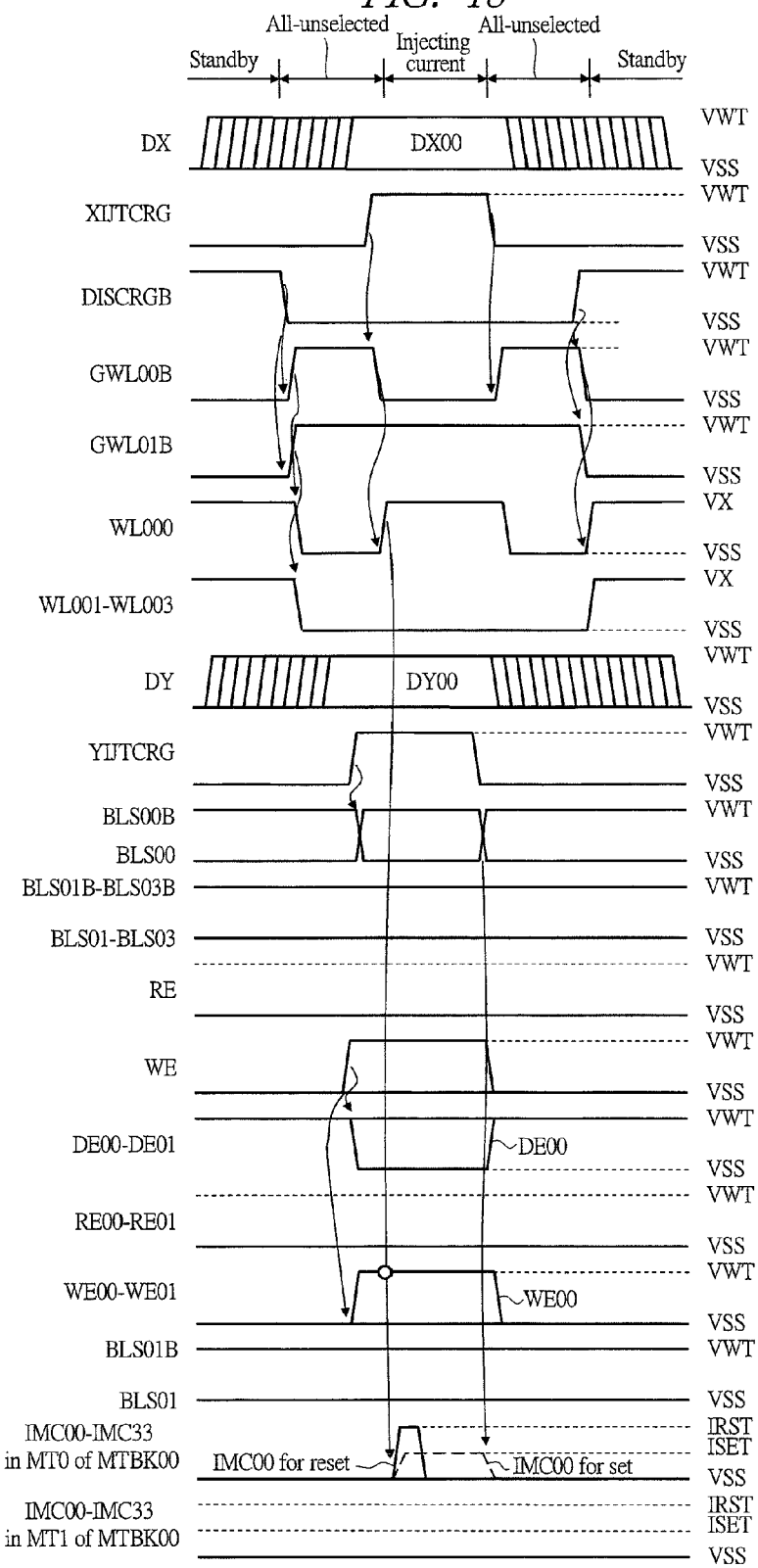
FIG. 18 is a timing chart depicting an example of operation of a rewrite operation in the memory cell array of the phase-change memory depicted in FIG. 13.

The operation of the above-structured memory cell array is described according to FIG. 18 to FIG. 24. FIG. 18 depicts control signals relating to the memory cell MC00, assuming the case of performing a rewrite operation in the memory cell MC00 in the memory tile MT0 in the memory tile group MTBK00 depicted in FIG. 13. In the following, for simplification, attention is focused on the memory tile group MTBK00, and the operation, mainly differences from FIG. 9, is described.

Figure 19:
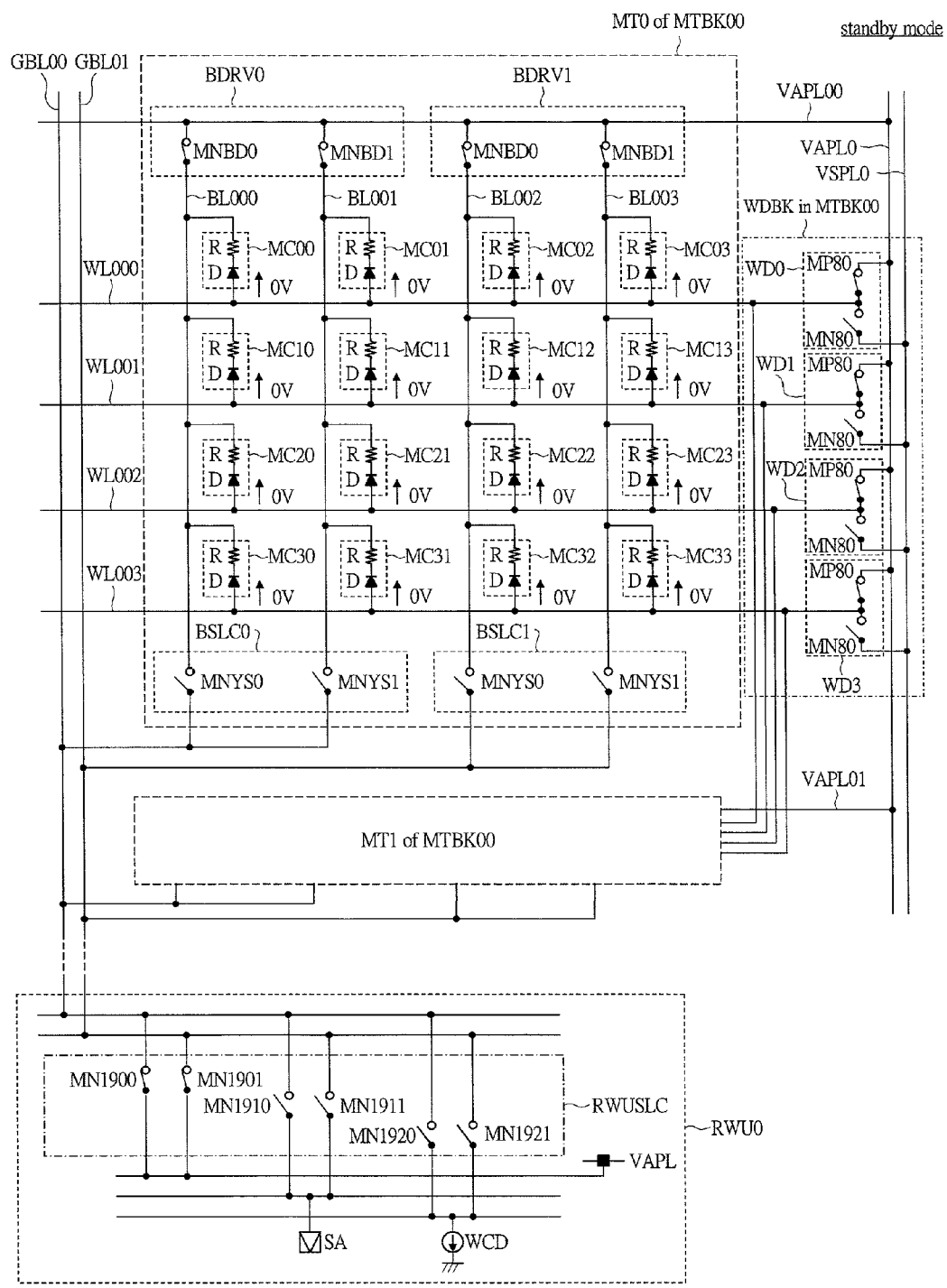
FIG. 19 is a diagram depicting an example of a conduction state in a standby state in the memory cell array of the phase-change memory depicted in FIG. 13 (part 1)
Figure 20:
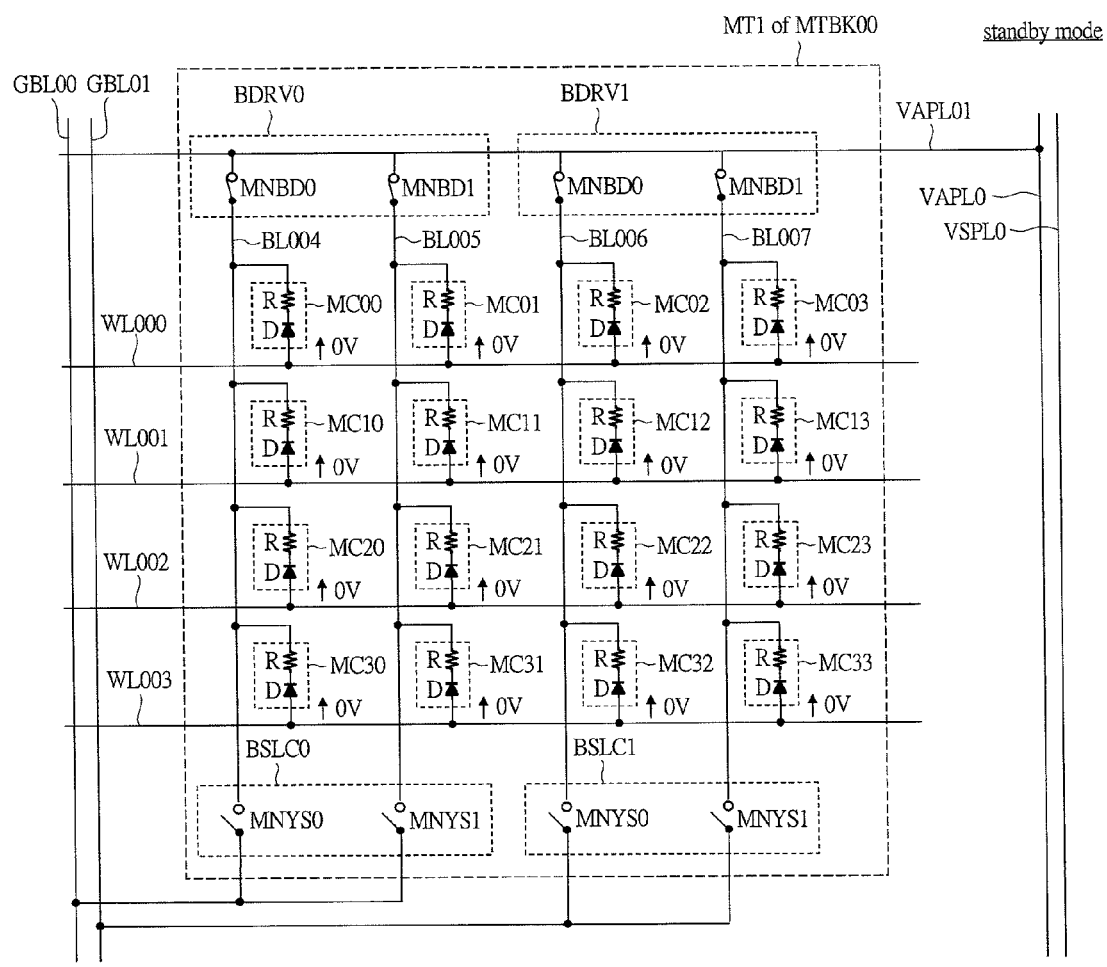
FIG. 20 is a diagram depicting an example of a conduction state in a standby state in the memory cell array of the phase-change memory depicted in FIG. 13 (part 2)

First, in a standby state, since a discharge signal DISCRGB is held at the rewrite voltage VWT, the global word lines GWL00B to GWL03B are driven to the ground voltage VSS, and the word lines WL000 to WL003 are driven to the rewrite voltage VWT. Also, with the bit-line selection signals BLS00 to BLS03 being driven to the ground voltage VSS and the bit-line driving signals BLS00B to BLS03B being driven to the rewrite voltage VWT, the bit lines BL000 to BL007 are driven to a voltage near the rewrite voltage VWT. Thus, as depicted in FIG. 19 and FIG. 20, a voltage to be applied to the memory cells MC00 to MC33 in the memory tiles MT0, MT1 in the memory tile group MTBK00 is approximately 0. At this time, the current hardly flows through the memory cells.

Figure 21:
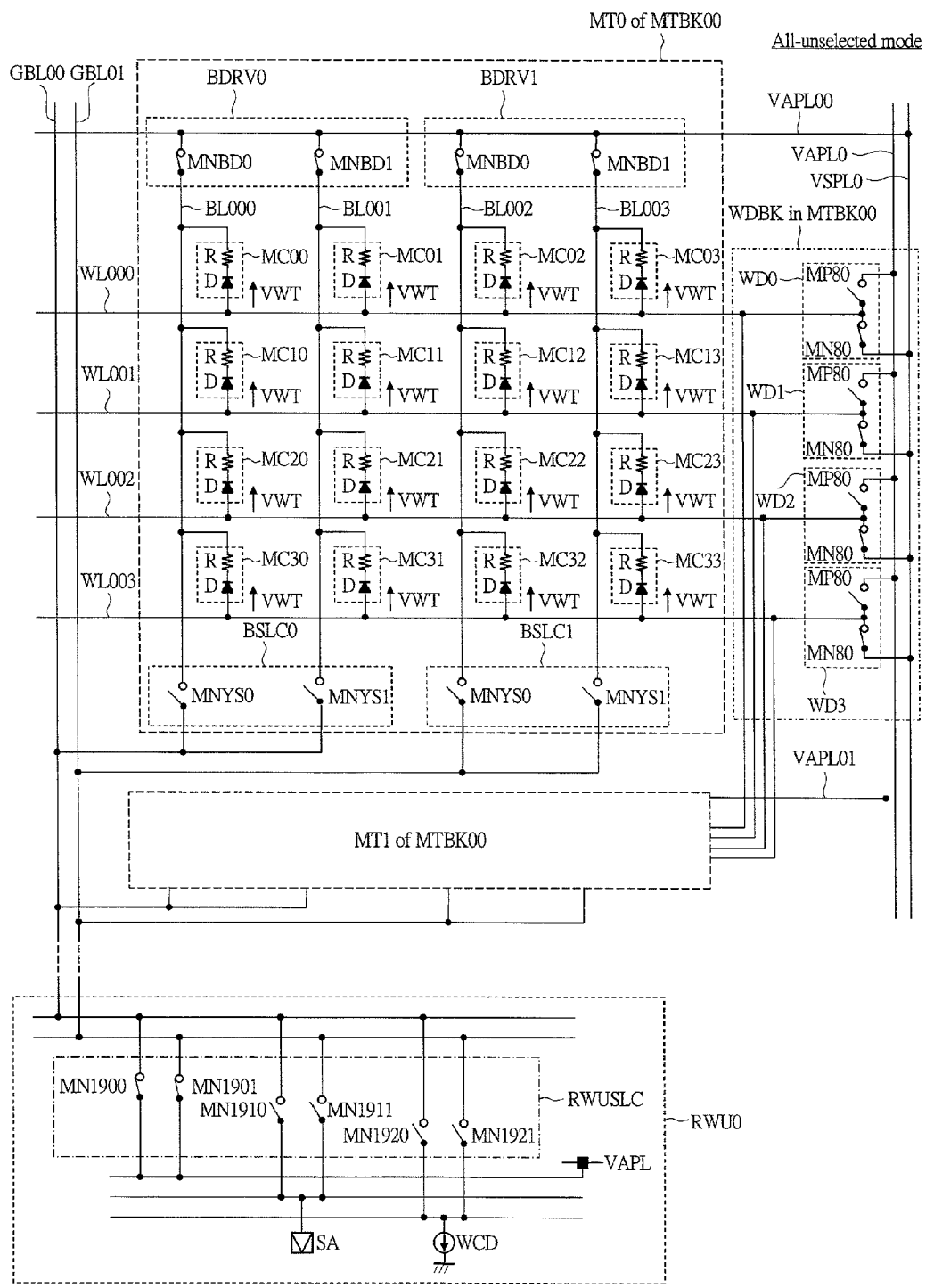
FIG. 21 is a diagram depicting an example of a conduction state in an all-bit unselected state in the memory cell array of the phase-change memory depicted in FIG. 13 (part 1)
Figure 22:
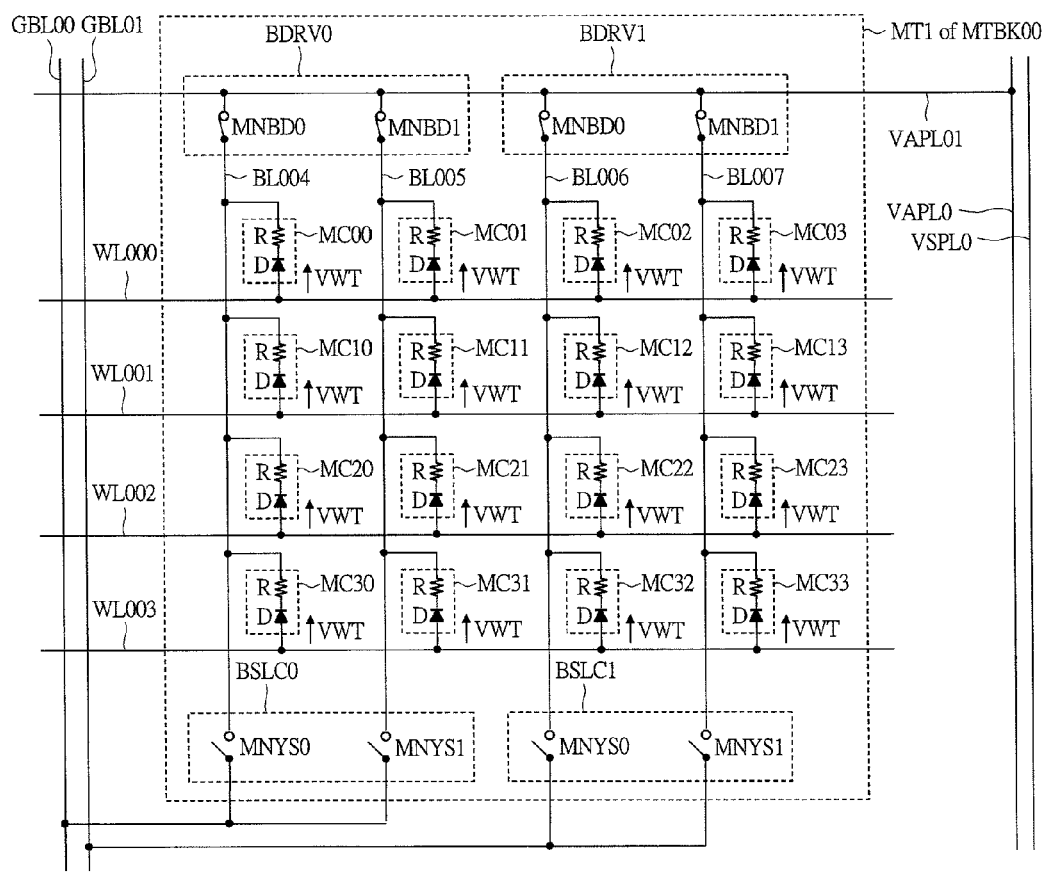
FIG. 22 is a diagram depicting an example of a conduction state in an all-bit unselected state in the memory cell array of the phase-change memory depicted in FIG. 13 (part 2)

Referring back to FIG. 18, next, a rewrite operation is started. First, as with FIG. 9, with the discharge signal DISCRGB at the rewrite voltage VWT being driven to the ground voltage VSS, the word lines WL000 to WL003 at the write voltage VWT are driven to the ground voltage VSS. Thus, as depicted in FIG. 21 and FIG. 22, all of the memory cells MC00 to MC33 in the memory tiles MT0, MT1 once become in an unselected state.

Referring back to FIG. 18 again, description of operation continues. When address signal decoding is completed, the rewrite voltage VWT is supplied to the word line WL000 being at the ground voltage VSS. Also, the bit-line selection signal BLS00 at the ground voltage VSS is driven to the rewrite voltage VWT. Furthermore, with the rewrite start signal WE at the ground voltage VSS (an input to the read/write control circuit RWUC) being driven to the rewrite voltage VWT, the global-bit-line driving signal DE0 at the rewrite voltage VWT is driven to the ground voltage VSS, and the rewrite start signal WE0 at the ground voltage VSS is driven to the rewrite voltage VWT.

Figure 23:
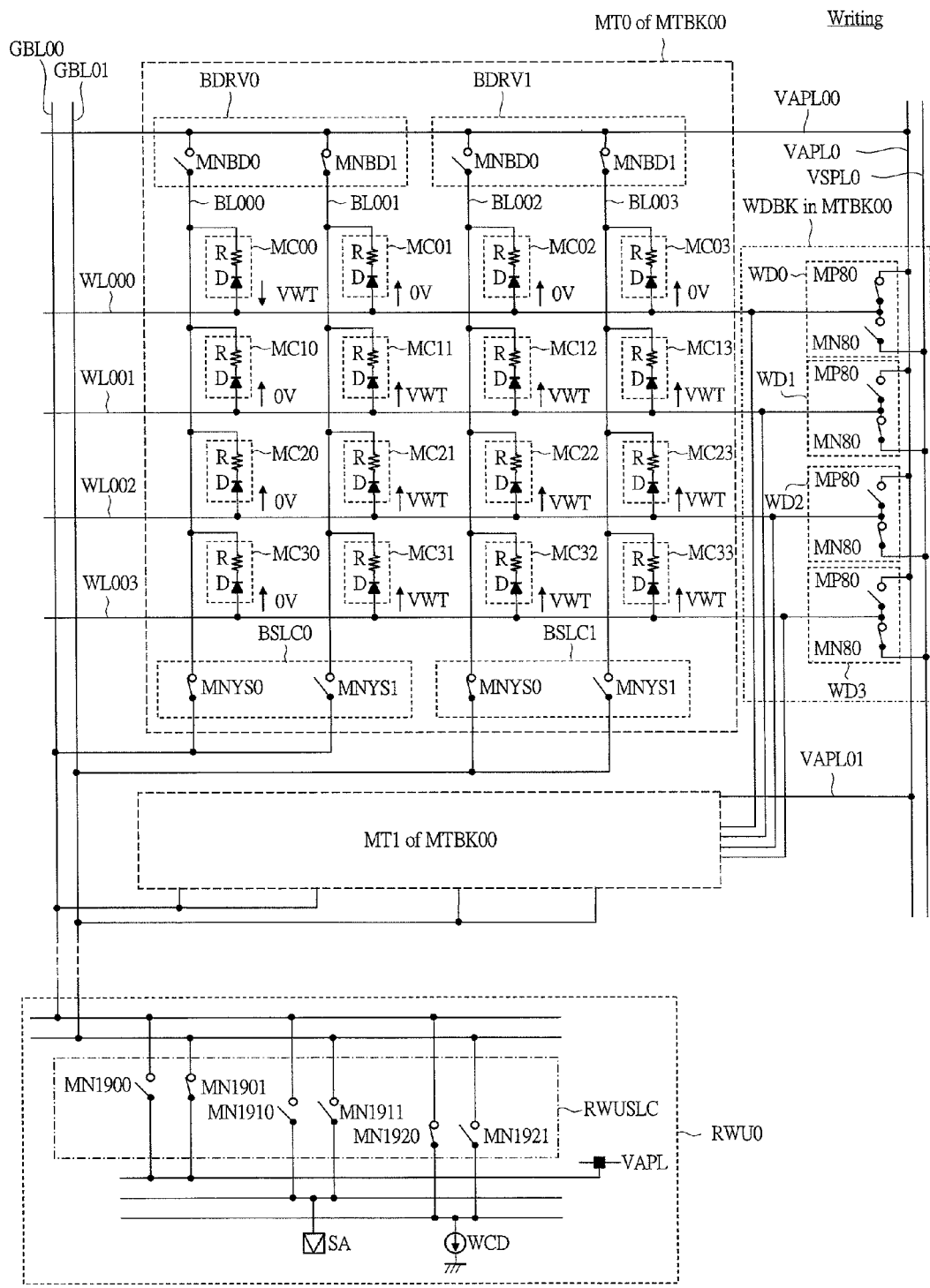
FIG. 23 is a diagram depicting an example of a conduction state in a rewrite state in the memory cell array of the phase-change memory depicted in FIG. 13 (part 1)
Figure 24:
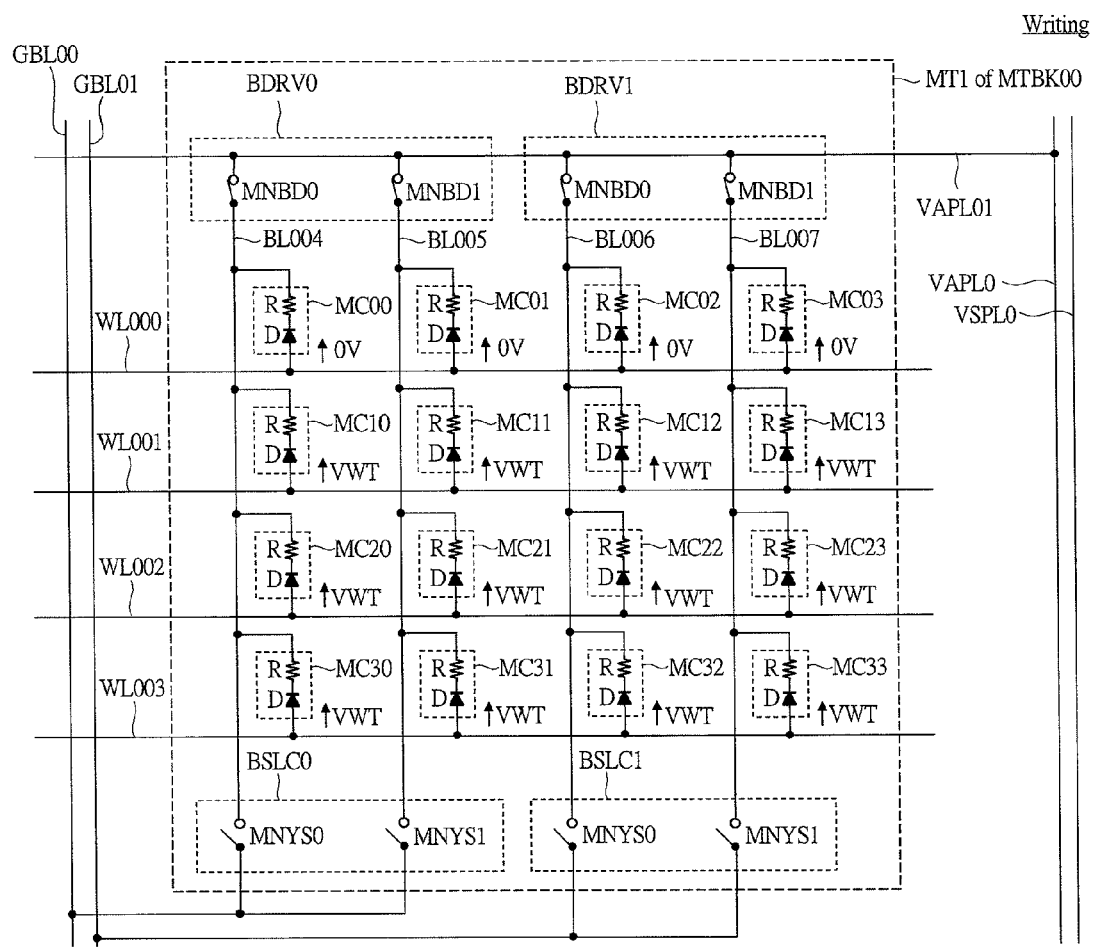
FIG. 24 is a diagram depicting an example of a conduction state in a rewrite state in the memory cell array of the phase-change memory depicted in FIG. 13 (part 2)

FIG. 23 and FIG. 24 depict a conduction state of the memory tiles MT0, MT1 in the memory tile group MTBK00 in this state. To the word line WL000, the rewrite voltage VWT is supplied via the PMOS transistor MP80 in the word-line driving circuit WD0. Also, with the NMOS transistor MNBD0 in the bit-line driving circuits BDRV0, BDRV1 in the memory tile MT0 being in a cutoff state, a connection between the bit lines BL000, BL002 and the array-voltage feeder line VAPL00 is cut off. On the other hand, with the NMOS transistor MNYS0 in the bit-line election circuits BSLC0, BSLC1 in the memory tile MT0 being in a conduction state, the bit lines BL000, BL002 are connected to the global bit lines GBL00, GBL01, respectively. Among these, the bit line BL000 is driven from the NMOS transistor MN1920 via the rewrite-current driving circuit WCD to a voltage near the ground voltage VSS. Thus, a voltage approximately equal to the rewrite voltage VWT is applied to the memory cell MC00 in the memory tile MT0. Also, the bit line BL002 is driven from the NMOS transistor MN1901 via the array-voltage feeder line VAPL to a voltage near rewrite voltage VWT. Thus, a voltage approximately equal to 0 V is applied to the memory cell MC02 in the memory tile MT0. That is, the memory cell MC02 becomes in an unselected state.

When application of the rewrite current ends, a current applying signal XIJTCRG at the rewrite voltage VWT is driven to the ground voltage VSS, a current applying signal YIJTCRG at the rewrite voltage VWT is driven to the ground voltage VSS, and the rewrite start signal WE at the rewrite voltage VWT is driven to the ground voltage VSS. Thus, as depicted in FIG. 21 and FIG. 22, all of the memory cells again become in an unselected state. Furthermore, with the discharge signal DISCRGB at the ground voltage VSS being driven to the rewrite voltage VWT, the state returns to be the standby state depicted in FIG. 19 and FIG. 20.

In the foregoing, for simplification, the operation has been described by focusing attention on the inside of the memory tile group MTBK00. It can be easily understood that, by the global word lines GWL00B to GWL03B, the bit-line selection signals BLS00 to BLS03, and the bit-line driving signals BLS00B to BLS03B, even in the memory tile group MTBK01 that is controlled together with the memory tile group MTBK00, a similar rewrite operation is performed on the memory cell MC00 in the memory tile MT0.

Also, while a rewrite operation has been described so far, a selecting operation is performed also in a read operation with a similar procedure. In the case of a read operation, the voltages of the array-voltage feeder lines VAPL0, VAPL00, VAPL01 depicted in FIG. 19 to FIG. 24 are switched to the read voltage VRD by using the array-voltage selection circuit VSLC0 similar to that depicted in FIG. 1, and a voltage to be supplied to the selected word line WL000 is taken as the read voltage VRD. Also in FIG. 23, in place of the rewrite-current driving circuit WCD, the sense amplifier SA is connected to the global bit line GBL00. Furthermore, by appropriately adjusting the driving time of the control signals depicted in FIG. 18, a current detecting operation according to the stored information, that is, the value of the variable resistance in the memory cell, can be performed.

Effects of Embodiment

Finally, effects that can be obtained from the structure and operation that have been described so far are summarized. With the use of the semiconductor device of the second embodiment, in addition to the various effects described in the first embodiment, the following effects can be obtained. That is, by distributing the selecting function of the bit lines into the bit-line selection circuit BSLC in the memory tile and the read/write selection circuit RWUSLC in the read/write circuit, the number of various control signals for selecting a bit line in the memory tile (here, the bit-line selection signals and the bit-line driving signals) can be suppressed. With the number of wirings being reduced, density of the disposed transistors is improved, and the area of the bit-line selection circuit BSLC (the bit-line driving circuit BDRV) can be reduced. Thus, an increased-integration memory cell array can be achieved.

Note that while the structure has been described so far in which two adjacent memory tiles in a global-bit-line direction share one word-line driving circuit, how to share is not particularly restricted. For example, the word-line driving circuit can be shared by four memory tiles. In this case, the area of the word-line driving circuit as a whole chip can further be reduced to one quarter. Also, for simplification of description, while the memory tile structure having memory cells of four rows×eight columns has been described, the number of memory cells is not particularly restrictive. For example, even when the memory tile structure is doubled to four rows× sixteen columns, a similar selecting operation can be performed by doubling the number of bit-line selection circuits and others.

Third Embodiment

Figure 25:
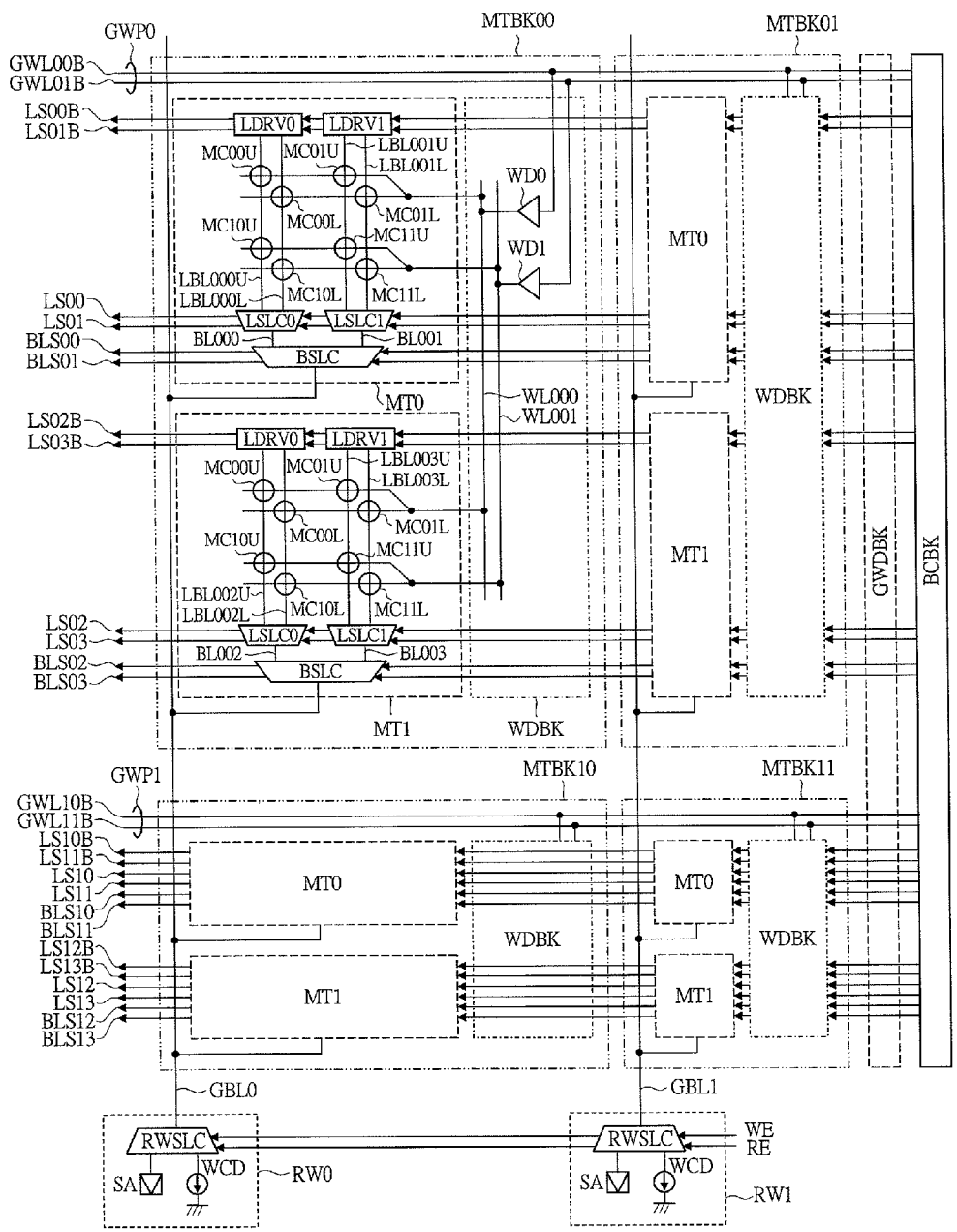
FIG. 25 is a schematic diagram depicting an example of structure of a memory cell array in a semiconductor device according to a third embodiment of the present invention.

In a third embodiment, still another example of the memory cell array structure is described. FIG. 25 is a schematic diagram depicting an example of structure of the memory cell array in a semiconductor device according to the third embodiment of the present invention. A feature of this memory cell array structure is such that a memory cell array structure of a so-called laminated type in which two memory cells are stacked on the same axis is used. For example, in a memory tile MT0 in a memory tile group MTBK00, memory cells MC00U and MC00L are paired memory cells stacked on the same axis. Here, the memory cell MC00U is formed on an upper layer, and the memory cell MC00L is formed on a lower layer. A suffix "U" is a symbol indicating an upper layer, and a suffix "L" is a symbol indicating a lower layer. Similarly, memory cells MC01U and MC01L form paired memory cells. Memory cells MC10U and MC10L form paired memory cells. Furthermore, memory cells MC11U and MC11L form paired memory cells. Therefore, this memory tile has a structure in which two sets of memory cells of two rows×two columns per layer are stacked. Correspondingly, in the memory tile, a layer selecting function is added. By focusing attention on these differences, the present embodiment is described.

(Structure of Memory Cell Array)

In FIG. 25, for simplification of description, four memory tile groups MTBK00 to MTBK11 are depicted. These four memory tile groups MTBK00 to MTBK11 are disposed so as to form a matrix of two rows×two columns, respectively at points of intersection of two global word line groups GWP0, GWP1 and two global bit lines GBL0, GBL1. Each of the memory tile groups MTBK00 to MTBK11 is configured of two memory tiles MT0, MT1 and one word-line driving circuit group WDBK. Each of the two memory tiles MT0, MT1 has eight memory cells MC00U to MC11U, MC00L to MC11L as described above.

For example, as typified by the memory tile group MTBK00, the memory cells MC00U to MC11U in the memory tile MT0 are respectively disposed at points of intersection of two word lines WL000, WL001 and two local bit lines LBL000U, LBL001U. Also, the memory cells MC00L to MC11L are respectively disposed at points of intersection of two word lines WL000, WL001 and two local bit lines LBL000L, LBL001L. Thus, for example, as the paired memory cells MC00U, MC00L, a common word line (here, the word line WL000) is used for the paired memory cells stacked on the same axis. Similarly, the memory cells MC00U to MC11U in the memory tile MT1 are respectively disposed at points of intersection of two word lines WL000, WL001 and two local bit lines LBL002U, LBL003U. Also, the memory cells MC00L to MC11L are respectively disposed at points of intersection of two word lines WL000, WL001 and two local bit lines LBL002L, LBL003L.

Each of the memory tiles MT0, MT1 has local-bit-line selection circuits LSLC0, LSLC1, a bit-line selection circuit BSLC, and local-bit-line driving circuits LDRV0, LDRV1 disposed at both ends of the memory cells MC00U to MC11U, MC00L to MC11L. For example, in the case of the memory tile MT0 in the memory tile group MTBK00, the local bit-line selection circuit LSLC0 selects one of the local bit lines LBL000U, LBL000L, and the local-bit-line selection circuit LSLC1 selects one of the local bit lines LBL001U and LBL001L. Also, the bit-line selection circuit BSLC selects one of a bit line BL000, which is an output signal from the local-bit-line selection circuit LSLC0, and a bit line BL001, which is an output signal from the local-bit-line selection circuit LSLC1.

Similarly, in the memory tile MT1 in the memory tile group MTBK00, the local bit-line selection circuit LSLC0 selects one of the local bit lines LBL002U, LBL002L, and the local-bit-line selection circuit LSLC1 selects one of the local bit lines LBL003U and LBL003L. Also, the bit-line selection circuit BSLC selects one of a bit line BL002, which is an output signal from the local-bit-line selection circuit LSLC0, and a bit line BL003, which is an output signal from the local-bit-line selection circuit LSLC1.

As with FIG. 3, the word-line driving circuit group WDBK is disposed adjacent to the memory tiles MT0 and MT1 so as to be able to be shared by the memory tiles MT0 and MT1. The word-line driving circuit group WDBK has two word-line driving circuits WD0, WD1. These word-line driving circuits WD0, WD1 drive word lines WL000, WL001, respectively, according to the voltage of the global word line group GWP0. Here, the global word line group GWP0 is configured of global word lines GWL00B, GWL01B. Thus, the word-line driving circuits WD0, WD1 drive the word lines WL000, WL001, respectively, according to the voltages of the global word line GWL00B, GWL01B. Note that the global word line group GWP1 is also similarly configured of global word lines GWL10B, GWL11B. These global word line groups GWP0, GWP1 are controlled by a global-word-line driving circuit group GWDBK.

Each of the word lines WL000, WL001 extends in the regions of the memory tiles MT0 and MT1 so as to be parallel to the global word line group GWP0. Also, a wiring (word line) orthogonal to a word line passing through the regions of the memory tiles MT0 and MT1 is provided. With this wiring structure, the same voltage can be fed to both word lines of the memory tiles MT0 and MT1. Note that an array-voltage feeder line is omitted in the drawing for simplification, which is provided in parallel to global bit lines similarly to FIG. 1.

As depicted in FIG. 1, for each of the global bit lines GBL0, GBL1, read/write circuits RW0, RW1 are disposed. Each of these read/write circuits RW0, RW1 is configured of a sense amplifier SA, a rewrite-current driving circuit WCD, and a read/write selection circuit RWSLC. The sense amplifier SA is a circuit for distinguishing stored information in the memory cell selected from the memory tile. The rewrite-current driving circuit WCD is a circuit for controlling a current to be applied to a memory cell according to the stored information. The read/write selection circuit RWSLC is a circuit for connecting either one of the sense amplifier SA and the rewrite-current driving circuit WCD to a global bit line.

(Specific Structure of Memory Tiles)

Figure 26:
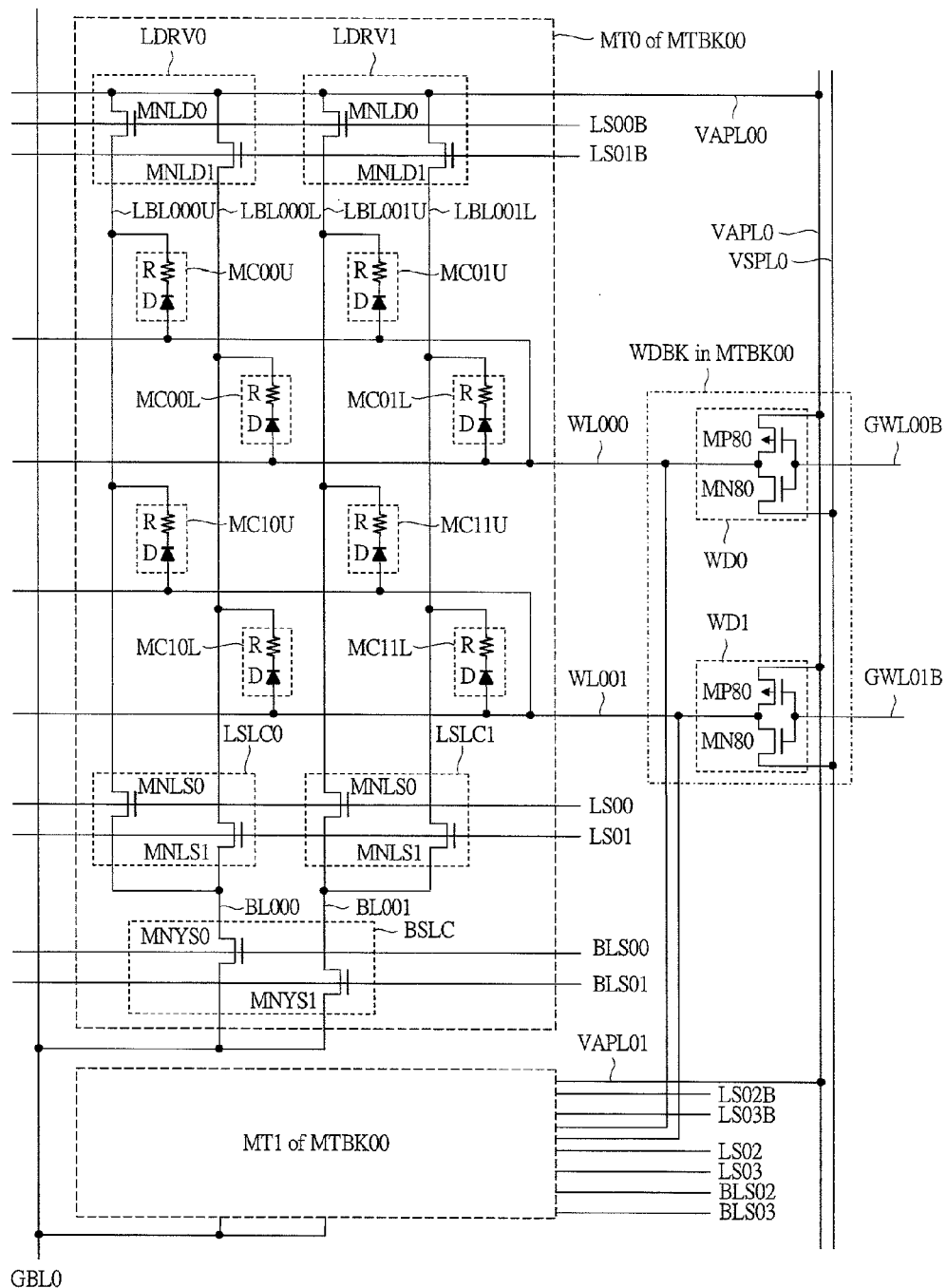
FIG. 26 is a circuit diagram depicting an example of detailed structure of memory tiles and a word-line driving circuit group in the memory cell array of the phase-change memory depicted in FIG. 25.

FIG. 26 depicts an example of a specific structure of the memory tiles and the word-line driving circuit group in the memory cell array depicted in FIG. 25. In the drawing, as a typical example, the memory tiles MT0, MT1 in the memory tile group MTBK00 and the word-line driving circuit group WDBK are shown. Each of the memory cells MC00U to MC11U, MC00L to MC11L is configured to have, as with FIG. 3 described above, a diode D and a variable resistance R connected in the order of a word line-the diode D-the variable resistance R-a local bit line.

The local-bit-line selection circuit LSLC0 is a circuit that selects either one of the local bit line LBL000U to which the upper-layer memory cells MC00U, MC10U are connected and the local bit line LBL000L to which the lower-layer memory cells MC00L, MC10L are connected for connection to the bit line BL000. Also, the local-bit-line selection circuit LSLC1 is a circuit that selects either one of the local bit line LBL001U to which the upper-layer memory cells MC01U, MC11U are connected and the local bit line LBL001L to which the lower-layer memory cells MC01L, MC11L are connected for connection to the bit line BL001. Each of these local-bit-line selection circuits LSLC0, LSLC1 is configured of NMOS transistors MNLS0, MNLS1.

Either one of the drain electrode and the source electrode of the transistor MNLS0 in the local-bit-line selection circuit LSLC0 is connected to the local bit line LBL000U, and the other is connected to the bit line BL000. Either one of the drain electrode and the source electrode of the transistor MNLS1 in the local-bit-line selection circuit LSLC0 is connected to the local bit line LBL000L, and the other is connected to the bit line BL000. Either one of the drain electrode and the source electrode of the transistor MNLS0 in the local-bit-line selection circuit LSLC1 is connected to the local bit line LBL001U, and the other is connected to the bit line BL001. Either one of the drain electrode and the source electrode of the transistor MNLS1 in the local-bit-line selection circuit LSLC1 is connected to the local bit line LBL001L, and the other is connected to the bit line BL001.

To the gate electrode of each transistor MNLS0 in the local-bit-line selection circuits LSLC0, LSLC1, a common local-bit-line selection signal LS00 is connected. Also, to the gate electrode of each transistor MNLS1 in the local-bit-line selection circuits LSLC0, LSLC1, a common local-bit-line selection signal LS01 is connected.

The local-bit-line driving circuit LDRV0 is a circuit that selectively connects the local bit line LBL000U to which the upper-layer memory cells MC00U, MC10U are connected and the local bit line LBL000L to which the lower-layer memory cells MC00L, MC10L are connected to an array-voltage feeder line VAPL00. Also, the local-bit-line driving circuit LDRV1 is a circuit that selectively connects the local bit line LBL001U to which the upper-layer memory cells MC01U, MC11U are connected and the local bit line LBL001L to which the lower-layer memory cells MC01L, MC11L are connected to the array-voltage feeder line VAPL00. Each of these local-bit-line driving circuits LDRV0, LDRV1 is configured of NMOS transistors MNLD0, MNLD1.

Either one of the drain electrode and the source electrode of the transistor MNLD0 in the local-bit-line driving circuit LDRV0 is connected to the local bit line LBL000U, and the other is connected to the array-voltage feeder line VAPL00. Either one of the drain electrode and the source electrode of the transistor MNLD1 in the local-bit-line driving circuit LDRV0 is connected to the local bit line LBL000L, and the other is connected to the array-voltage feeder line VAPL00. Either one of the drain electrode and the source electrode of the transistor MNLD0 in the local-bit-line driving circuit LDRV1 is connected to the local bit line LBL001U, and the other is connected to the array-voltage feeder line VAPL00. Either one of the drain electrode and the source electrode of the transistor MNLD1 in the local-bit-line driving circuit LDRV1 is connected to the local bit line LBL001L, and the other is connected to the array-voltage feeder line VAPL00. To the gate electrode of the transistor MNLD0 in the local-bit-line driving circuit LDRV0, LDRV1, a local-bit-line driving signal LS00B is connected. To the gate electrode of the transistor MNLD1 in the local-bit-line driving circuit LDRV0, LDRV1, a local-bit-line driving signal LS01B is connected. These local-bit-line driving signals LS00B, LS01B are inverse signals of the local-bit-line selection signals LS00, LS01. In the structure as described above, the local-bit-line selection circuits LSLC0, LSLC1 and the local-bit-line driving circuits LDRV0, LDRV1 achieve a layer selecting function.

As with the bit-line selection circuit BSLC depicted in FIG. 3, the bit-line selection circuit BSLC is configured of NMOS transistors MNYS0, MNYS1. Either one of the drain electrode and the source electrode of the transistor MNYS0 is connected to the bit line BL000, and the other is connected to the global bit line GBL0. Also, to the gate electrode of the transistor MNYS0, a bit-line selection signal BLS00 is connected. Either one of the drain electrode and the source electrode of the transistor MNYS1 is connected to the bit line BL001, and the other is connected to the global bit line GBL0. Also, to the gate electrode of the transistor MNYS1, a bit-line selection signal BLS01 is connected.

FIG. 27 is a truth table summarizing a relation between an X address signal X1 and Y address signals Y0, Y2 to be inputted to the bit-line control circuit group BCBK and local-bit-line selection signals LS00 to LS13. The X address signal X1 indicates a global word line group to be selected. That is, when the X address signal X1 indicates a logical value of "0", the global word line group GWP0 is selected, and a set of the memory tile groups MTBK00, MTBK01 is selected. On the other hand, when the X address signal X1 indicates a logical value of "1", the global word line group GWP1 is selected, and a set of the memory tile groups MTBK10, MTBK11 is selected.

The Y address signal Y0 indicates a layer formed with a memory cell to which a local bit line is connected. That is, when the Y address signal Y0 indicates a logical value of "0", an upper layer is selected. On the other hand, when the Y address signal Y0 indicates a logical value of "1", a lower layer is selected. Also, the Y address signal Y2 indicates an address for selecting a memory tile in the memory tile group. When the Y address signal Y2 indicates a logical value of "0", the memory tile MT0 is selected. On the other hand, when the Y address signal Y2 indicates a logical value of "1", the memory tile MT1 is selected.

From address allocation described above, the local-bit-line selection signal LS00 is used to control a connection of the upper-layer local bit lines LBL000U, LBL001U in the memory tile MT0 in the memory tile groups MTBK00, MTBK01. The local-bit-line selection signal LS01 is used to control a connection of the lower-layer local bit lines LBL000L, LBL001L in the memory tile MT0 in the memory tile groups MTBK00, MTBK01. The local-bit-line selection signal LS02 is used to control a connection of the upper-layer local bit lines LBL002U, LBL003U in the memory tile MT1 in the memory tile groups MTBK00, MTBK01. The local-bit-line selection signal LS03 is used to control a connection of the lower-layer local bit lines LBL002L, LBL003L in the memory tile MT1 in the memory tile groups MTBK00, MTBK01. Similarly, the local-bit-line selection signals LS10 to LS13 are used to select a local bit line in the memory tile groups MTBK10, MTB11.

FIG. 28 is a truth table summarizing a relation between the X address signal X1 and the Y address signals Y1, Y2 to be inputted to the bit-line control circuit group BCBK and bit-line selection signals BLS00 to BLS13. Y address signal Y1 is a signal for selecting a bit line. If the memory tile MT0 in the memory tile group MTBK00 is taken as an example, when the Y address signal Y1 indicates a logical value of "0", a bit line with an even-numbered ordinal number is selected. For example, with the bit-line selection signal BLS00, the bit line BL000 in the memory tile MT0 in the memory tile groups MTBK00 MTBK01 is selected. Also, with the bit-line selection signal BLS02, the bit line BL002 in the memory tile MT1 in the memory tile groups MTBK00, MTBK01 is selected. On the other hand, when the Y address signal Y1 indicates a logical value of "1", a bit line with an odd-numbered ordinal number is selected. For example, with the bit-line selection signal BLS01, the bit line BL001 in the memory tile MT0 in the memory tile groups MTBK00, MTBK01 is selected. Also, with the bit-line selection signal BLS03, the bit line BL003 in the memory tile MT1 in the memory tile groups MTBK00, MTBK01 is selected. Similarly, the bit-line selection signals BLS10 to BLS13 are used to bit-line selection in the memory tile groups MTBK10, MTBK11.

(Operation of Memory Cell Array)

Figure 29:
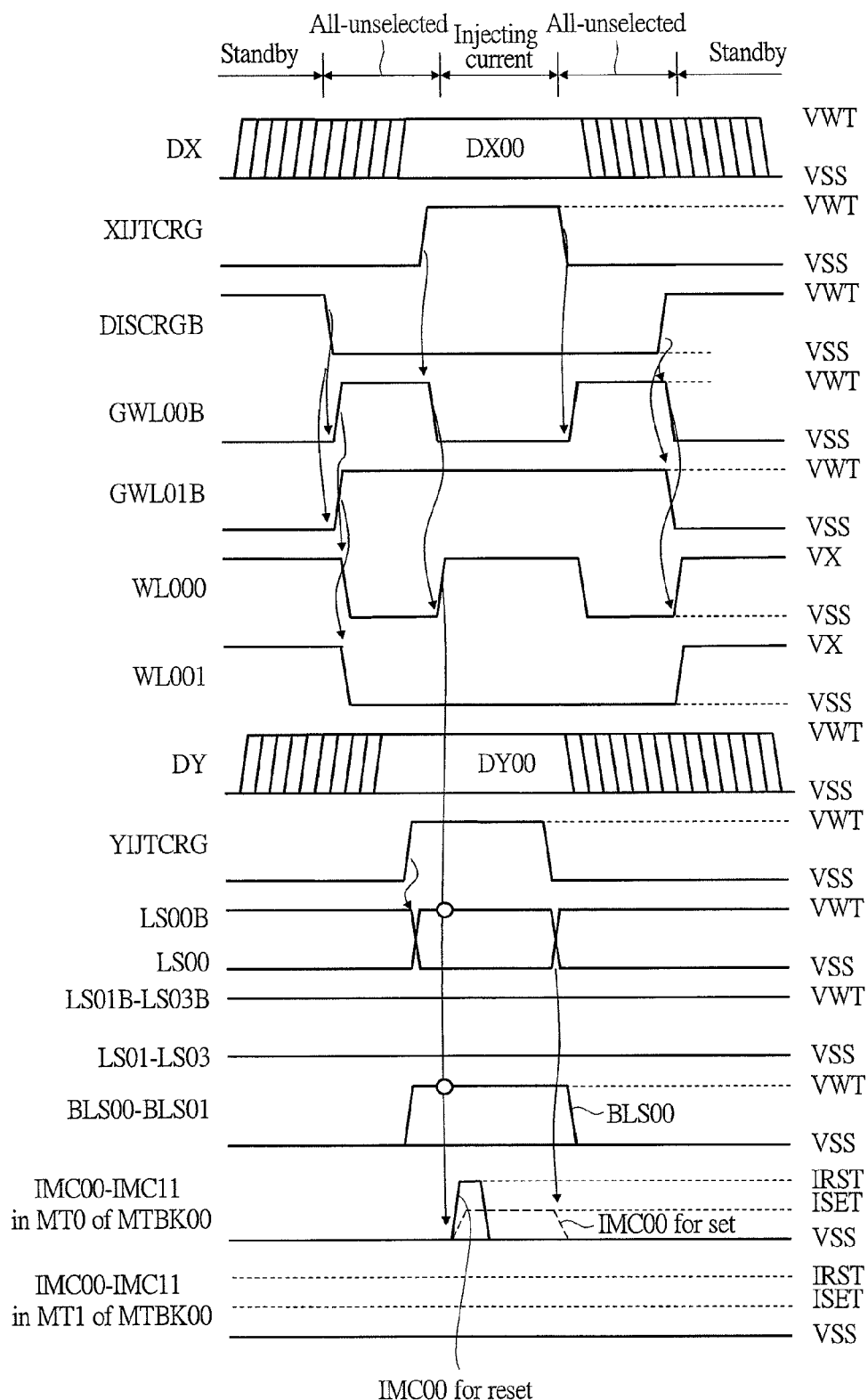
FIG. 29 is a timing chart depicting an example of operation of a rewrite operation in the memory cell array of the phase-change memory depicted in FIG. 25.

The operation of the above-structure memory cell array is described according to FIG. 29 to FIG. 35. FIG. 29 depicts control signals relating to the memory cell MC00U, assuming the case of performing a rewrite operation in the memory cell MC00U in the memory tile MT0 in the memory tile group MTBK00 depicted in FIG. 25. In the following, for simplification, attention is focused on the memory tile group MTBK00, and the operation, mainly differences from FIG. 9, is described.

Figure 30:
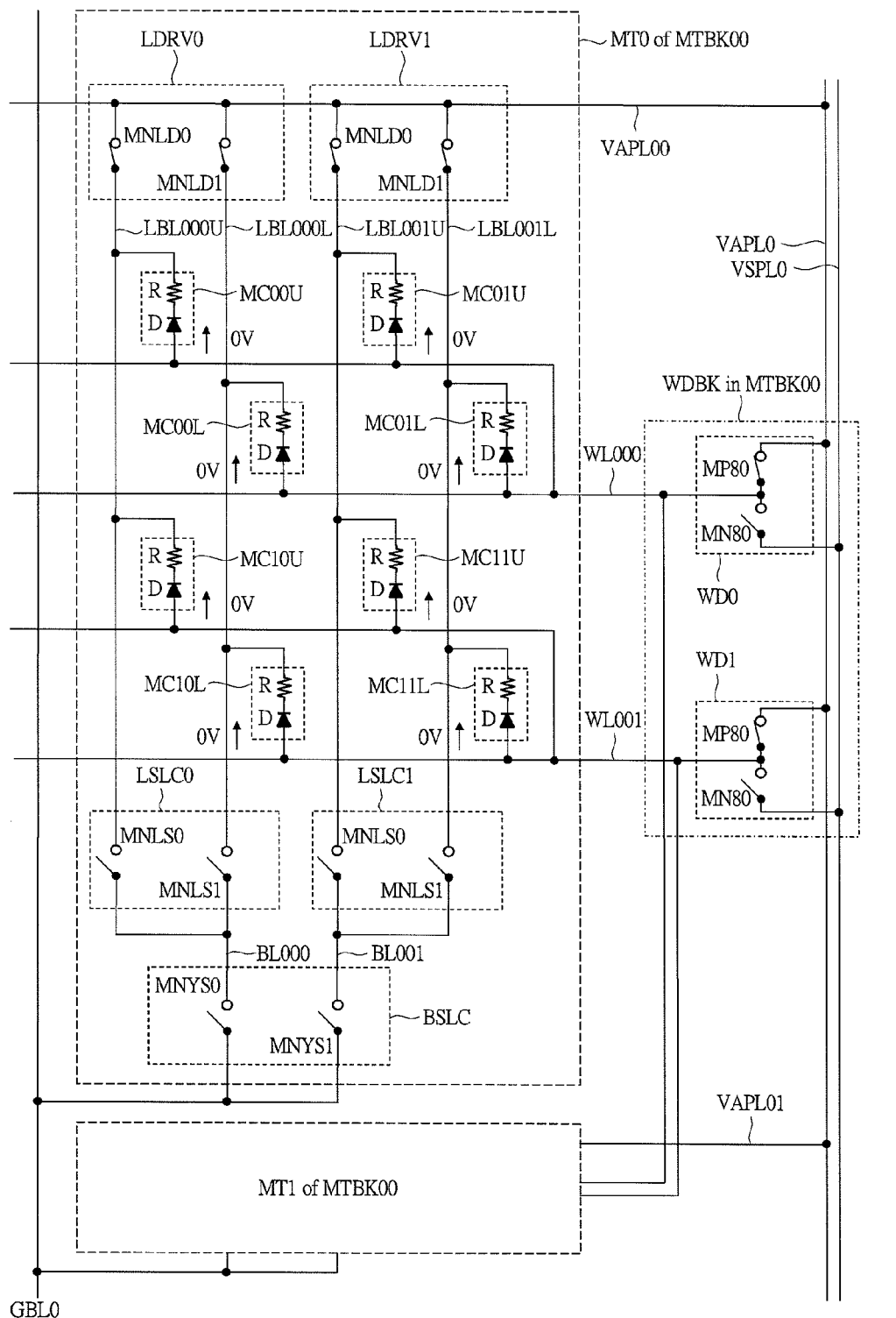
FIG. 30 is a diagram depicting an example of a conduction state in a standby state in the memory cell array of the phase-change memory depicted in FIG. 25 (part 1)
Figure 31:
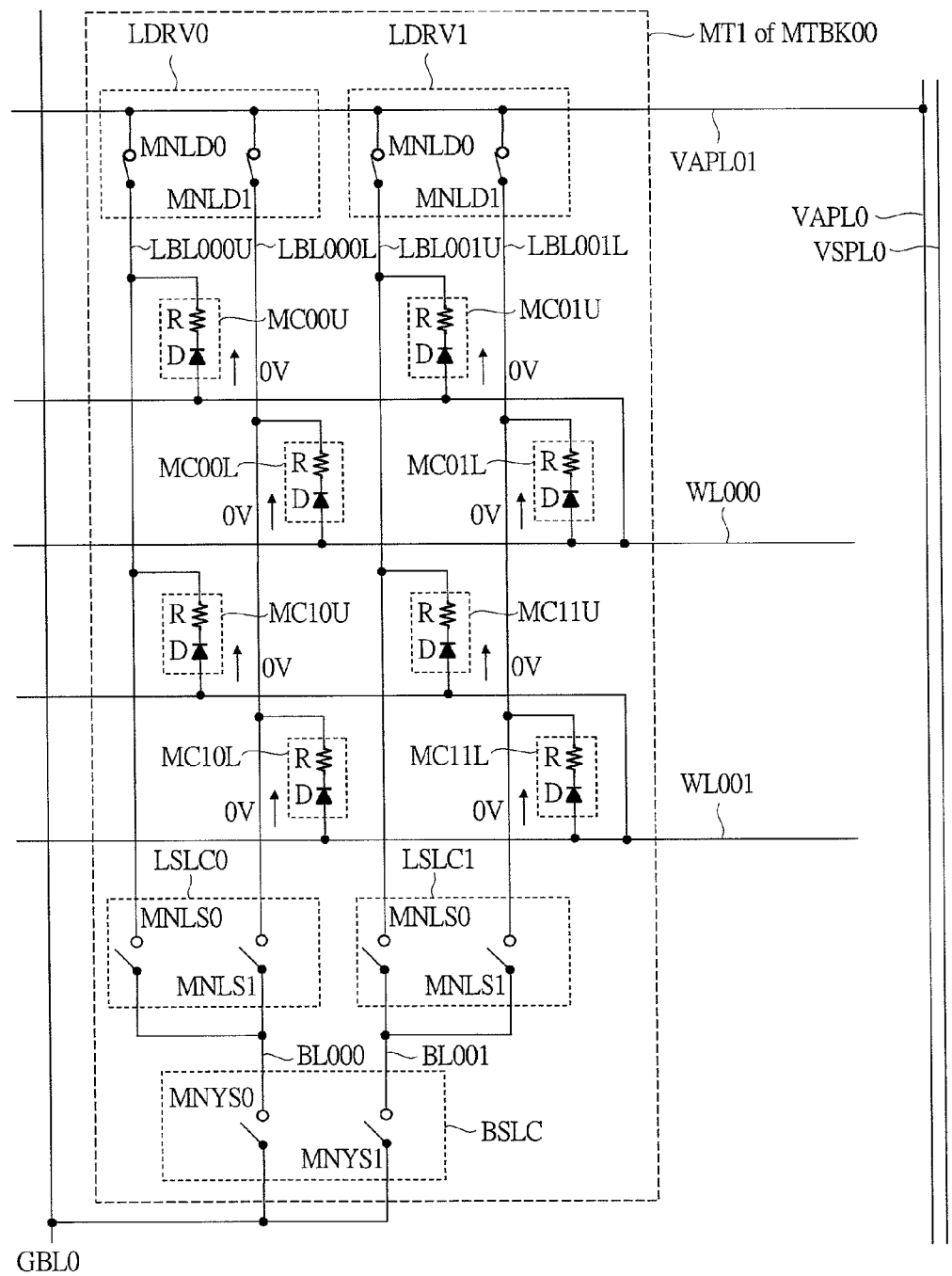
FIG. 31 is a diagram depicting an example of a conduction state in a standby state in the memory cell array of the phase-change memory depicted in FIG. 25 (part 2)

First, in a standby state, since a discharge signal DISCRGB is held at the rewrite voltage VWT, the global word lines GWL00B, GWL01B are driven to the ground voltage VSS, and the word lines WL000, WL001 are driven to the rewrite voltage VWT. Also, with the local-bit-line selection signals LS00 to LS03 being driven to the ground voltage VSS and the local-bit-line driving signals LS00B to LS03B being driven to the rewrite voltage VWT, the local bit lines LBL000U to LBL003U, LBL000L to LBL003L are driven to a voltage near the rewrite voltage VWT. Note that the bit-line selection signals BLS00 to BLS03 are held at the ground voltage VSS. Thus, as depicted in FIG. 30 and FIG. 31, a voltage to be applied to the memory cells MC00U to MC11U, MC00L to MC11L in the memory tiles MT0, MT1 in the memory tile group MTBK00 is approximately 0 V. At this time, the current hardly flows through the memory cells.

Figure 32:
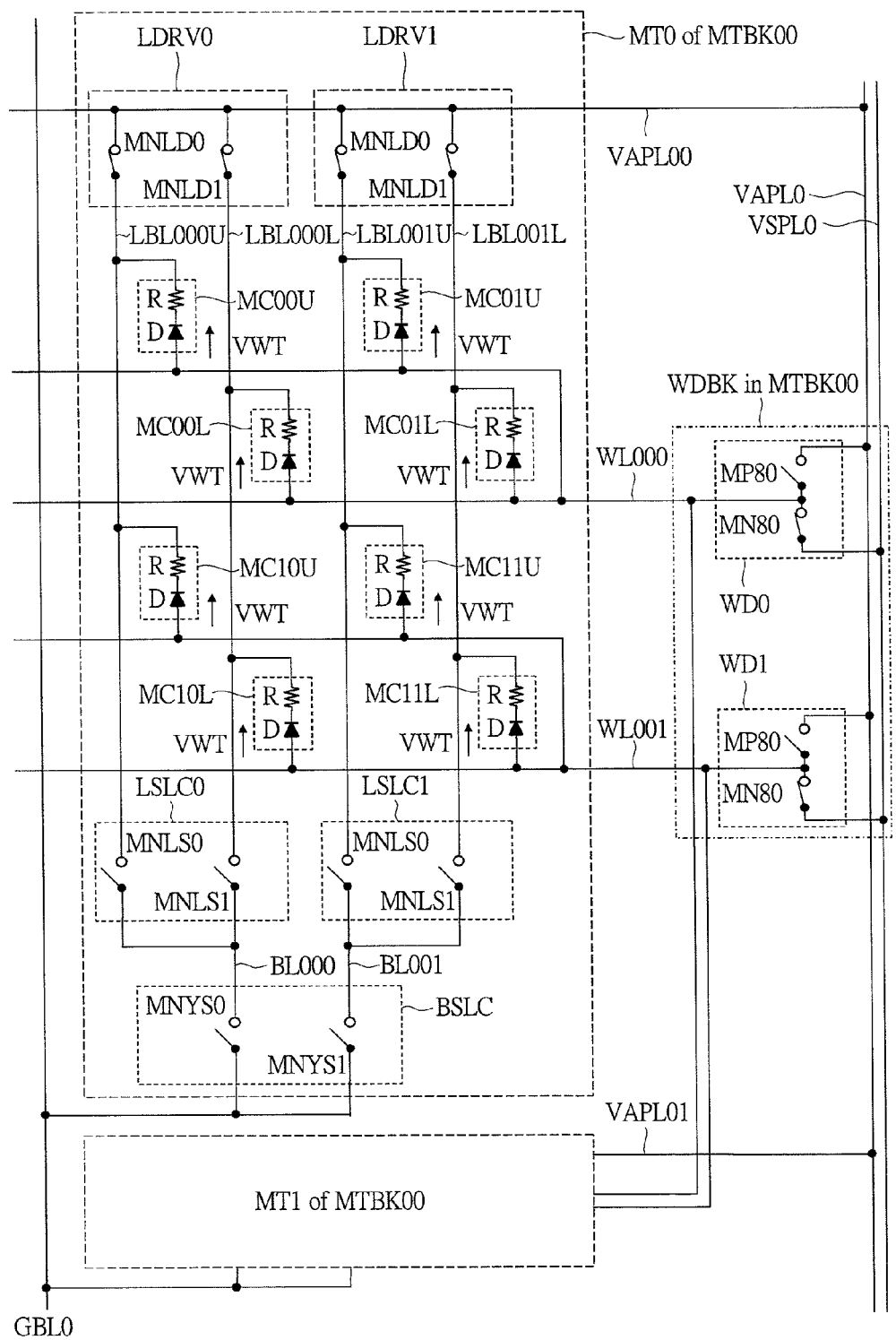
FIG. 32 is a diagram depicting an example of a conduction state in an all-bit unselected state in the memory cell array of the phase-change memory depicted in FIG. 25 (part 1)
Figure 33:
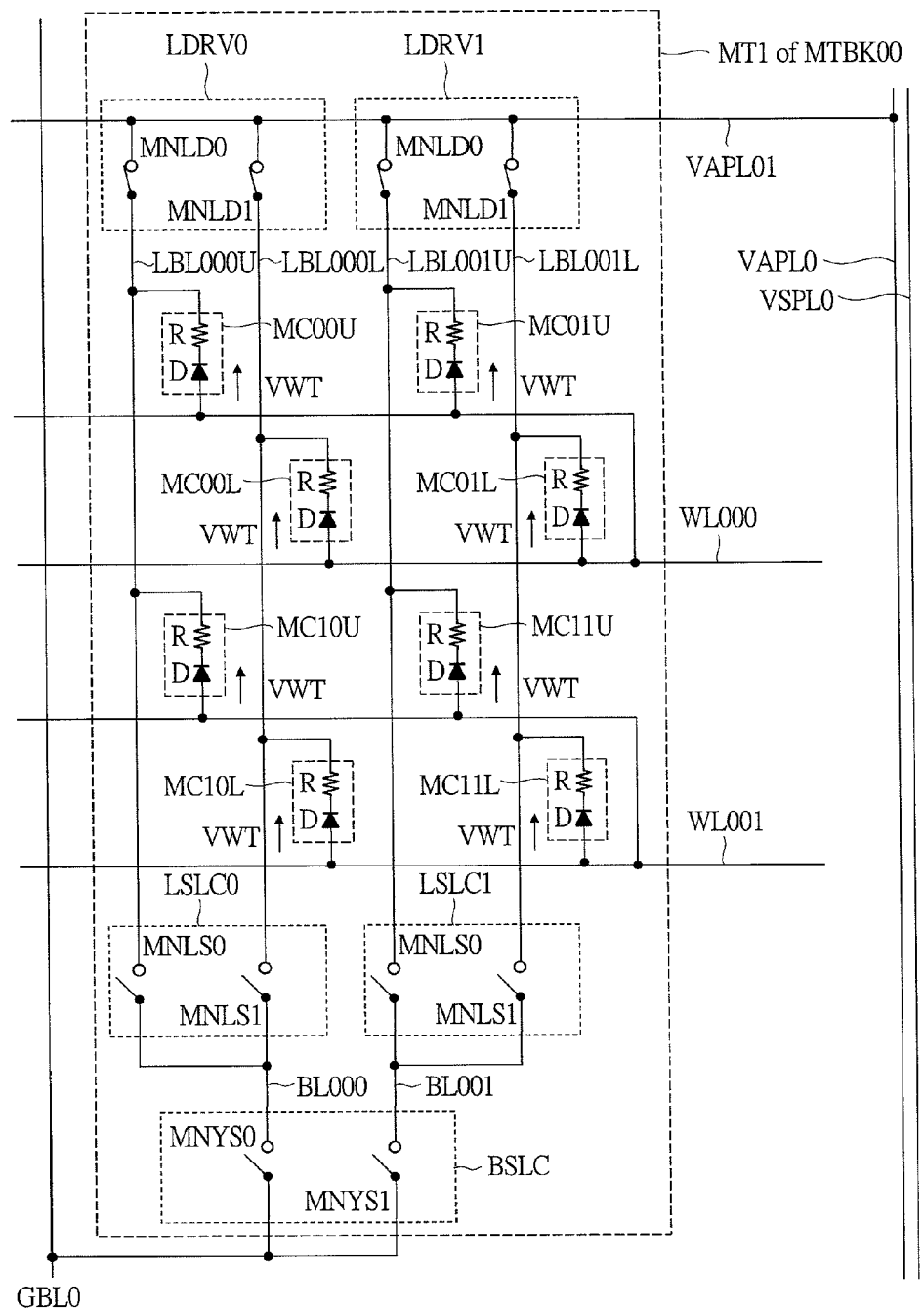
FIG. 33 is a diagram depicting an example of a conduction state in an all-bit unselected state in the memory cell array of the phase-change memory depicted in FIG. 25 (part 2)

Referring back to FIG. 29, next, a rewrite operation is started. First, as depicted in FIG. 32 and FIG. 33, with the discharge signal DISCRGB at the rewrite voltage VWT being driven to the ground voltage VSS, the memory cells MC00U to MC11U, MC00L to MC11L in the memory tiles MT0, MT1 in the memory tile group MTBK00 become once in an unselected state. Then, referring back to FIG. 29 again, when address signal decoding is completed, the rewrite voltage VWT is supplied to the word line WL000 being at the ground voltage VSS. Also, the local-bit-line selection signal LS00 and the bit-line selection signal BLS00 at the ground voltage VSS are driven to the rewrite voltage VWT, and the local-bit-line driving signal LS00B at the rewrite voltage VWT is driven to the ground voltage VSS.

Figure 34:
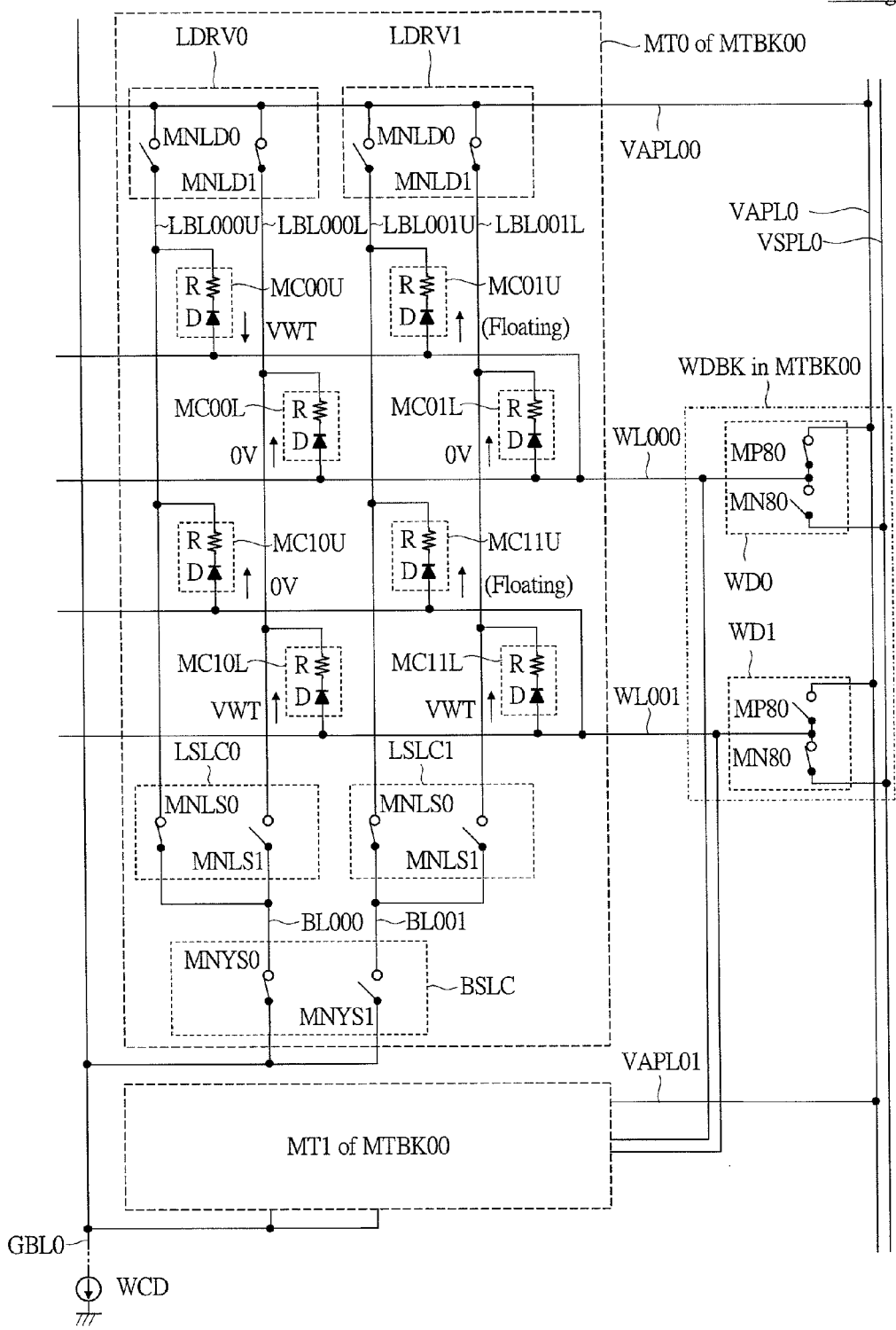
FIG. 34 is a diagram depicting an example of a conduction state in a rewrite state in the memory cell array of the phase-change memory depicted in FIG. 25 (part 1)
Figure 35:
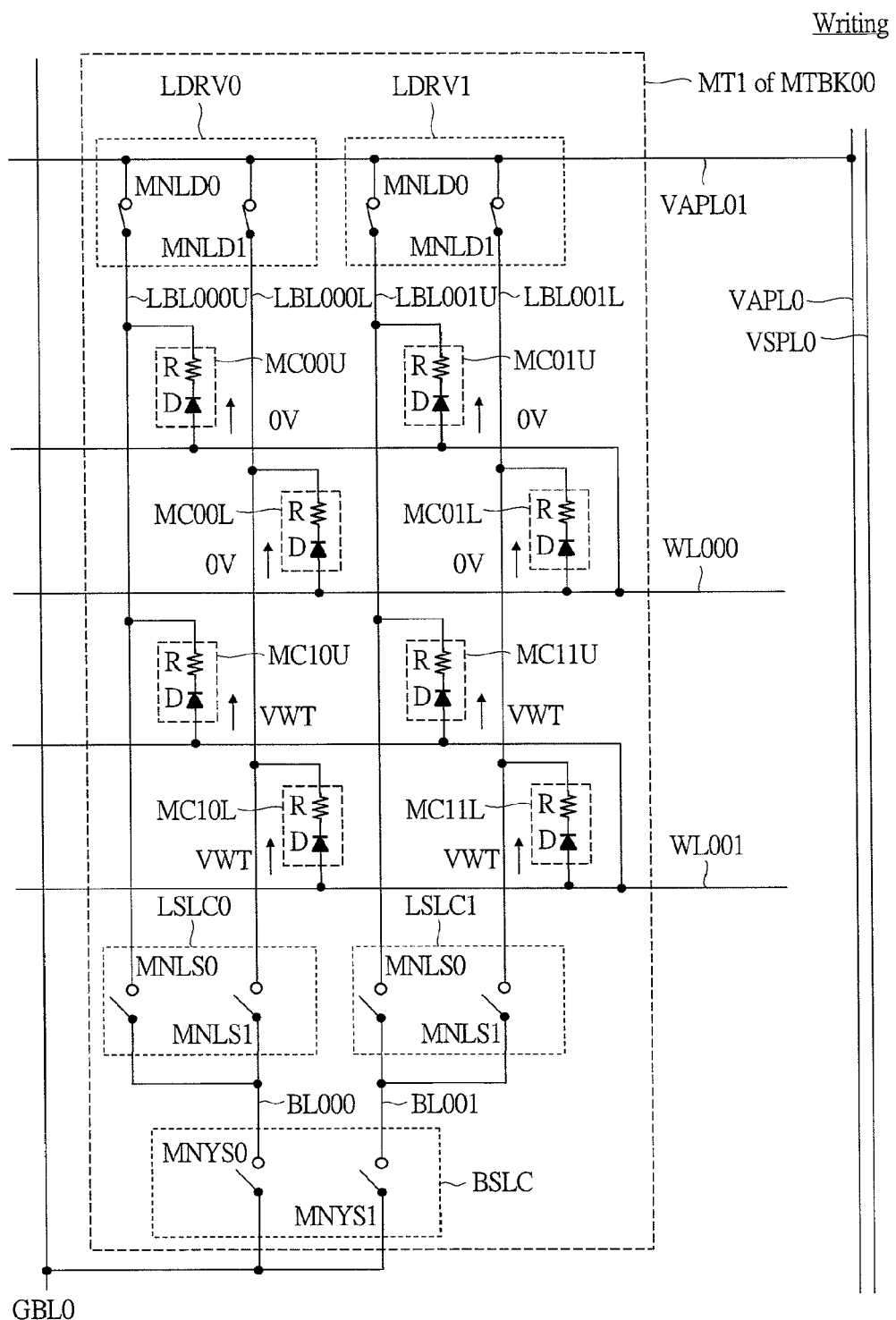
FIG. 35 is a diagram depicting an example of a conduction state in a rewrite state in the memory cell array of the phase-change memory depicted in FIG. 25 (part 2)

FIG. 34 and FIG. 35 depict a conduction state of the memory tiles MT0, MT1 in the memory tile group MTBK00 in this state. To the word line WL000, the rewrite voltage VWT is supplied via the PMOS transistor MP80 in the word-line driving circuit WD0. Also, with the NMOS transistors MNLD0 in the local-bit-line driving circuits LDRV0, LDRV1 in the memory tile MT0 becoming in a cutoff state, a connection between the local bit lines LBL000U, LBL001U and the array-voltage feeder line VAPL00 is cut off. On the other hand, with the NMOS transistor MNLS0 of the local-bit-line selection circuit LSLC0 in the memory tile MT0 and the NMOS transistor MNYS0 of the bit-line selection circuit BSLC each becoming in a conduction state, the bit line BL000 is driven from the global bit line GBL0 via the rewrite-current driving circuit WCD to a voltage near the ground voltage VSS. Thus, a voltage approximately equal to the rewrite voltage VWT is applied to the memory cell MC00U in the memory tile MT0.

In the local-bit-line selection circuit LSLC1, the NMOS transistor MNLS0 becomes in a conduction state. However, since the NMOS transistor MNYS1 of the bit-line selection circuit BSLC is kept in a cutoff state, the bit line BL001 becomes a floating state. Thus, a voltage to be applied between the memory cells MC01U and MC11U has a value so that a current flowing through the diode D in the memory cell MC01U becoming in a forward bias state and a current flowing through the diode D in the memory cell MC11U becoming in a reverse bias state are equal to each other. At this time, currents flowing through both of the memory cells are limited with a diode current in the memory cell MC11U in a reverse bias state. Since the current in this state is incommensurably smaller than a current required for a rewrite operation, information stored in both of the memory cells is retained. Note that, as depicted in FIG. 35, the memory tile MT in the memory tile group MTBK00 is retained in a state similar to that of the local bit lines LBL000L, LBL001L of the memory tile MT0 depicted in FIG. 34.

Referring back to FIG. 29 again, when application of the rewrite current ends, a current applying signal XIJTCRG at the rewrite voltage VWT is driven to the ground voltage VSS, and a current applying signal YIJTCRG at the rewrite voltage VWT is driven to the ground voltage VSS. Thus, as depicted in FIG. 32 and FIG. 33, all of the memory cells again become in an unselected state. Furthermore, with the discharge signal DISCRGB at the ground voltage VSS being driven to the rewrite voltage VWT, the state returns to be the standby state depicted in FIG. 30 and FIG. 31.

In the foregoing, for simplification, the operation has been described by focusing attention on the memory tile group MTBK00. It can be easily understood, however, that, by the global word lines GWL00B, GWL01B, the bit-line selection signals BLS00 to BLS03, the local-bit-line selection signals LS00 to LS03, and the local-bit-line driving signals LS00B to LS03B, even in the memory tile group MTBK01 that is controlled together with the memory tile group MTBK00, a similar rewrite operation is performed on the memory cell MC00U in the memory tile MT0.

Also, while a rewrite operation has been described so far, a selecting operation is performed also in a read operation with a similar procedure. In the case of a read operation, the voltages of the array-voltage feeder lines VAPL0 and VAPL00 depicted in FIG. 30 to FIG. 35 are switched to the read voltage VRD by using the array-voltage selection circuit VSLC0 similar to that depicted in FIG. 1, and a voltage to be supplied to the selected word line WL000 is taken as the read voltage VRD. Also, in FIG. 34, in place of the rewrite-current driving circuit WCD, the sense amplifier SA is connected to the global bit line GBL0. Furthermore, by appropriately adjusting the driving time of the control signals depicted in FIG. 29, a current detecting operation according to the stored information, that is, the value of the variable resistance in the memory cell, can be performed.

Effects of Embodiment

Finally, effects that can be obtained from the structure and operation that have been described so far are summarized. With the use of the semiconductor device of the third embodiment, in addition to the various effects described in the first embodiment, the following three more effects can be obtained. As a first effect, by laminating memory cells to increase the number of memory cells per unit area, the degree of integration is improved, and a memory cell array having a small area and a large capacity can be achieved. As a second effect, by sharing a word line connected to the laminated memory cells, the area of the word-line driving circuit is suppressed, thereby improving the degree of integration. As a third effect, by distributing the function of selecting a local bit line when the memory cells are laminated into the local-bit-line selection circuit LSLC and the local-bit-line driving circuit LDRV in the memory tile, and the bit-line selection circuit BSLC, the number of various control signals for selecting a bit line (here, the local-bit-line selection signals, the local-bit-line driving signals, and the bit-line selection signals) can be suppressed. This takes more effects, as will be described in the next paragraph and fourth embodiments, in a memory tile extended from the memory tile having a structure of (two rows×two columns)×two layers depicted in FIG. 25. Thus, only the basic structure of the memory tile is described herein.

Note that while the structure has been described so far in which two adjacent memory tiles in a global-bit-line direction share one word-line driving circuit, how to share is not particularly restricted. For example, the word-line driving circuit can be shared by four memory tiles. In this case, the area of the word-line driving circuit as a whole chip can further be reduced to one quarter. Also, for simplification of description, while the memory tile structure having memory cells of (two rows×two columns)×two layers has been described, the number of lamination of memory cells is not particularly restricted. For example, even when the memory tile structure is doubled to (two rows×two columns)×four layers, a similar selecting operation can be performed by extending the local-bit-line selection circuits (the local-bit-line driving circuits) and the bit-line selection circuits.

Fourth Embodiment

Figure 36:
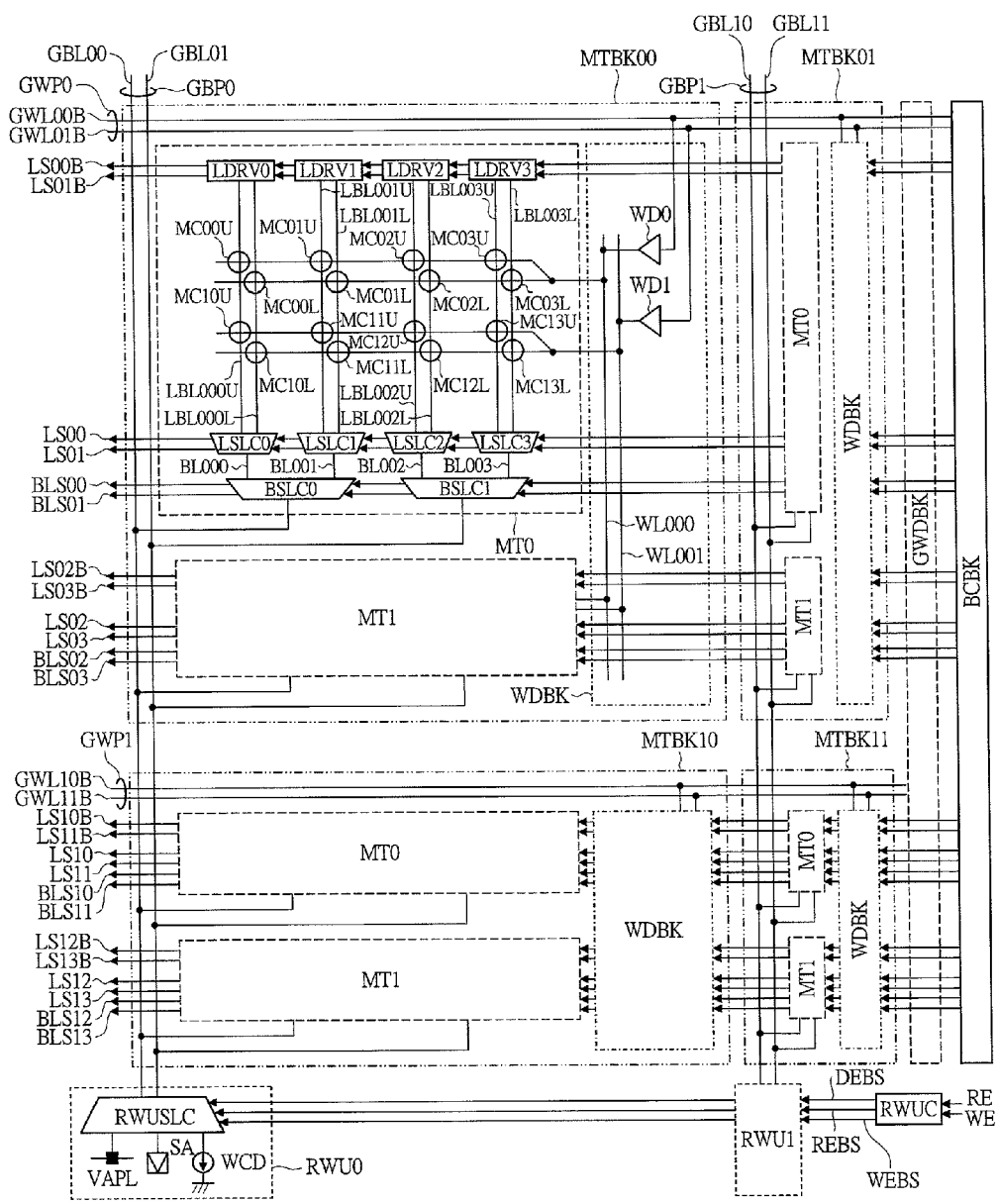
FIG. 36 is a schematic diagram depicting an example of structure of a memory cell array in a semiconductor device according to a fourth embodiment of the present invention.

In a fourth embodiment, still another example of the memory cell array structure is described. FIG. 36 is a schematic diagram depicting an example of structure of the memory cell array in a semiconductor device according to the fourth embodiment of the present invention. A feature of this memory cell array structure is such that, compared with the memory cell array structure depicted in FIG. 25, a selecting operation is performed by using a plurality of bit-line selection circuits with the size of the memory tiles being extended from (two rows×two columns)×two layers to (two rows×four columns)×two layers. A low-system circuit structure, such as the word-line driving circuit group WDBK, is similar to the structure depicted in FIG. 25. Also, the structures of the global bit line groups GBP0, GBP1 and the read/write circuits RWU0, RWU1 are similar to the structures depicted in FIG. 13 described above. Thus, by focusing attention to differences from FIG. 25, the present embodiment is described.

(Structure of Memory Cell Array)

In FIG. 26, for simplification of description, four memory tile groups MTBK00 to MTBK11 are depicted. These four memory tile groups MTBK00 to MTBK11 are disposed so as to form a matrix of two rows×two columns, respectively at points of intersection of two global word line groups GWP0, GWP1 and two global bit line groups GBP0, GBP1. Each of the memory tile groups MTBK00 to MTBK11 is configured of two memory tiles MT0, MT1 and one word-line driving circuit group WDBK. Each of the two memory tiles MT0, MT1 has sixteen memory cells MC00U to MC13U, MC00L to MC13L.

For example, as typified by the memory tile group MTBK00, the memory cells MC00U to MC13U in the memory tile MT0 are respectively disposed at points of intersection of two word lines WL000, WL001 and four local bit lines LBL000U to LBL003U. Also, the memory cells MC00L to MC13L are respectively disposed at points of intersection of two word lines WL000, WL001 and four local bit lines LBL000L to LBL003L. Thus, for example, as MC00U and MC00L, a common word line (here, the word line WL000) is used for the paired memory cells stacked on the same axis.

Each of the memory tiles MT0, MT1 has local-bit-line selection circuits LSLC0 to LSLC3, bit-line selection circuits BSLC0, BSLC1, and local-bit-line driving circuits LDRV0 to LDRV3 disposed at both ends of the memory cells MC00U to MC13U, MC00L to MC13L. For example, in the case of the memory tile MT0 in the memory tile group MTBK00 the local-bit-line selection circuit LSLC0 controls the local bit lines LBL000U, LBL000L, the local-bit-line selection circuit LSLC1 controls the local bit lines LBL001U and LBL001L, the local-bit-line selection circuit LSLC2 controls the local bit lines LBL002U and LBL002L, and the local-bit-line selection circuit LSLC3 controls the local bit lines LBL003U and LBL003L.

The bit-line selection circuit BSLC0 selects one of a bit line BL000, which is an output signal from the local-bit-line selection circuit LSLC0, and a bit line BL001, which is an output signal from the local-bit-line selection circuit LSLC1. Similarly, the bit-line selection circuit BSLC1 selects one of a bit line BL002, which is an output signal from the local-bit-line selection circuit LSLC2, and a bit line BL003, which is an output signal from the local-bit-line selection circuit LSLC3. Also, the local-bit-line driving circuit LDRV0 controls the local bit lines LBL000U, LBL000L, the local-bit-line driving circuit LDRV1 controls the local bit lines LBL001U, LBL001L, the local-bit-line driving circuit LDRV2 controls the local bit lines LBL002U, LBL002L, and the local bit-line driving circuit LDRV3 controls the local bit lines LBL003U, LBL003L.

(Specific Structure of Memory Tiles)

Figure 37:
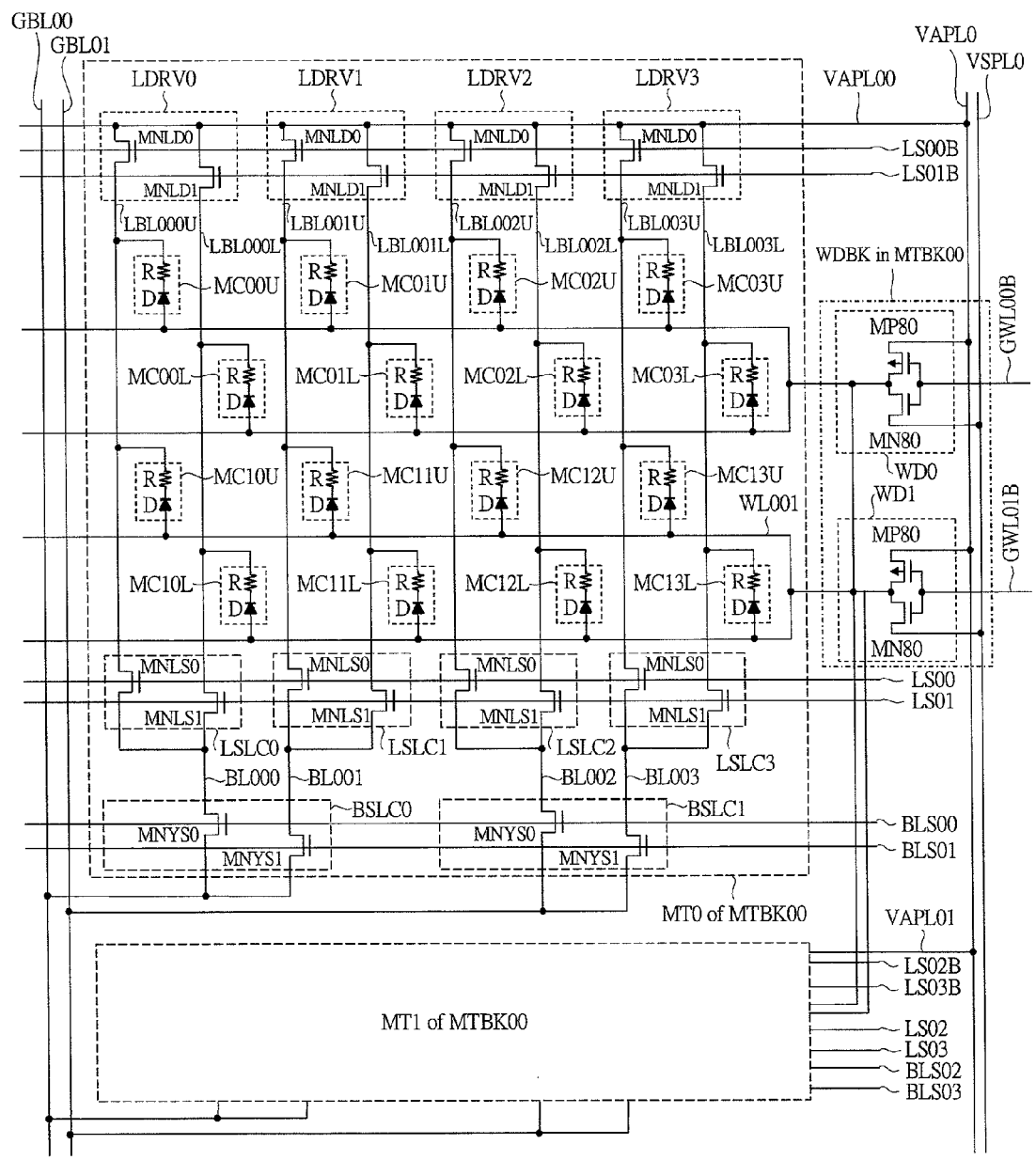
FIG. 37 is a circuit diagram depicting an example of detailed structure of memory tiles and a word-line driving circuit group in the memory cell array of the phase-change memory depicted in FIG. 36.

FIG. 37 depicts an example of a specific structure of the memory tiles and the word-line driving circuit in the memory cell array depicted in FIG. 36. In the drawing, as a typical example, the memory tiles MT0, MT1 in the memory tile group MTBK00 and the word-line driving circuit group WDBK are shown. Each of the memory cells MC00U to MC13U, MC00L to MC13L is configured to have a diode D and a variable resistance R connected in the order of a word line-the diode D-the variable resistance R-a local bit line.

The local-bit-line selection circuit LSLC0 in the memory tile MT0 is a circuit that selects either one of the local bit line LBL000U to which the upper-layer memory cells MC00U, MC10U are connected and the local bit line LBL000L to which the lower-layer memory cells MC00L, MC10L are connected for connection to the bit line BL000. Also, the local-bit-line selection circuit LSLC1 is a circuit that selects either one of the local bit line LBL001U to which the upper-layer memory cells MC01U, MC11U are connected and the local bit line LBL001L to which the lower-layer memory cells MC01L, MC11L are connected for connection to the bit line BL001. The local-bit-line selection circuit LSLC2 is a circuit that selects either one of the local bit line LBL002U to which the upper-layer memory cells MC02U, MC12U are connected and the local bit line LBL002L to which the lower-layer memory cells MC02L, MC12L are connected for connection to the bit line BL002. Also, the local-bit-line selection circuit LSLC3 is a circuit that selects either one of the local bit line LBL003U to which the upper-layer memory cells MC03U, MC13U are connected and the local bit line LBL003L to which the lower-layer memory cells MC03L, MC13L are connected for connection to the bit line BL003.

As with the local-bit-line selection circuit LSLC depicted in FIG. 26, each of these local-bit-line selection circuits LSLC0 to LSLC3 is configured of NMOS transistors MNLS0, MNLS1. Either one of the drain electrode and the source electrode of the transistor MNLS0 in the local-bit-line selection circuit LSLC0 in the memory tile MT0 is connected to the local bit line LBL000U, and the other is connected to the bit line BL000. Either one of the drain electrode and the source electrode of the transistor MNLS1 in the local-bit-line selection circuit LSLC0 is connected to the local bit line LBL000L, and the other is connected to the bit line BL000. Either one of the drain electrode and the source electrode of the transistor MNLS0 in the local-bit-line selection circuit LSLC1 is connected to the local bit line LBL001U, and the other is connected to the bit line BL001. Either one of the drain electrode and the source electrode of the transistor MNLS1 in the local-bit-line selection circuit LSLC1 is connected to the local bit line LBL001L, and the other is connected to the bit line BL001.

Similarly, either one of the drain electrode and the source electrode of the transistor MNLS0 in the local-bit-line selection circuit LSLC2 is connected to the local bit line LBL002U, and the other is connected to the bit line BL002. Either one of the drain electrode and the source electrode of the transistor MNLS1 in the local-bit-line selection circuit LSLC2 is connected to the local bit line LBL002L, and the other is connected to the bit line BL002. Either one of the drain electrode and the source electrode of the transistor MNLS0 in the local-bit-line selection circuit LSLC3 is connected to the local bit line LBL003U, and the other is connected to the bit line BL003. Either one of the drain electrode and the source electrode of the transistor MNLS1 in the local-bit-line selection circuit LSLC3 is connected to the local bit line LBL003L, and the other is connected to the bit line BL003.

To the gate electrode of the transistor MNLS0 in the local-bit-line selection circuits LSLC0 to LSLC3 in the memory tile MT0, a common local-bit-line selection signal LS00 is connected. Also, to the gate electrode of the transistor MNLS1 in the local-bit-line selection circuits LSLC0 to LSLC3, a common local-bit-line selection signal LS01 is connected.

The local-bit-line driving circuit LDRV0 in the memory tile MT0 is a circuit selectively connecting the local bit line LBL000U to which the upper-layer memory cells MC00U, MC10U are connected and the local bit line LBL000L to which the lower-layer memory cells MC00L, MC10L are connected, to an array-voltage feeder line VAPL00. Also, the local-bit-line driving circuit LDRV1 is a circuit selectively connecting the local bit line LBL001U to which the upper-layer memory cells MC01U, MC11U are connected and the local bit line LBL001L to which the lower-layer memory cells MC01L, MC11L are connected, to the array-voltage feeder line VAPL00. Furthermore, the local-bit-line driving circuit LDRV2 is a circuit selectively connecting the local bit line LBL002U to which the upper-layer memory cells MC02U, MC12U are connected and the local bit line LBL002L to which the lower-layer memory cells MC02L, MC12L are connected, to the array-voltage feeder line VAPL00. Still further, the local-bit-line driving circuit LDRV3 is a circuit selectively connecting the local bit line LBL003U to which the upper-layer memory cells MC03U, MC13U are connected and the local bit line LBL003L to which the lower-layer memory cells MC03L, MC13L are connected, to the array-voltage feeder line VAPL00.

As with the local-bit-line driving circuit LDRV depicted in FIG. 26, each of these local-bit-line driving circuits LDRV0 to LDRV3 is configured of NMOS transistors MNLD0, MNLD1. Either one of the drain electrode and the source electrode of the transistor MNLD0 in the local-bit-line driving circuit LDRV0 in the memory tile MT0 is connected to the local bit line LBL000U, and the other is connected to an array-voltage feeder line VAPL00. Either one of the drain electrode and the source electrode of the transistor MNLD1 in the local-bit-line driving circuit LDRV0 is connected to the local bit line LBL000L, and the other is connected to the array-voltage feeder line VAPL00. Either one of the drain electrode and the source electrode of the transistor MNLD0 in the local-bit-line driving circuit LDRV1 is connected to the local bit line LBL001U, and the other is connected to the array-voltage feeder line VAPL00. Either one of the drain electrode and the source electrode of the transistor MNLD1 in the local-bit-line driving circuit LDRV1 is connected to the local bit line LBL001L, and the other is connected to the array-voltage feeder line VAPL00.

Similarly, either one of the drain electrode and the source electrode of the transistor MNLD0 in the local-bit-line driving circuit LDRV2 is connected to the local bit line LBL002U, and the other is connected to an array-voltage feeder line VAPL00. Either one of the drain electrode and the source electrode of the transistor MNLD1 in the local-bit-line driving circuit LDRV2 is connected to the local bit line LBL002L, and the other is connected to the array-voltage feeder line VAPL00. Either one of the drain electrode and the source electrode of the transistor MNLD0 in the local-bit-line driving circuit LDRV3 is connected to the local bit line LBL003U, and the other is connected to the array-voltage feeder line VAPL00. Either one of the drain electrode and the source electrode of the transistor MNLD1 in the local-bit-line driving circuit LDRV3 is connected to the local bit line LBL003L, and the other is connected to the array-voltage feeder line VAPL00.

To the gate electrode of the transistor MNLD0 in the local-bit-line driving circuits LDRV0 to LDRV3 in the memory tile MT0, a common local-bit-line driving signal LS00B is connected. To the gate electrode of the transistor MNLD1 in the local-bit-line driving circuits LDRV0 to LDRV3, a common local-bit-line driving signal LS01B is connected. These local-bit-line driving signals LS00B, LS01B are inverse signals of the local-bit-line selection signals LS00, LS01. In the structure as described above, the local-bit-line selection circuits LSLC0 to LSLC3 and the local-bit-line driving circuits LDRV0 to LDRV3 achieve a layer selecting function.

As with the bit-line selection circuit BSLC depicted in FIG. 3, each of the bit-line selection circuits BSLC0, BSLC1 in the memory tile MT0 is configured of NMOS transistors MNYS0, MNYS1. In the bit-line selection circuit BSLC0, either one of the drain electrode and the source electrode of the transistor MNYS0 is connected to the bit line BL000, and the other is connected to the global bit line GBL00. Also, to the gate electrode of the transistor MNYS0, a bit-line selection signal BLS00 is connected. Either one of the drain electrode and the source electrode of the transistor MNYS1 is connected to the bit line BL001, and the other is connected to the global bit line GBL00. Also, to the gate electrode of the transistor MNYS1, a bit-line selection signal BLS01 is connected.

Similarly, in the bit-line selection circuit BSLC1, either one of the drain electrode and the source electrode of the transistor MNYS0 is connected to the bit line BL002, and the other is connected to the global bit line GBL01. Also, to the gate electrode of the transistor MNYS0, a bit-line selection signal BLS00 is connected. Either one of the drain electrode and the source electrode of the transistor MNYS1 is connected to the bit line BL003, and the other is connected to the global bit line GBL01. Also, to the gate electrode of the transistor MNYS1, a bit-line selection signal BLS01 is connected.

The above-described local-bit-line selection signals LS00 to LS03 are controlled as shown in a truth table depicted in FIG. 27. However, when the truth table of FIG. 27 is applied to the memory cell array of FIG. 25, either one of a local bit line with an even-numbered ordinal number and a local bit line with an odd-numbered ordinal number is selected. However, when it is applied to the memory cell array of FIG. 36, an upper-layer local bit line is selected when the address Y0 indicates a logical value of "0", and a lower-layer local bit line is selected when the address Y0 indicates a logical value of "1". Also, the bit-line selection signals BLS00 to BLS03 are controlled as shown in a truth table depicted in FIG. 28.

Furthermore, a relation between the read start signal RE, the rewrite start signal WE, and the Y address signal Y1 to be inputted to the read/write control circuit RWUC and the global-bit-line driving signal group DEBS, the read start signal group REBS, and the rewrite start signal group WEBS is identical to that in the truth table depicted in FIG. 17.

(Operation of Memory Cell Array)

Figure 38:
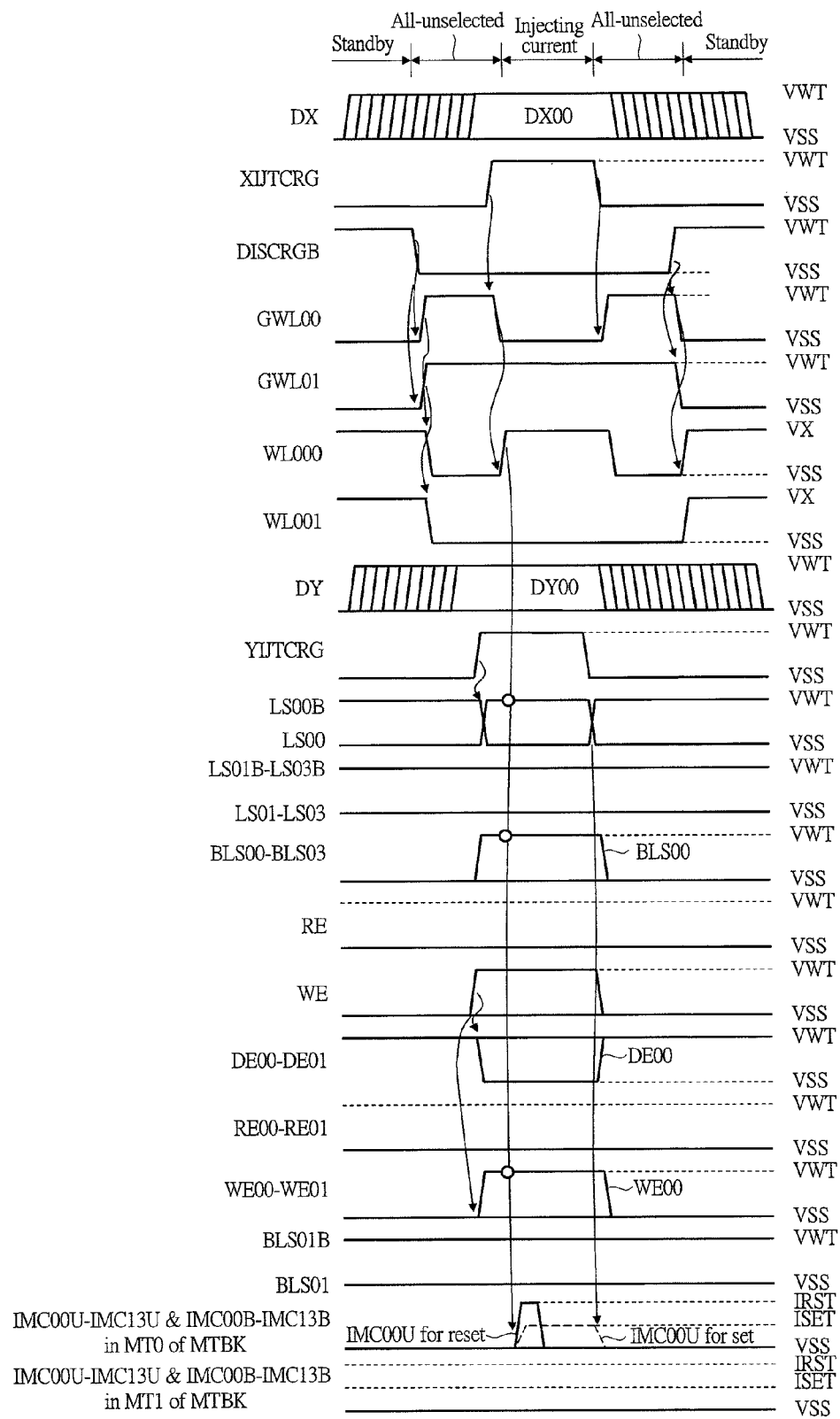
FIG. 38 is a timing chart depicting an example of operation of a rewrite operation in the memory cell array of the phase-change memory depicted in FIG. 36.

The operation of the above-structured memory cell array is described according to FIG. 38 to FIG. 44. FIG. 38 depicts control signals relating to the memory cell MC00U, assuming the case of performing a rewrite operation in the memory cell MC00U in the memory tile MT0 in the memory tile group MTBK00 depicted in FIG. 36. In the following, for simplification, attention is focused on the memory tile group MTBK00, and the operation, mainly differences from FIG. 29, is described.

Figure 39:
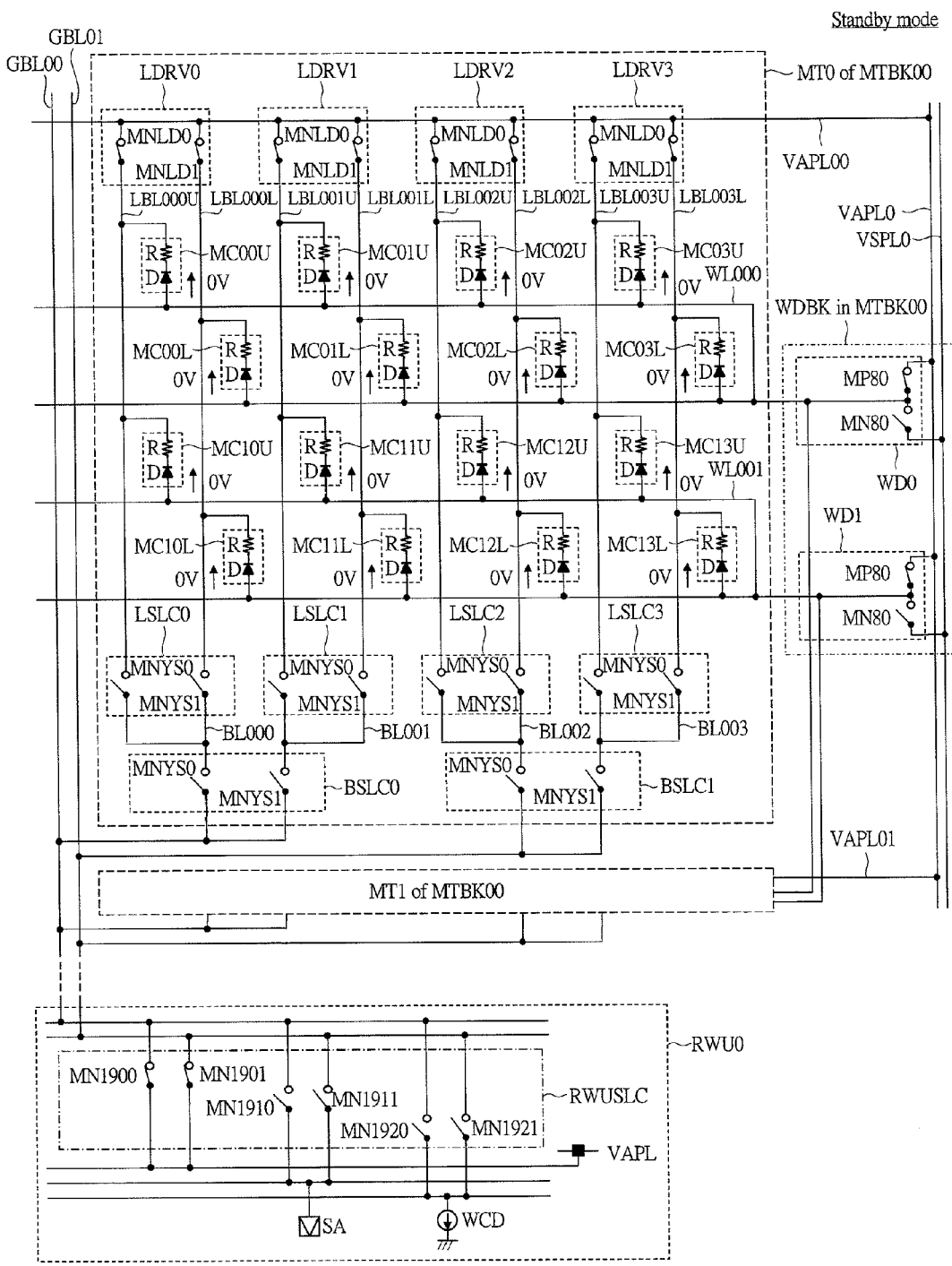
FIG. 39 is a diagram depicting an example of a conduction state in a standby state in the memory cell array of the phase-change memory depicted in FIG. 36 (part 1)
Figure 40:
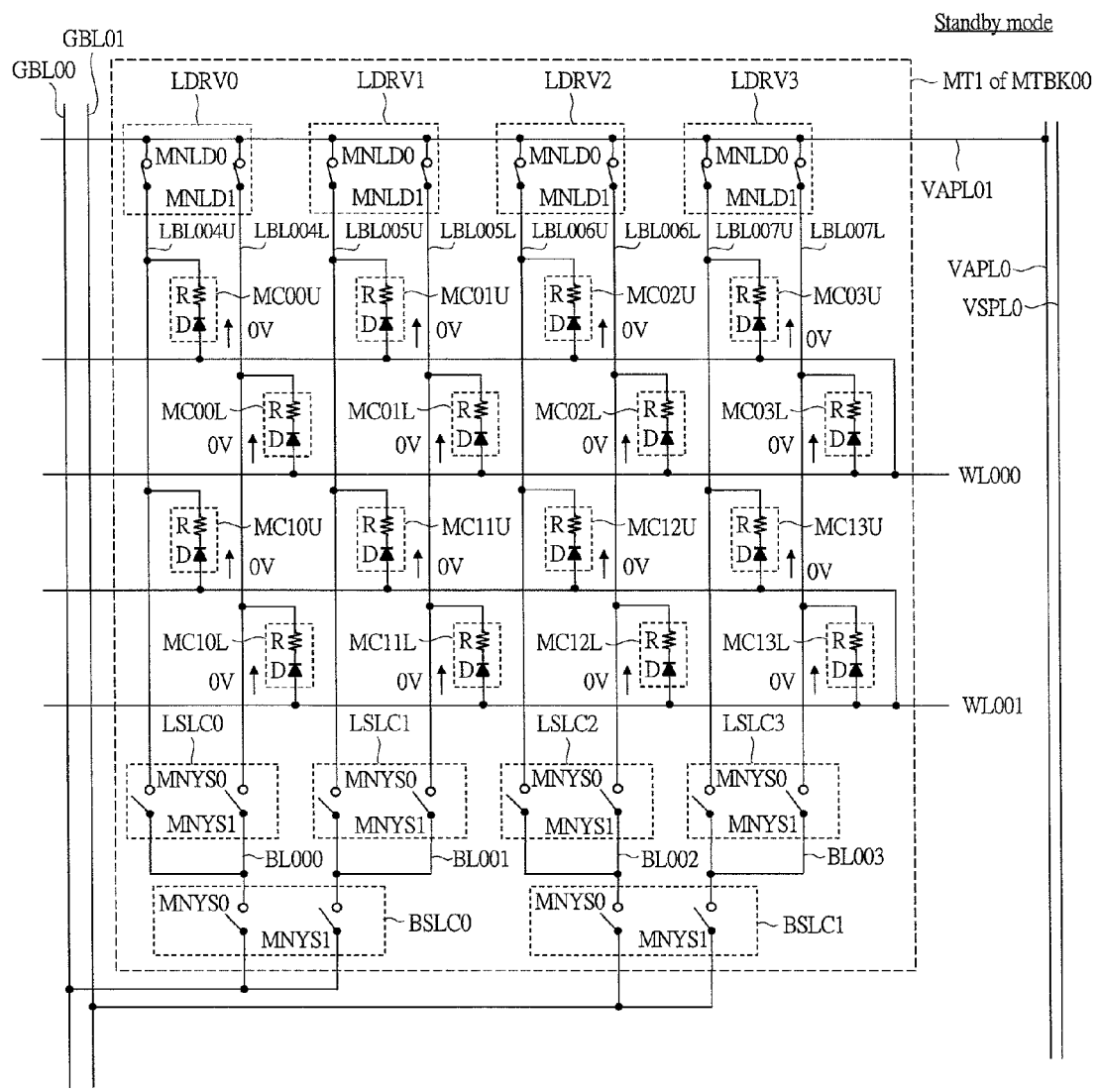
FIG. 40 is a diagram depicting an example of a conduction state in a standby state in the memory cell array of the phase-change memory depicted in FIG. 36 (part 2)

First, in a standby state, since a discharge signal DISCRGB is held at the rewrite voltage VWT, the global word lines GWL00B, GWL01B are driven to the ground voltage VSS, and the word lines WL000, WL001 are driven to the rewrite voltage VWT. Also, with the local-bit-line selection signals LS00 to LS03 being driven to the ground voltage VSS and the local-bit-line driving signals LS00B to LS03B being driven to the rewrite voltage VWT, the local bit lines LBL000U to LBL007U, LBL000L to LBL007L are driven to a voltage near the rewrite voltage VWT. Note that the bit-line selection signals BLS00 to BLS03 are held at the ground voltage VSS. Thus, as depicted in FIG. 39 and FIG. 40, a voltage to be applied to the memory cells MC00U to MC13U, MC00L to MC13L in the memory tiles MT0, MT1 in the memory tile group MTBK00 is approximately 0V. At this time, the current hardly flows through the memory cells.

Figure 41:
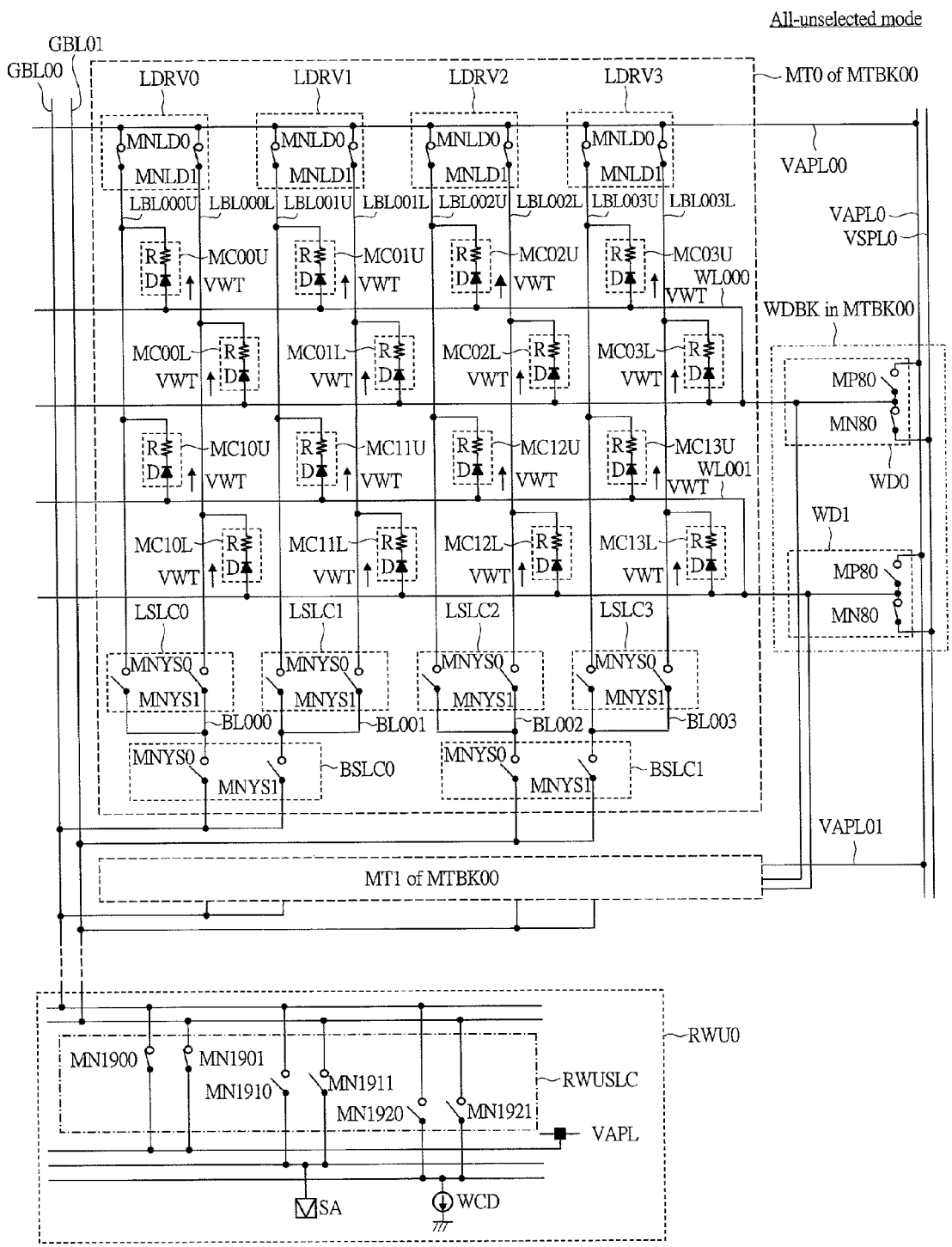
FIG. 41 is a diagram depicting an example of a conduction state in an all-bit unselected state in the memory cell array of the phase-change memory depicted in FIG. 36 (part 1)
Figure 42:
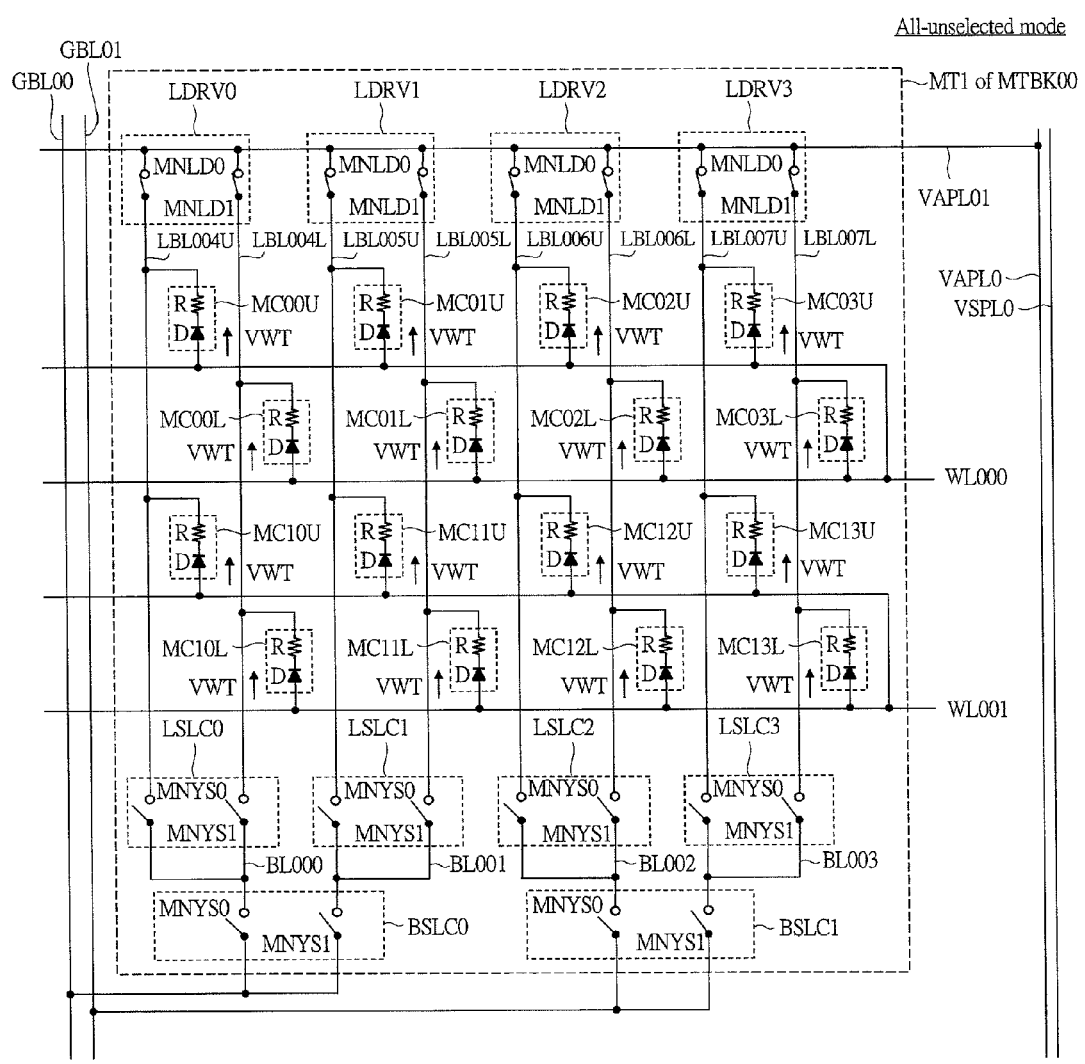
FIG. 42 is a diagram depicting an example of a conduction state in an all-bit unselected state in the memory cell array of the phase-change memory depicted in FIG. 36 (part 2)

Referring back to FIG. 38, next, a rewrite operation is started. First, as depicted in FIG. 41 and FIG. 42, with the discharge signal DISCRGB at the rewrite voltage VWT being driven to the ground voltage VSS, all of the memory cells MC00U to MC13U, MC00L to MC13L in the memory tiles MT0, MT1 in the memory tile group MTBK00 become once in an unselected state. Next, referring back to FIG. 38 again, when address signal decoding is completed, the rewrite voltage VWT is supplied to the word line WL000 being at the ground voltage VSS. Also, the local-bit-line selection signal LS00 and the bit-line selection signal BLS00 at the ground voltage VSS are driven to the rewrite voltage VWT, and the local-bit-line driving signal LS00B at the rewrite voltage VWT is driven to the ground voltage VSS.

Figure 43:
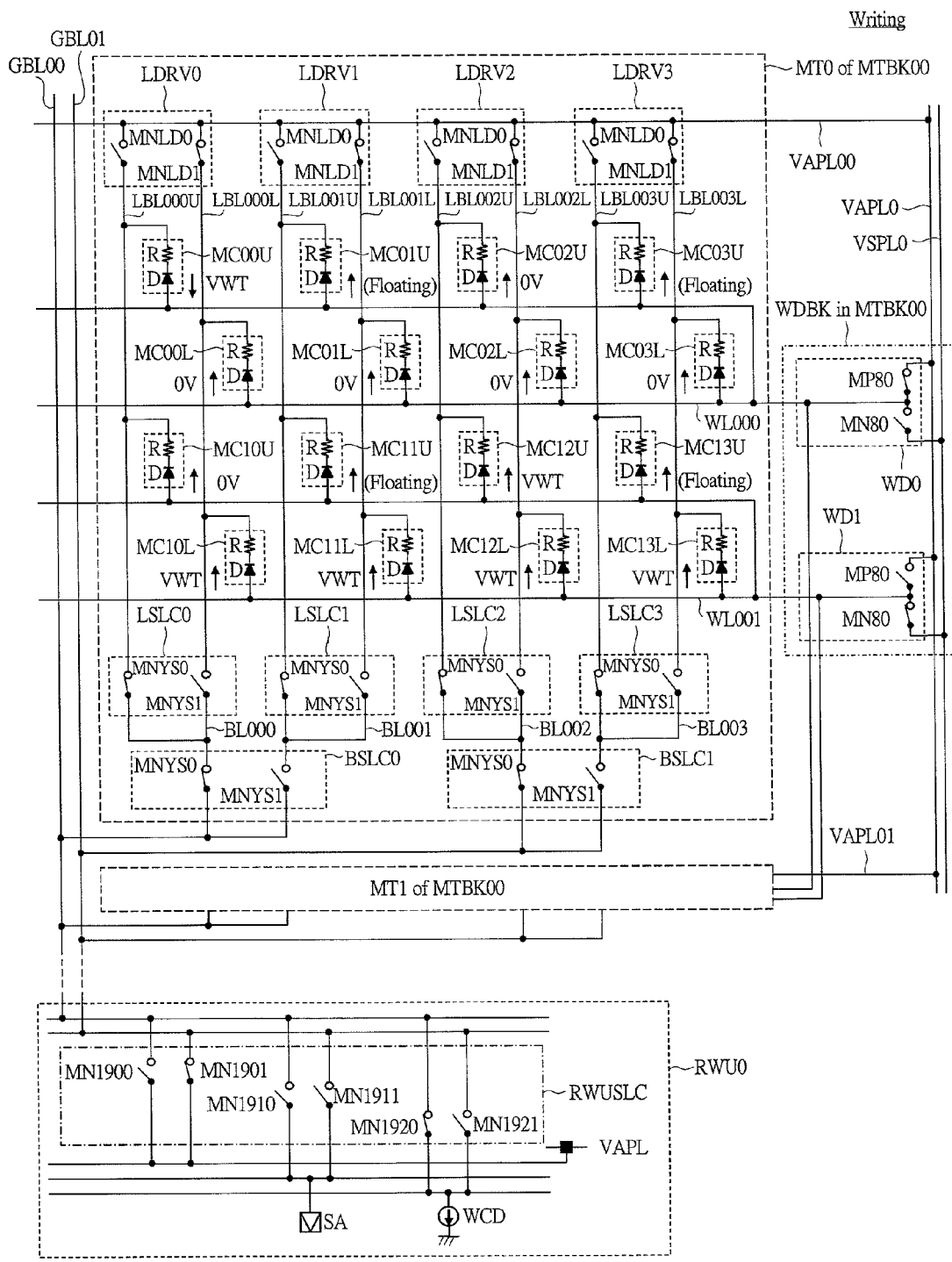
FIG. 43 is a diagram depicting an example of a conduction state in a rewrite state in the memory cell array of the phase-change memory depicted in FIG. 36 (part 1)
Figure 44:
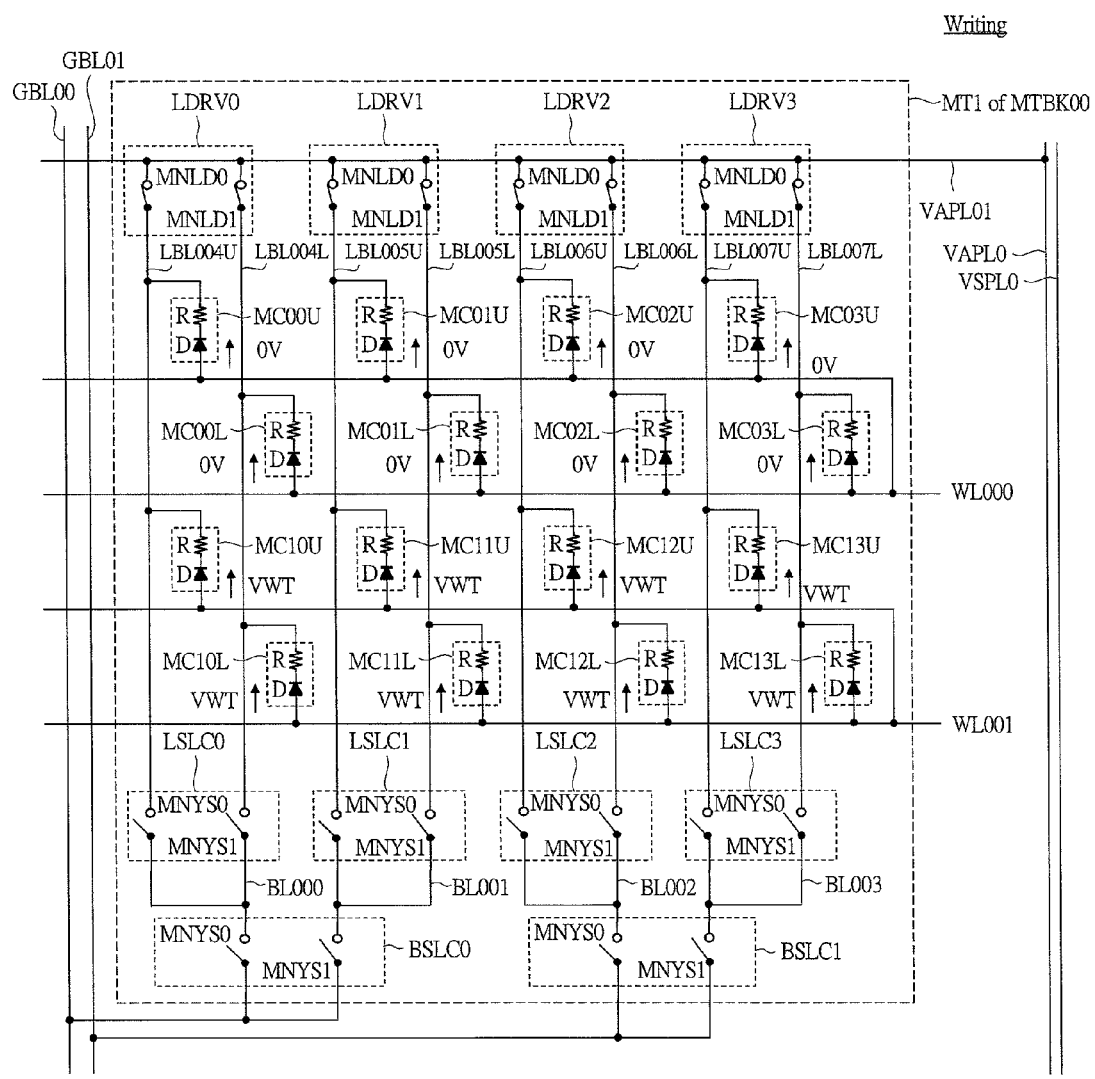
FIG. 44 is a diagram depicting an example of a conduction state in a rewrite state in the memory cell array of the phase-change memory depicted in FIG. 36 (part 2)

FIG. 43 and FIG. 44 depict a conduction state of the memory tiles MT0, MT1 in the memory tile group MTBK00 in this state. To the word line WL000, the rewrite voltage VWT is supplied via the PMOS transistor MP80 in the word-line driving circuit WD0. Also, with the NMOS transistors MNLD0 in the local-bit-line driving circuits LDRV0 to LDRV3 in the memory tile MT0 each becoming in a cutoff state, a connection between the local bit lines LBL000U to LBL003U and the array-voltage feeder line VAPL00 is cut off.

Here, with the NMOS transistor MNLS0 of the local-bit-line selection circuit LSLC0 and the NMOS transistor MNYS0 of the bit-line selection circuit BSLC0 each becoming in a conduction state, the bit line BL000 is connected to the global bit line GBL00. Similarly, with the NMOS transistor MNLS0 of the local-bit-line driving circuit LSLC2 and the NMOS transistor MNYS0 of the bit-line driving circuit BSLC1 each becoming in a conduction state, the bit line BL002 is connected to the global bit line GBL01. Among these, the bit line BL000 (the local bit line LBL000U) is driven from the NMOS transistor MN1920 via the rewrite-current driving circuit WCD to a voltage near the ground voltage VSS. Thus, a voltage approximately equal to the rewrite voltage VWT is applied to the memory cell MC00U in the memory tile MT0. On the other hand, the bit line BL002 (the local bit line LBL002U) is driven from the NMOS transistor MN1901 via the array-voltage feeder line VAPL to a voltage near the rewrite voltage VWT. Thus, a voltage approximately equal to 0 V is applied to the memory cell MC02U in the memory tile MT0, and the memory cell MC02U becomes in an unselected state. Also, in accordance with this driving of the local bit line LBL002U to the rewrite voltage VWT, the memory cell MC12U in the memory tile MT0 connected to the unselected word line WL001 is applied with a negative rewrite voltage (−VWT), and becomes in an unselected state.

Furthermore, in accordance with the conduction of the transistor MNLS0 in the local-bit-line selection circuit LSLC0 described above, the transistor MNLS0 in the local-bit-line selection circuit LSLC1 also becomes in a conduction state. However, the transistor MNYS1 of the bit-line selection circuit BSLC0 is kept in a cutoff state, and therefore the local-bit-line LBL001U becomes in a floating state. Thus, a voltage to be applied to the memory cells MC01U, MC11U has a value so that a current flowing through the diode D in the memory cell MC01U becoming in a forward bias state due to selection of a word line and a current flowing through the diode D in the memory cell MC11U becoming in a reverse bias state due to non-selection of a word line are equal to each other. At this time, the currents flowing through both of the memory cells are limited with a diode current in the memory cell MC11U in a reverse bias state. This current is negligible because of having a value to the extent of retaining stored information.

Similarly, the transistor MNLS0 in the local-bit-line selection circuit LSLC3 also becomes in a conduction state. However, the transistor MNYS1 of the bit-line selection circuit BSLC1 is held in a cutoff state, and therefore the local-bit-line LBL003U becomes in a floating state. Thus, a voltage to be applied to the memory cells MC03U, MC13U has a value so that a current flowing through the diode D in the memory cell MC03U becoming in a forward bias state and a current flowing through the diode D in the memory cell MC13U becoming in a reverse bias state are equal to each other. At this time, the currents flowing through both of the memory cells are limited with a diode current in the memory cell MC13U in a reverse bias state. This current is also negligible because of having a value to the extent of retaining stored information. Note that, as depicted in FIG. 44, the state inside the memory tile MT1 is kept in the same state as that of the memory cell on the local bit lines LBL001L, LBL003L in the memory tile MT0 depicted in FIG. 43.

Referring back to FIG. 38 again, when application of the rewrite current ends, a current applying signal XIJTCRG at the rewrite voltage VWT is driven to the ground voltage VSS, and a current applying signal YIJTCRG at the rewrite voltage VWT is driven to the ground voltage VSS. Thus, as depicted in FIG. 41 and FIG. 42, all of the memory cells again become in an unselected state. Furthermore, with the discharge signal DISCRGB at the ground voltage VSS being driven to the rewrite voltage VWT, the state returns to be the standby state depicted in FIG. 39 and FIG. 40.

In the foregoing, for simplification, the operation has been described by focusing attention on the inside of the memory tile group MTBK00. It can be easily understood, however, that a similar operation is performed even in the memory tile group MTBK01 that is controlled together with the memory tile group MTBK00 by the global word lines GWL00B to GWL03B, the bit-line selection signals BLS00 to BLS03, the local-bit-line selection signals LS00 to LS03, and the local-bit-line driving signals LS00B to LS03B.

Also, while a rewrite operation has been described so far, a selecting operation is performed also in a read operation with a similar procedure. In the case of a read operation, the voltages of the array-voltage feeder lines VAPL0, VAPL00 depicted in FIG. 39 to FIG. 44 are switched to the read voltage VRD by using the array-voltage selection circuit VSLC0 similar to that depicted in FIG. 1, and a voltage to be supplied to the selected word line WL000 is taken as the read voltage VRD. Also, in FIG. 43, in place of the rewrite-current driving circuit WCD, the sense amplifier SA is connected to the global bit line GBL00. Furthermore, by appropriately adjusting the driving time of the control signals depicted in FIG. 38, a current detecting operation according to the stored information, that is, the value of the variable resistance in the memory cell, can be performed.

Effects of Embodiment

Finally, effects that can be obtained from the structure and operation that have been described so far are summarized. With the use of the semiconductor device of the fourth embodiment, in addition to the various effects described in the third embodiment, the following effects can be further obtained. That is, in a large-sized memory tile when memory cells are laminated, by distributing the selecting function of the local bit lines into the read/write selection circuit RWUSLC in the read/write circuit, in addition to the local-bit-line driving circuit LDRV, the local-bit-line selection circuit LSLC, and the bit-line selection circuit BSLC in the memory tile, the number of various control signals for controlling a local bit line in the memory tile (here, the local-bit-line driving signals, the local-bit-line selection signals, and the bit-line selection signals) can be suppressed.

More specifically, when one memory tile group MTBK in FIG. 36 is regarded as a memory cell array having a structure of (two rows×eight columns)×two layers, to select one from sixteen local bit lines, sixteen selection signals are normally required in order to individually control sixteen transistors (that is, a total of sixteen NMOS transistors included in the local-bit-line selection circuits LSLC0 to LSLC3 in the memory tiles MT0, MT1). Note herein that, for simplification of description, a driving signal for the bit-line driving circuit BDRV is not taken into consideration.

However, in the present embodiment, for example, four transistors share a local-bit-line selection signal so that the transistor MNLS0 in the local-bit-line selection circuits LSLC0 to LSLC3 share the local-bit-line selection signal LS00, and once select four local bit lines (here, the local bit lines LBL000U to LBL003U) from sixteen lines by the four local-bit-line selection signals (LS00 to LS03). Next, from these selected four local bit lines (that is, corresponding to the bit lines BL000 to BL003), one is selected not by using four selection signals, but two are selected by using two bit-line selection signals (BLS00, BLS01) via the bit-line selection circuits BSLC0, BSLC1. These two selected bit lines are connected to two local bit lines (GBL00, GBL01), and one of these two local bit lines is selected by the read/write selection circuit RWUSLC in the read/write circuit. As a result, as depicted in FIG. 36, eight selection signals (the local-bit-line selection signals LS00 to LS03, the bit-line selection signals BLS00 to BLS03) are enough to be provided in one memory tile group. As for one memory tile MT, four selection signal wirings are enough to be provided.

As such, with the number of wirings for each memory tile MT being reduced, density of the disposed transistor is improved. Furthermore, by causing the read/write selection circuit RWUSLC to bear part of the selection function, in addition to the reduction in the number of wirings described above, an increase in the number of transistors associated with bit-line selection in each memory tile MT is also suppressed, and therefore the areas of the local-bit-line selection circuit LSLC (similarly, the local-bit-line driving circuit LDRV) and the bit-line selection circuit BSLC can be reduced. With these, an increase in integration can be achieved.

Note that while the structure has been described so far in which two adjacent memory tiles in a global-bit-line direction share one word-line driving circuit, how to share is not particularly restricted. For example, the word-line driving circuit can be shared by four memory tiles. In this case, the area of the word-line driving circuit as a whole chip can further be reduced to one quarter. Also, for simplification of description, while the memory tile structure having memory cells of (two rows×four columns)×two layers has been described, the number of lamination of memory cells is not particularly restricted. For example, even when the memory tile structure is doubled to (two rows×four columns)×four layers, a similar selecting operation can be performed by extending the local-bit-line selection circuits (the local-bit-line driving circuits) and the bit-line selection circuits.

Fifth Embodiment

Figure 45:
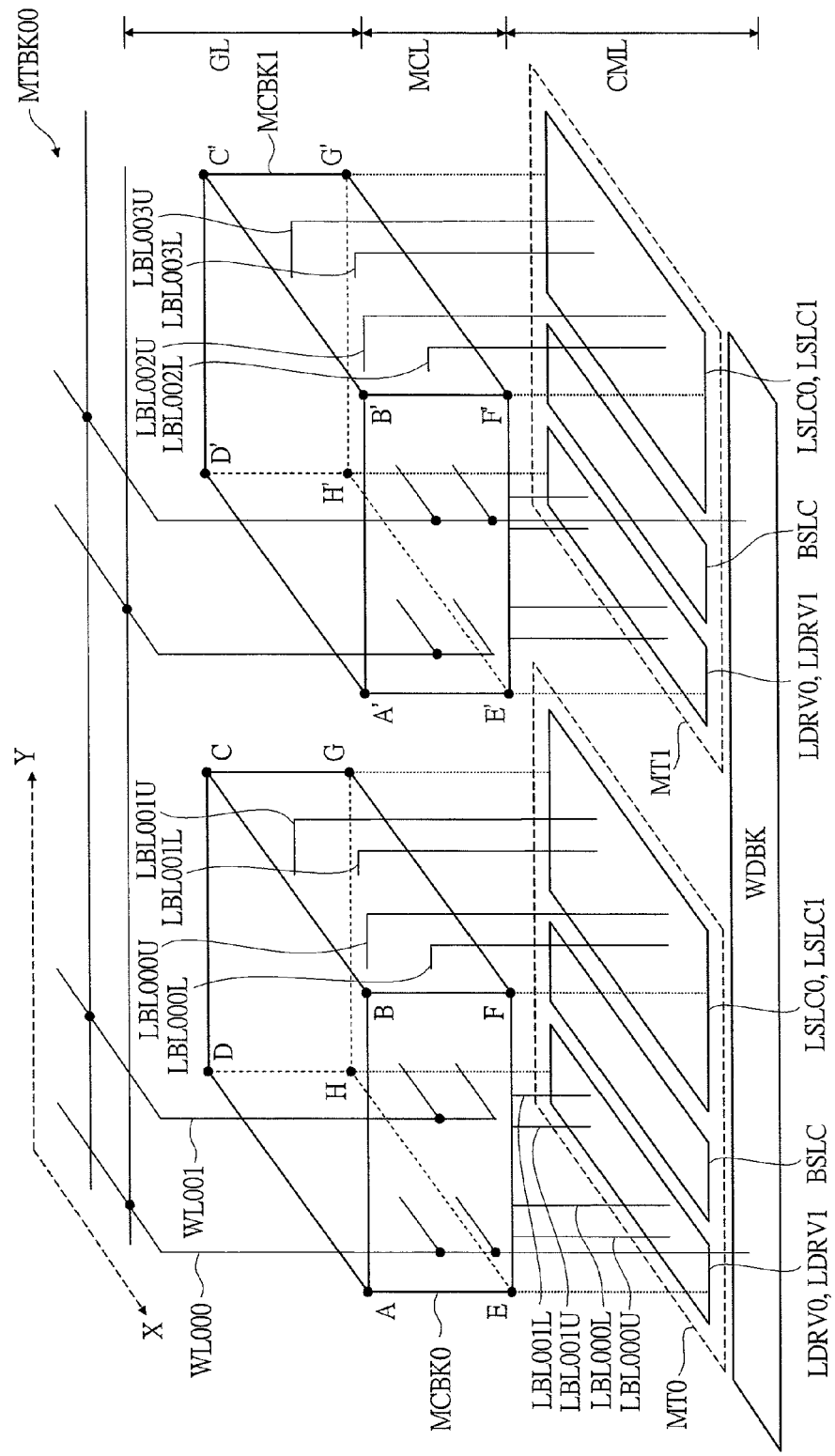
FIG. 45 is a conceptual diagram schematically depicting an example of structure of a memory cell array in a semiconductor device according to a fifth embodiment of the present invention.

In a fifth embodiment, an example of structure of the memory cell array depicted in FIG. 25 is described. FIG. 45 is a conceptual diagram schematically depicting an example of structure of the memory cell array in the semiconductor device according to the fifth embodiment of the present invention. Here, the memory tile group MTBK00 in the memory cell array depicted in FIG. 25 is taken as an example for description. A feature of this memory cell array structure is a laminated structure of a CMOS integrated circuit layer CML, a memory cell layer MCL, and a global wiring layer GL.

The CMOS integrated circuit layer CML is configured of local-bit-line selection circuits LSLC0, LSLC1 formed on a silicon substrate by using a CMOS integrated circuit technology, local-bit-line driving circuits LDRV0, LDRV1, a bit-line selection circuit BSLC, and a word-line driving circuit group WDBK. On the memory cell layer MCL, memory cells each having a diode as shown in FIG. 26 and a variable resistance element using a phase-change material are laminated.

In FIG. 45, in a memory cell group MCBK0 surrounded by a point A to a point H, memory cells MC00U to MC11U, MC00L to MC11L in the memory tile MT0 are formed. Also, in a memory cell group MCBK1 surrounded by a point A' to a point H', memory cells MC00U to MC11U, MC00L to MC11L in the memory tile MT1 are formed. By forming these memory cell groups MCBK0, MCBK1 so as to cover the local-bit-line selection circuits LSLC0, LSLC1, the local-bit-line driving circuits LDRV0, LDRV1, the bit-line selection circuit BSLC, and the word-line driving circuit WDBK formed in the CMOS integrated circuit layer CML, density of the memory cells per unit area can be improved. In the drawing, an example is depicted in which the memory cell groups MCBK0, MCBK1 are formed so as to cover the local-bit-line selection circuits LSLC0, LSLC1, the local-bit-line driving circuit LDRV0, LDRV1, and the bit-line selection circuit BSLC formed in the CMOS integrated circuit layer CML, in consideration of the connection of word lines and a ratio of each circuit block area.

The local-bit-line selection circuits LSLC0, LSLC1, the local-bit-line driving circuit LDRV0, LDRV1, the bit-line selection circuit BSLC, and the word-line driving circuit group WDBK formed in the CMOS integrated circuit layer CML and the memory cell group MCBK0 formed in the memory cell layer MCL are connected by, for example, as in the memory tile MT0, local bit lines LBL000U, LBL001U, LBL000L, LBL001L, and the word lines WL000, WL001. These wirings are formed of a metal wiring in each layer and so-called vias for connecting multilayer wirings. In the global wiring layer GL, wirings of control signals and power supplies are formed. In the drawing, for simplification of description, an example of a connection mode (wiring topology) of the word lines WL000, WL001 across two memory tiles MT0, MT1 in the memory tile group is depicted. That is, the word lines WL000, WL001 in the memory tiles MT0, MT1 include metal wirings formed in parallel to the local bit lines LBL000U and LBL000L in the global wiring layer GL.

Figure 46:
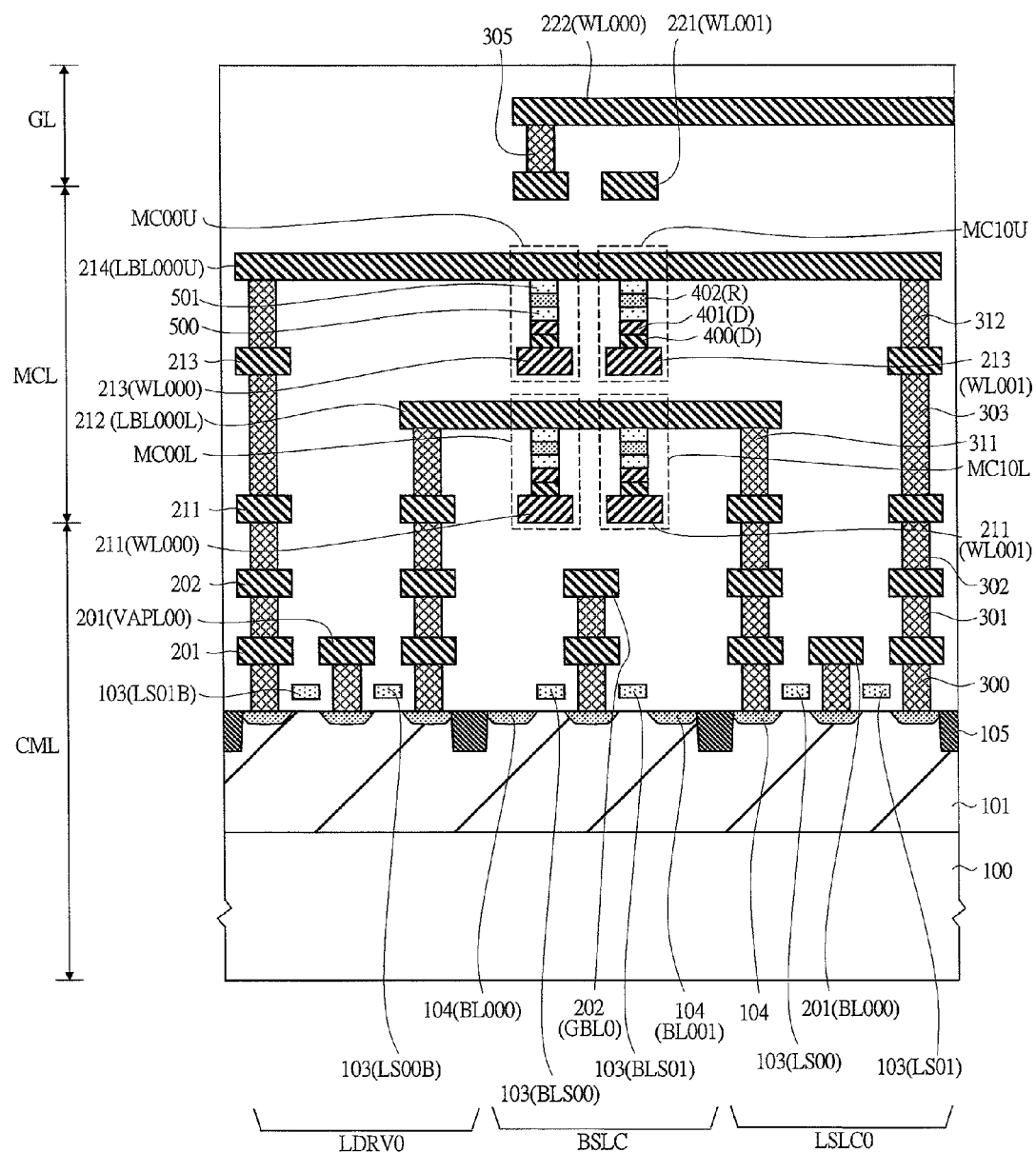
FIG. 46 is a diagram depicting an example of a sectional structure of memory tiles in the memory cell array of the phase-change memory depicted in FIG. 45 (part 1)

FIG. 46 depicts an example of a sectional structure along the local bit lines LBL000U and LBL000L (that is, in a Y direction) in the memory cell array depicted in FIG. 45. The local-bit-line selection circuit LSLC0, the local-bit-line driving circuit LDRV0, and the bit-line selection circuit BSLC are each formed in a P-well region 101 formed on a P-type silicon substrate 100. 103 denotes a polysilicon layer serving as a gate electrode of an NMOS transistor. Each symbol in parentheses indicates a control signal to be inputted to the local-bit-line selection circuit LSLC0, the local-bit-line driving circuit LDRV0, and the bit-line selection circuit BSLC (similarly, each symbol in parentheses attached to a device number, which will be described below indicates an input/output signal of each circuit block). 104 denotes an N+ diffusion layer region serving as the source electrode or the drain electrode of an NMOS transistor. 105 denotes an oxide for device isolation for blocking energization between transistors.

201 and 202 denote first and second tungsten layers, respectively, formed in the CMOS integrated circuit layer CML. These tungsten layers are used for connection of each circuit block formed in the CMOS integrated circuit layer CML. Also, 211 to 214 denote third to sixth tungsten layers, respectively, formed in the memory cell layer MCL. The third tungsten layer denoted by 211 is used for a word line (for example, WL000) in a lower-layer memory cell (for example, the memory cell MC00L). The fourth tungsten layer denoted by 212 is used for a local bit line (for example, LBL000L) in a lower-layer memory cell (for example, the memory cell MC00L). The fifth tungsten layer denoted by 213 is used for a word line (for example, WL000) in an upper-layer memory cell (for example, the memory cell MC00U). The sixth tungsten layer denoted by 214 is used for a local bit line (for example, LBL000U) in an upper-layer memory cell (for example, memory cell MC00UL). Furthermore, 221 and 222 denote seventh and eighth tungsten layers, respectively, formed on the global wiring layer GL. These tungsten layers are used, for example, for connection of word lines (here, the word line WL000) formed in memory tiles in the same memory tile group.

300 denotes a contact for connecting the first tungsten layer and the N+ diffusion layer. 301 denotes a first via for connecting the second tungsten layer and the first tungsten layer. 302 denotes a second via for connecting the third tungsten layer and the second tungsten layer. 303 denotes a third via for connecting the fifth tungsten layer and the third tungsten layer. 305 denotes a fifth via for connecting the eighth tungsten layer and the seventh tungsten layer. 311 denotes a sixth via for connecting the fourth tungsten layer and the third tungsten layer. 312 denotes a seventh via for connecting the sixth tungsten layer and the fifth tungsten layer. Note that, although not shown in the drawing, a fourth via for connecting the seventh tungsten layer and the fifth tungsten layer is used in another region.

The memory cell, for example, as the memory cell MC10U, is formed in a columnar shape between a tungsten layer (here, 213) serving as the word line WL001 and a tungsten layer (here, 214) serving as the local bit line LBL000U. 400 denotes a P layer of a PN diode, 401 denotes an N layer of the PN diode, and 402 denotes a chalcogenide material layer. Also, 500 denotes a ninth tungsten layer serving as a buffer layer between the PN diode and the chalcogenide material layer, 501 denotes a tenth tungsten layer serving as a buffer layer between the chalcogenide material layer and the local bit line.

Figure 47:
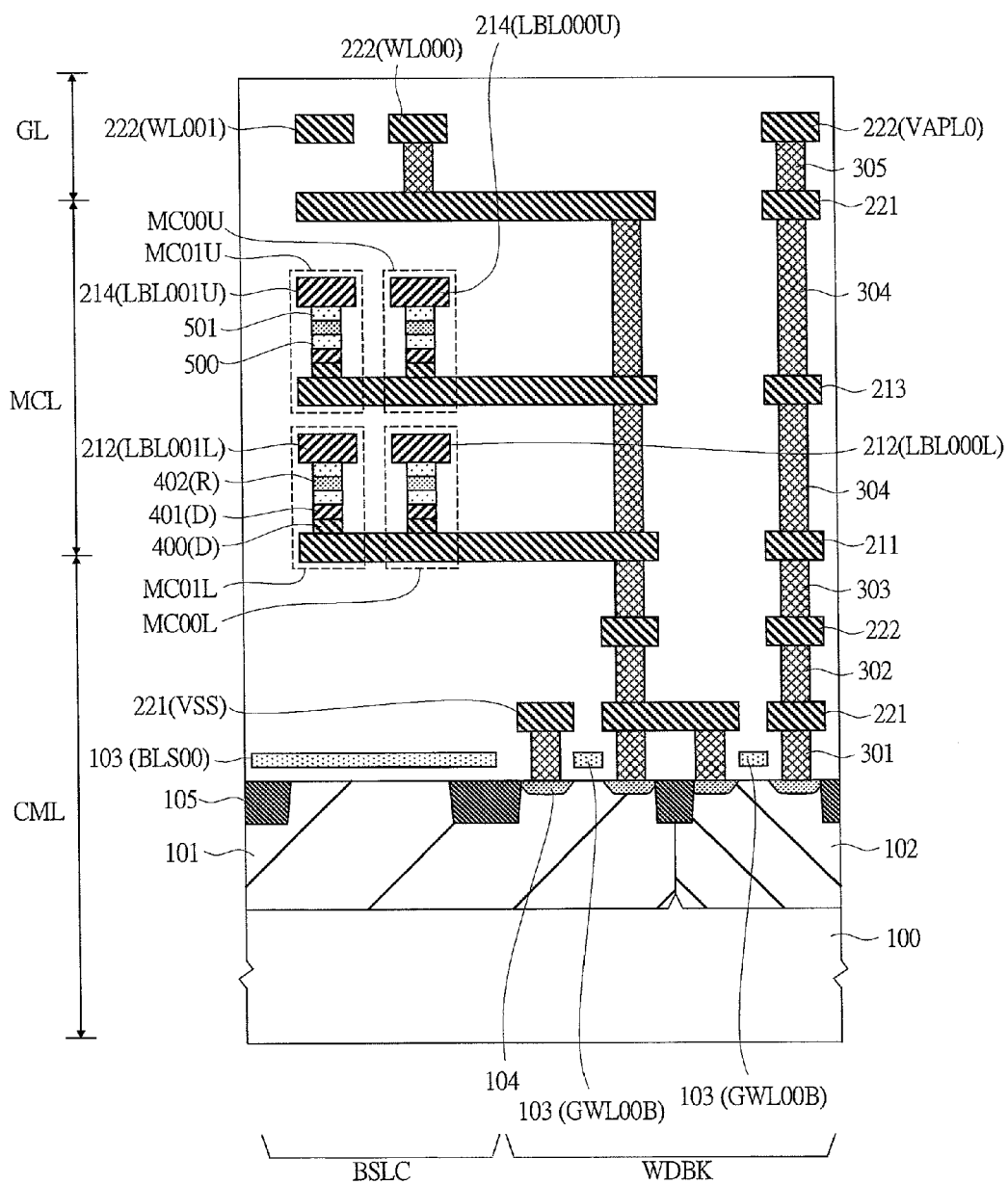
FIG. 47 is a diagram depicting an example of a sectional structure of the memory tiles in the memory cell array of the phase-change memory depicted in FIG. 45 (part 2)

FIG. 47 depicts an example of a sectional structure along the word line WL000 (that is, an X direction) in the memory cell array depicted in FIG. 45. In this direction, an N-well region (102) on which the PMOS transistor of the word-line driving circuit group WDBK is formed is included. The source electrode of the PMOS transistor is connected to an array-voltage feeder line VAPL0 formed of the eighth tungsten layer of the global wiring layer GL via the fourth via (304) for connecting the seventh tungsten layer and the fifth tungsten layer.

With the structure as described above, the memory cell array according to the fifth embodiment can improve the degree of integration of the memory cells. That is, by forming the memory cells in an upper portion of the CMOS integrated circuit layer, an occupied area required for memory cell formation can be significantly reduced. Also, by connecting word lines across a plurality of memory tiles in the global wiring layer above the memory tiles, the word lines can be connected to each other while an increase in area is being suppressed. Furthermore, by forming a memory cell group above the local-bit-line selection circuits LSLC0, SLSC1, the local-bit-line driving circuit LDRV0, LDRV1, and the bit-line selection circuit BSLC, a region above the word-line driving circuit group WDBK can be made open. With this, the word-line driving circuit group WDBK and the array-voltage feeder line formed in the global wiring layer GL can be connected to each other while an increase in area being suppressed. Here, as described in the fourth embodiment and others, when the number of wirings of selection signals relating to bit lines (the local-bit-line selection signals, the local-bit-line driving signals, the bit-line selection signals) is reduced, as can been seen from FIG. 46 and others, the areas of the local-bit-line driving circuit LDRV, the bit-line selection circuit BSLC, and the local-bit-line selection circuit LSLC can be reduced, and an increase in integration can be made.

Note that, in the description so far, each of the CMOS integrated circuit layer CML and the global wiring layer GL has two tungsten layers formed therein. However, the number of wiring layers is not restricted. An increase in the number of wiring layers facilitates wiring inside and outside each circuit block. Conversely, a decrease in the number of wiring layers can reduce manufacturing cost. Also, the material of wirings formed in the global wiring layer GL is not restricted to tungsten, and various materials can be introduced. For example, by adding a copper wiring layer for the array-voltage feeder line VAPL00, resistance of the array-voltage feeder line VAPL00 can be reduced. Thus, a voltage drop in wiring can be suppressed, and a low-voltage operation can be achieved.

Sixth Embodiment

Figure 48:
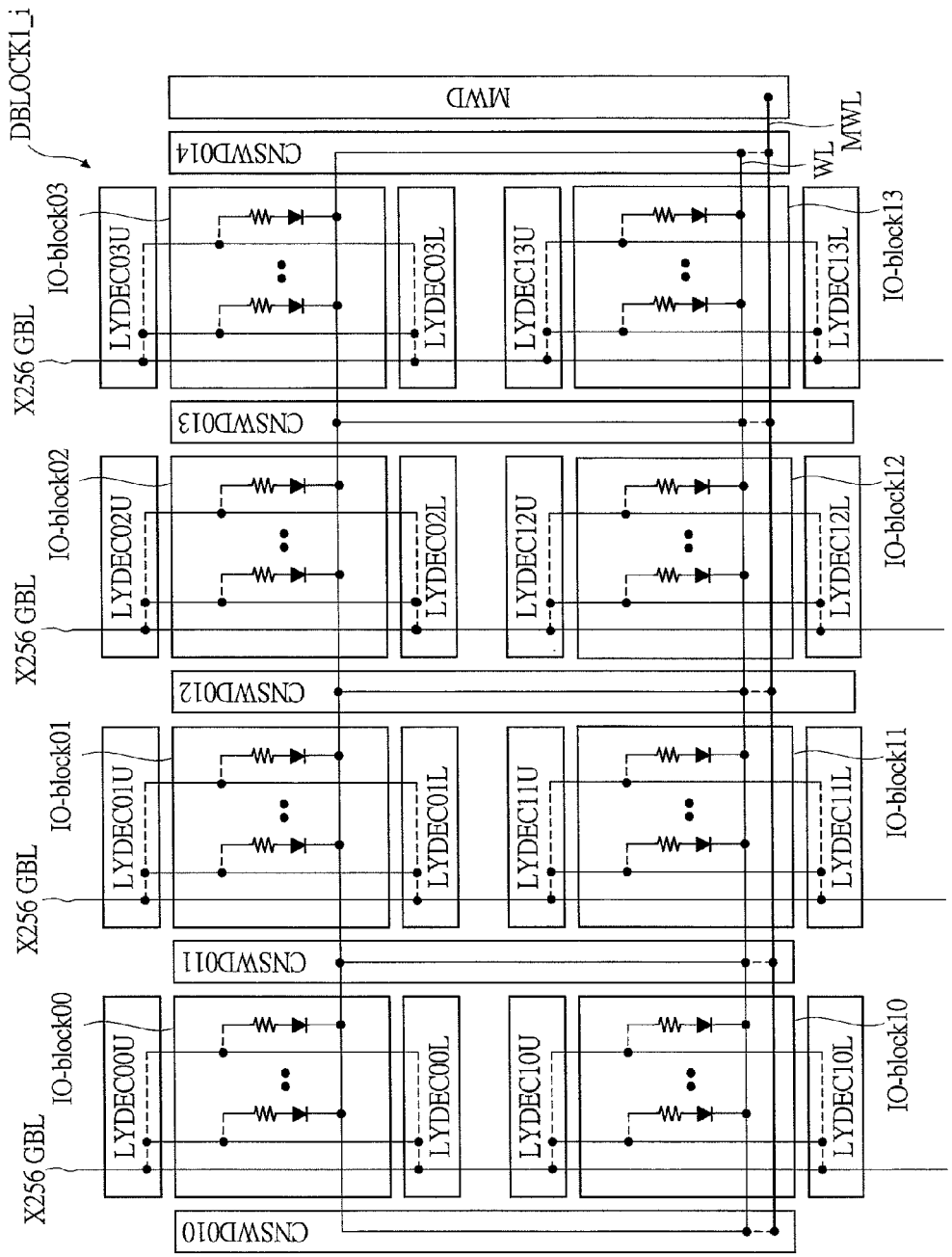
FIG. 48 is a schematic diagram depicting an example of structure of a circuit block in a semiconductor device according to a sixth embodiment of the present invention.
Figure 52:
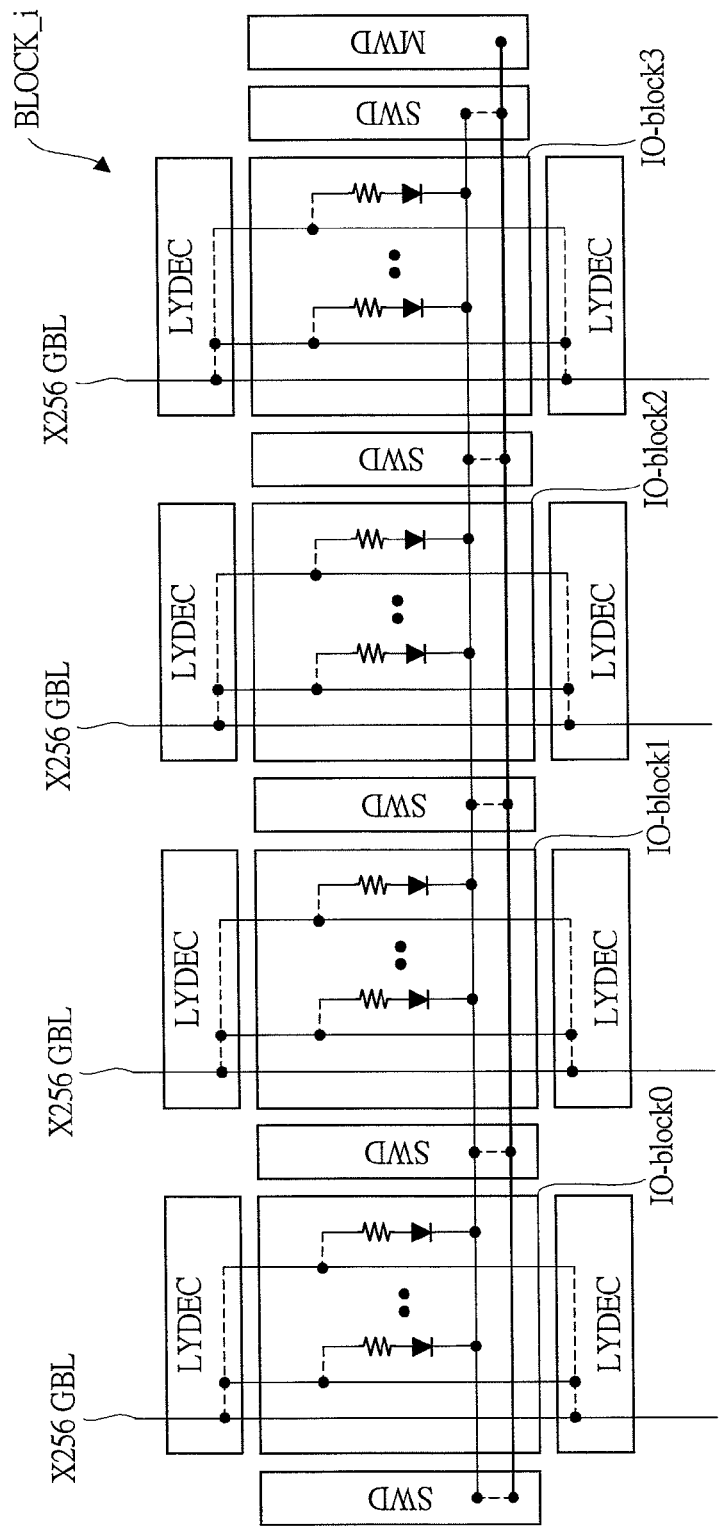
FIG. 52 is a schematic diagram depicting an example of structure of a circuit block selected in a read operation in a phase-change memory described in Non-Patent Document 2.

In a sixth embodiment, an example of a circuit block structure is described in the case where the circuit block depicted in FIG. 52 is developed so that a segment-word-line driving circuit SWD is shared. FIG. 48 is a schematic diagram depicting an example of structure of a circuit block in a semiconductor device according to the sixth embodiment of the present invention. A feature of the drawing is such that input/output blocks adjacent in a global-bit-line direction share a common segment-word-line driving circuit CNSWD.

In the drawing, a block DBLOCK1_i configured of eight input/output blocks is depicted. Common segment-word-line driving circuits CNSWD010 to CNSWD014 are disposed on the left and right of four pairs of input/output blocks vertically disposed along a global bit line (GBL) from among eight input/output blocks. That is, on the left and right of an input/output block IO-block00 and an input/output block IO-block10, which are a first pair of input/output blocks, common segment-word-line driving circuits CNSWD010 and CNSWD011 are disposed. On the right of an input/output block IO-block01 and an input/output block IO-block11, which are a second pair of input/output blocks, a common segment-word-line driving circuit CNSWD012 is disposed. On the right of an input/output block IO-block02 and an input/output block IO-block12, which are a third pair of input/output blocks, a common segment-word-line driving circuit CNSWD013 is disposed. On the right of an input/output block IO-block03 and an input/output block IO-block13, which are a fourth pair of input/output blocks, a common segment-word-line driving circuit CNSWD014 is disposed.

In each of the common segment-word-line driving circuits CNSWD010 to CNSWD014, a circuit driving the word line WL is disposed at a point of intersection of a main word line MWL and a word line WL. Then, the word line WL is extended to the upper-stage input/output blocks IO-block00 to IO-block03 and the lower stage input/output blocks IO-block10 to IO-block13. When the main word line MWL is activated by a main word driver MWD to select a word line WL, a ground voltage VSS is applied to a memory cell on a word line WL included in the upper-stage input/output blocks IO-block00 to IO-block03 and the lower-stage input/output blocks IO-block10 to IO-block 13. At this time, by activating either one of local column decoders LYDEC00U to LYDEC03U and LYDEC00L to LYDEC03L disposed in the upper-stage input/output blocks IO-block00 to IO-block03 and local column decoders LYDEC10U to LYDEC13U and LYDEC10L to LYDEC13L disposed in the lower-stage input/output blocks IO-block10 to IO-block13, either one of a memory cell on the word line WL included in the upper-stage input/output blocks IO-block00 to IO-block03 and a memory cell on the word line WL included in the lower-stage input/output blocks IO-block10 to IO-block13 can be connected to the global bit line GBL.

As described above, with two input/output blocks along the global bit line sharing the common segment-word-line driving circuit, the area of the common segment-word-line driving circuit can be reduced by half. Here, the number of memory cells selected is the same as that of the structure depicted in FIG. 51, and therefore the number of cells capable of a rewrite operation at a time is maintained. Also, by activating either one of local column decoders LYDEC00U to LYDE03U and LYDEC00L to LYDEC03L disposed in the upper-stage input/output blocks IO-block00 to IO-block03 and local column decoders LYDEC10U to LYDEC13U and LYDEC10L to LYDEC13L disposed in the lower-stage input/output blocks IO-block10 to IO-block13, selection of any memory cell can be achieved. Thus, an improvement in cell occupied ratio of 1D-1R-type phase-change memory and an improvement in rewrite data transfer rate can both be achieved.

Note that the memory cells depicted in the drawing are each configured of a variable resistance using a phase-change material and a diode for selection. Even if an unselected word line or unselected bit line becomes in a floating state, current inflows to the unselected memory cell on the unselected word line or the unselected bit line are suppressed by the diode. Thus, erroneous writing can be suppressed, and a high-speed phase-change memory with high reliability and high degree of integration can be achieved.

Also, while FIG. 48 depicts the structure in which two input/output blocks adjacent in a global bit line direction share the common segment-word-line driving circuit CNSWD, how to share is not particularly restricted. For example, the common segment-word-line driving circuit CNSWD can be shared by four input/output blocks adjacent in the global-bit-line direction. In this case, the are of the common segment-word-line driving circuit as a whole chip can be reduced to one quarter, compared with the structure depicted in FIG. 52.

Seventh Embodiment

Figure 49:
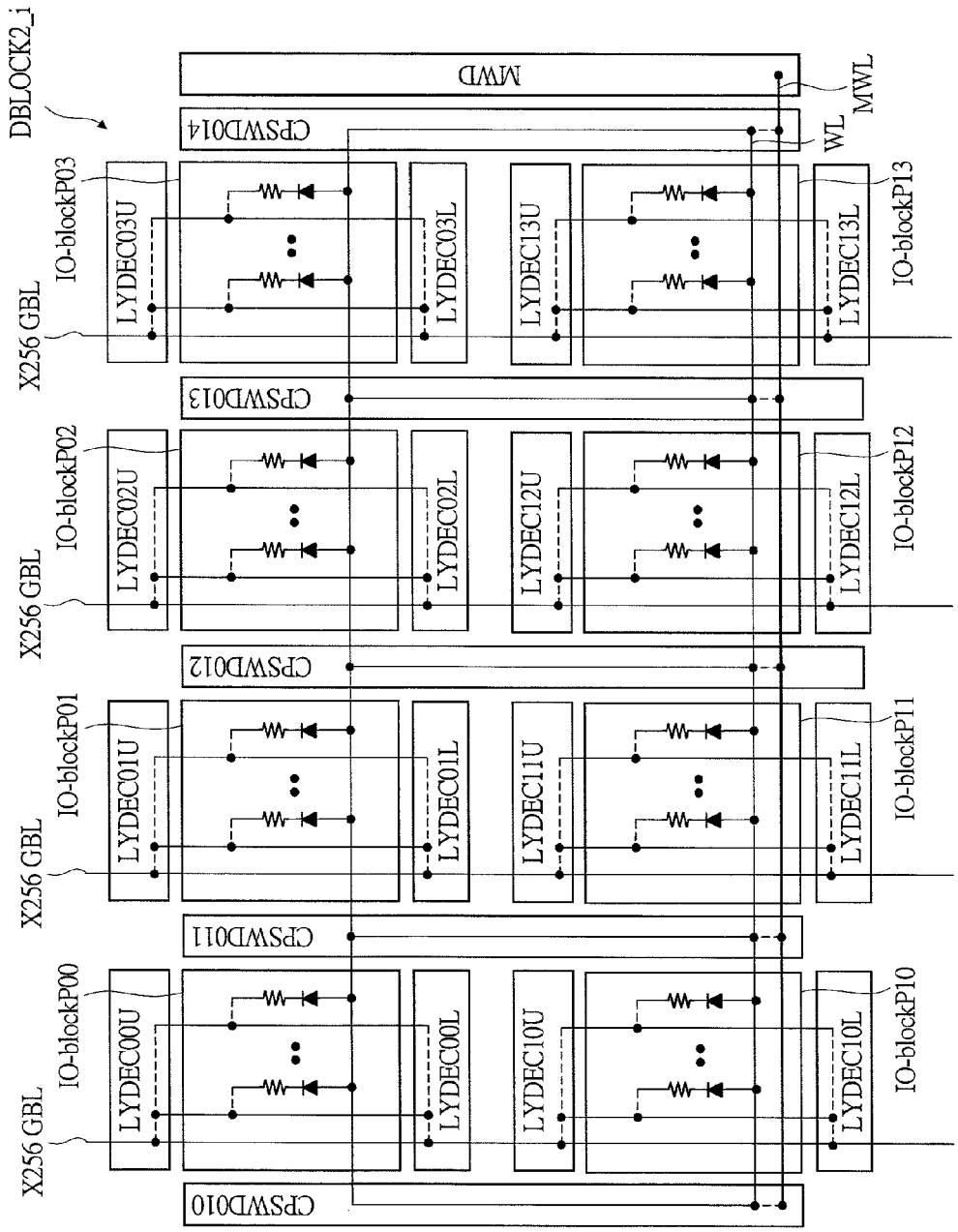
FIG. 49 is a schematic diagram depicting an example of structure of a circuit block in a semiconductor device according to a seventh embodiment of the present invention.

In a seventh embodiment, a modification example of FIG. 48 described above is described. FIG. 49 is a schematic diagram depicting an example of structure of a circuit block in a semiconductor device according to the seventh embodiment of the present invention. A main feature of a block DBLOCK2_i depicted in FIG. 49 is such that the input/output blocks IO-block00 to IO-block13 are replaced by input/output blocks IO-blockP00 to IO-blockP13. More specifically, in a memory cell, the polarity of the diode for selection is reverse, compared with FIG. 48. That is, a current route to the variable resistance via the diode for selection is formed in the order of a word line-the diode-the variable resistance-a bit line.

With this change, the common segment-word-line driving circuits CNSWD010 to CNSWD014 are replaced by CPSWD010 to CPSWD014. The common segment-word-line driving circuits CPSWD010 to CPSWD014 supply a high voltage to a selected word line. This high voltage may be a power supply voltage, or may be any voltage different from the ground voltage according to the electrical characteristics of the memory cell. Here, any voltage can be set so as to be different between a read operation and a rewrite operation.

According to this structure, effects similar to those in the sixth embodiment can be obtained. Also, local column decoders LYDEC00U to LYDEC03U, LYDEC00L to LYDEC03L, LYDEC10U to LYDEC13U, and LYDEC10L to LYDEC13L can reduce resistance at the time of conduction. That is, to apply a sufficiently large current in a rewrite operation, it is required to apply a voltage on the order of 1 V to the variable resistance using a phase-change material and a voltage equal to or higher than a PN-junction voltage (equal to or higher than approximately 1 V) to the diode. Accordingly, a voltage drop in the memory cell is expected to be approximately 2 V. Therefore, by inserting the diode so as to let a current flow from a word line to a bit line, the voltage to be applied to the drain and source of the transistor in the local column decoder LYDEC can be suppressed. That is, a substrate bias effect in the NMOS transistors MNYS0 to MNYSn depicted in FIG. 51 can be suppressed. Also, a loss in voltage between the gate and source can be suppressed. Thus, resistance when the NMOS transistors MNYS0 to MNYSn are conductive can be suppressed. Furthermore, since the gate voltage can be suppressed, no booster circuit is required depending on the electrical characteristics of the memory cell, thereby also reducing a chip area.

Note that while FIG. 49 depicts the structure in which two input/output blocks adjacent in the global bit line direction shares the common segment-word-line driving circuit CPSWD, how to share is not particularly restricted. For example, the common segment-word-line driving circuit CPSWD can be shared by four input/output blocks adjacent in the global bit line direction. In this case, the area of the common segment-word-line driving circuit as a whole chip can further be reduced to one quarter.

Eighth Embodiment

Figure 50:
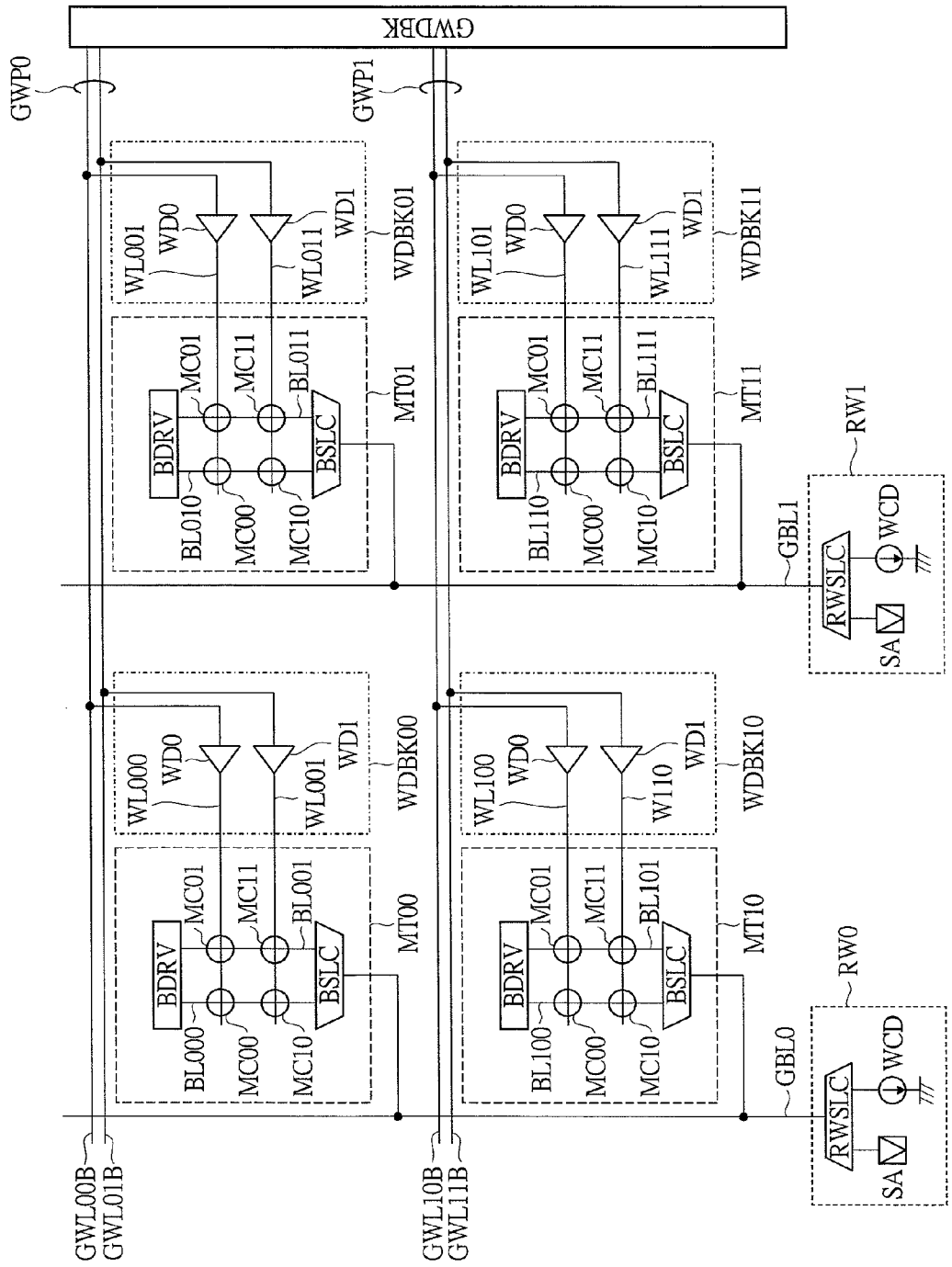
FIG. 50 is a schematic diagram depicting an example of structure of a memory cell array in a semiconductor device according to an eighth embodiment of the present invention.

In the eighth embodiment, an example of another arrangement of the word-line driving circuit is described. FIG. 50 is a schematic diagram depicting an example of structure of a memory cell array in a semiconductor device according to an eighth embodiment of the present invention. This memory cell array structure has two features, as described in the first embodiment. A first feature is that a word-line driving circuit WD is disposed for each of memory cell arrays (memory tiles) obtained by multi-division and, for each access cycle, the structure is such that one word-line driving circuit WD drives only one memory cell MC. A second feature is that each memory tile MT is configured of small-sized memory cells MC (here, two rows×two columns).

In FIG. 50, for simplification of description, four memory tiles MT00 to MT11 are depicted. These four memory tiles MT00 to MT11 are disposed so as to form a matrix of two rows×two columns, respectively at points of intersection of two global word line groups GWP0, GWP1 and two global bit lines GBL0, GBL1. Each of the memory tiles MT00 to MT11 has memory cells MC00 to MC11. These memory cells MC00 to MC11 are disposed, for example, as depicted in the memory tile MT00 at points of intersection of two word lines WL000, WL001 and two bit lines BL000, BL001. Each of the memory cells MC00 to MC11 is, as depicted in FIG. 3 and others, connected in the order of a word line-a diode-a variable resistance-a bit line.

Each of the memory tiles MT00 to MT11 has a bit-line selection circuit BSLC and a bit-line driving circuit BDRV disposed at both ends of the memory cells MC00 to MC11. The bit-line selection circuit BSLC is a control circuit for connecting a selected bit line and its corresponding global bit line. The bit-line driving circuit BDRV is a control circuit for supplying a predetermined voltage to an unselected bit line.

Adjacently to these four memory tiles MT00 to MT11, corresponding word-line circuit groups WDBK00 to WDBK11 are disposed, respectively. Each of the word-line driving circuit groups WDBK00 to WDBK11 has, for example, as the word-line driving circuit group WDBK00, two word-line driving circuits WD0, WD1. These word-line driving circuits WD0, WD1 drive the word lines WL000, WL001, respectively, according to the voltage of a global word line group GWP0. Here, the global word line group GWP0 is configured of global word lines GWL00B, GWL01B. Thus, the word-line driving circuits WD0, WD1 drive word lines WL000, WL001, according to the voltage of the global word lines GWL00B, GWL01B, respectively. Note that the global word line group GWP1 is similarly configured of global word lines GWL10B, GWL11B. These global word line groups GWP0, GWP1 are controlled by a global-word-line driving circuit group GWDBK.

To the global bit lines GBL0, GBL1, read/write circuits RW0, RW1 are respectively connected. Each of these read/write circuits RW0, RW1 is configured of a sense amplifier SA, a rewrite-current driving circuit WCD, and a read/write selection circuit RWSLC. The sense amplifier SA is a circuit for distinguishing stored information of a memory cell selected from a memory tile. The rewrite-current driving circuit WCD is a circuit for controlling a current to be applied to a memory cell according to the stored information. The read/write selection circuit RWSLC is a circuit for connecting either one of the sense amplifier SA and the rewrite-current driving circuit WCD to a global bit line.

In this structure, each word-line driving circuit is designed to have a size so as to drive a current required for rewriting one memory cell. That is, one memory cell is selected from one memory tile for a rewrite operation or a read operation. With this control, compared with the case in which one word-line driving circuit drives a plurality of memory cells, an IR drop can be reduced. Also, data pattern dependence of a current flowing through a word line or a bit line can be reduced. That is, with fluctuations in voltage drop in the word-line driving circuit and voltage fluctuations in a word line and a bit line being suppressed, an operation margin is expanded to achieve an operation with high reliability.

Furthermore, each memory tile MT is configured of small-sized memory cells MC, and is connected to one corresponding global bit line GBL. A plurality of these memory tiles MT are disposed in a direction in which the global word line GWL extends. With this, the number of memory cells to be simultaneously activated (the number of simultaneously-accessible global bit lines GBL) can be maintained. Thereby, speedups of the semiconductor device can be addressed. Also, when each memory tile MT is configured of small-sized memory cells MC, in addition to speedup described above, a reduction in load of being connected to the word-line driving circuit can be achieved, thereby also obtaining an improvement effect on an IR drop.

In the foregoing, while the invention made by the inventor has been specifically described based on the embodiments, the present invention is not meant to be restricted to the embodiments described above, and it goes without saying that the present invention can be variously modified without deviating from the gist of the invention. For example, the number of layers of memory cells to be laminated is not restricted to two, and may be less or more (for example, one layer or four layers). The semiconductor device of the embodiments is not restricted to a single memory chip, but can be applied to an interface of an on-chip memory. Furthermore, in the embodiments, the phase-change memory using a chalcogenide material as a storage element is presumed. However, the concept of the embodiments does not restrict the material of the storage element, and can be applied to not only a phase-change memory but also various semiconductor memories using a variable resistance, such as a magnetic-resistance random access memory or a resistive memory.

In the semiconductor device according to an embodiment, a memory cell array in a phase-change memory is configured of a plurality of memory tiles obtained by division by a local-bit-line driving circuit, a local-bit-line selection circuit and a bit-line selection circuit, and a word-line driving circuit groups. Each memory tile is configured of laminated memory cells. A word-line driving circuit for driving the memory cells laminated on the same axis is shared in common. Also, the word-line driving circuit is shared by a plurality of memory tiles disposed in a global bit line direction. With this, the area of the word-line driving circuit is suppressed, thereby improving density of the memory tiles. That is, the degree of integration of the phase-change memory can be improved, and the chip area or manufacturing cost can be reduced. Thus,

DESCRIPTION OF CHARACTERS

100 P-type silicon substrate
101 P-well region
102 N-well region
103 polysilicon layer
104 N+ diffusion layer region
105 oxide for device isolation
201, 202, 211 to 214, 221, 222, 500, 501 tungsten layer
300 contact
301 to 305, 311, 312 via
400 P layer of a PN diode
401 N layer of the PN diode
402 chalcogenide material layer
BCBK bit-line control circuit group
BDRV bit-line driving circuit
BL bit line
BLCTL bit-line control circuit
BLOCK_i selected block
BLS bit-line selection signal
BLSnB bit-line driving signal
BSLC bit-line selection circuit
CML CMOS integrated circuit layer
D selection-purpose diode
DE global-bit-line driving signal
DEBS global-bit-line driving signal group
DISCRGB discharge signal
DX X-decode address signal
DY Y-decode address signal
GBL global bit line
GBP global bit line group
GL global wiring layer
GWD global-word-line driving circuit
GWDBK global-word-line driving circuit group
GWLnB global word line
GWP global word line group
IV inverter circuit
IO-block input/output block
LBL local-bit line
LBLDIS local-bit line discharge signal
LCA local cell array
LDRV local-bit-line driving circuit
LS local-bit-line selection signal
LSLC local-bit-line selection circuit
LSnB local-bit-line driving signal
LY local-column selection signal
LYDEC local-column decoder
MC memory cell
MCBK memory cell group
MCL memory cell layer
MN, MNYS, MNBD, MND, MNLS, MNLD NMOS transistor
MP PMOS transistor
MT memory tile
MTBK memory tile group
MWD main word driver
ND NAND circuit
NR NOR circuit
R resistive storage device
RE read start signal
REBS read start signal group
RWC, RWUC read/write control unit
RW, RWU read/write circuit
RWUSLC read/write selection circuit
SA sense amplifier
SWD section-word-line driving circuit
CNSWD, CPSWD common segment-word-line driving circuit
VA, VAPL array voltage (array voltage feeder line)
VRD read voltage
VSLC array-voltage selection circuit
VSPL ground-voltage feeder line
VWT rewrite voltage
WCD rewrite-current driving circuit
WD word-line driving circuit
WDBK word-line driving circuit group
WE rewrite start signal
WEBS rewrite start signal group
WL word line
X X address signal
XIJTCRG, YIJTCRG current applying signal
Y Y address signal

The invention claimed is:
1. A semiconductor device comprising:
first and second global word lines extending toward a first direction;
a plurality of global bit lines extending toward a second direction orthogonal to the first direction and including a first global bit line;
first and second memory tiles respectively provided at points of intersection of the first global bit lines and the first and second global word lines;
a first word-line driving circuit controlled by the first global word line; and
a second word-line driving circuit controlled by the second global word line, wherein
the first and second memory tiles each includes:
a plurality of word lines including first and second word lines;
a plurality of bit lines;
a bit-line selection circuit controlling connection between the plurality of bit lines and the first global bit line; and
a plurality of memory cells respectively disposed at points of intersection between the plurality of word lines and the plurality of bit lines and including a diode for selection and a variable resistance element for storing information, wherein
the first word lines included in the first and second memory tiles are commonly connected to the first word-line driving circuit,
the second word lines included in the first and second memory tiles are commonly connected to the second word-line driving circuit, and
when the first word-line driving circuit is activated in accordance with a rewrite operation, an output from the first word-line driving circuit is connected to only the first global bit line via any one of memory cells connected to the first word lines included the first and second memory tiles and the bit-line selection circuit and, when the second word-line driving circuit is activated in accordance with a rewrite operation, an output from the second word-line driving circuit is connected to only the first global bit line via any one of memory cells connected to the second word lines included the first and second memory tiles and the bit-line selection circuit.
2. The semiconductor device according to claim 1, wherein the first and second word-line driving circuit is supplied with a power supply voltage through a common voltage feeder line.

3. The semiconductor device according to claim 1, wherein
the diode for selection has an anode connected to any one of the plurality of word lines and a cathode connected to one end of the variable resistance element, and
another end of the variable resistance element is connected to any one of the plurality of bit lines.

4. The semiconductor device according to claim 3, wherein
the first global bit line is divided into a second global bit line and a third global bit line,
the semiconductor device further includes a rewrite circuit controlling the second and third global bit lines in accordance with a rewrite operation,
a part of the plurality of bit lines included in the first memory tile is connected to the second global bit line via the bit-line selection circuit,
another part of the plurality of bit lines included in the first memory tile is connected to the third global bit line via the bit-line selection circuit,
when the first word-line driving circuit or the second word-line driving circuit is activated in accordance with a rewrite operation, the rewrite circuit drives the second global bit line to a rewrite current, and sets the third global bit line at an voltage equal to or higher than an output voltage of the first word-line driving circuit or the second word-line driving circuit, and
the bit-line selection circuit connects one of the part of the plurality of bit lines to the second global bit line, and connects one of another part of the plurality of bit lines to the third global bit line.

5. The semiconductor device according to claim 1, wherein
the first and second memory tiles each further have a bit-line driving circuit that sets the diode for selection in a reverse bias state by applying a first voltage to the plurality of bit lines according to a control signal.

6. A semiconductor device comprising:
a global word line group extending toward a first direction and including first and second global word lines;
first and second global bit lines extending toward a second direction orthogonal to the first direction; and
first and second memory tile groups respectively provided at points of intersection of the global word line group and the first and second global bit lines and disposed adjacently to the first direction, wherein
the first and second memory tile groups each includes:
a plurality of memory tiles disposed adjacently to the second direction and including first and second memory tiles; and
a word-line driving circuit group including a first word-line driving circuit controlled by the first global word line and a second word-line driving circuit controlled by the second global word line,
the first and second memory tiles each includes:
a plurality of word lines extending toward the first direction and including the first and second word lines;
a plurality of bit lines extending toward the second direction;
a plurality of memory cells respectively disposed at points of intersection of the plurality of word lines and the plurality of bit lines and including a diode for selection and a variable resistance element for storing information; and
a bit-line selection circuit performing a selecting operation so that, in a rewrite operation, only any one of the plurality of bit lines is connected to a corresponding global bit line,
the bit-line selection circuit included in the first and second memory tiles of the first memory tile group connects a bit line subjected to the selecting operation to the first global bit line,
the bit-line selection circuit included in the first and second memory tiles of the second memory tile group connects a bit line subjected to the selecting operation to the second global bit line, and,
in the first and second memory tile groups,
an output from the first word-line driving circuit is connected to the first word line in the first memory tile and the first word line in the second memory tile, an output from the second word-line driving circuit is connected the second word line in the first memory tile and the second word line in the second memory tile and, when one of the bit-line selection circuits in the first and second memory tiles performs the selecting operation, a control is performed so that the other one thereof does not perform the selecting operation.

7. The semiconductor device according to claim 6, wherein
the first and second word-line driving circuits included in the first memory tile group is supplied with a power supply voltage through a first voltage feeder line extending toward the second direction, and
the first and second word-line driving circuits included in the second memory tile group is supplied with a power supply voltage through a second voltage feeder line extending toward the second direction.

8. The semiconductor device according to claim 6, wherein
the diode for selection has an anode connected to any one of the plurality of word lines and a cathode connected to one end of the variable resistance element, and
another end of the variable resistance element is connected to any one of the plurality of bit lines.

9. The semiconductor device according to claim 6, wherein
the first and second memory tiles each further have a bit-line driving circuit that sets the diode for selection in a reverse bias state by applying a first voltage to the plurality of bit lines according to a control signal.

10. A semiconductor device comprising:
first and second global word lines extending toward a first direction;
a plurality of global bit lines extending toward a second direction orthogonal to the first direction and including a first global bit line;
first and second memory tiles respectively provided at points of intersection of the first global bit line and the first and second global word lines;
a first word-line driving circuit controlled by the first global word line; and
a second word-line driving circuit controlled by the second global word line, wherein
the first and second memory tiles each include:
a plurality of upper-layer word lines including first and second upper-layer word lines;
a plurality of lower-layer word lines including first and second lower-layer word lines;
a plurality of upper-layer bit lines and a plurality of lower-layer bit lines;
a bit-line selection circuit controlling connections between the plurality of upper-layer bit lines and the plurality of lower-layer bit lines and the first global bit line;
a plurality of upper-layer memory cells respectively disposed at points of intersection of the plurality of upper-layer word lines and the plurality of upper-layer bit lines and including a diode for selection and a variable resistance element for storing information; and a plurality of lower-layer memory cells respectively disposed at points of intersection of the plurality of lower-layer word lines and the plurality of lower-layer bit lines and including a diode for selection and a variable resistance element for storing information, the first upper-layer word line and the first lower-layer word line included in the first and second memory tiles are commonly connected to the first word-line driving circuit, the second upper-layer word line and the second lower-layer word line included in the first and second memory tiles are commonly connected to the second word-line driving circuit, and when the first word-line driving circuit is activated in accordance with a rewrite operation, an output from the first word-line driving circuit is connected to only the first global bit line via any one of memory cells connected to the first upper-layer word line and the first lower-layer word line included in the first and second memory tiles and the bit-line selection circuit and, when the second word-line driving circuit is activated in accordance with a rewrite operation, an output from the second word-line driving circuit is connected to only the first global bit line via any one of memory cells connected to the second upper-layer word line and the second lower-layer word line included in the first and second memory tiles and the bit-line selection circuit.

11. The semiconductor device according to claim 10, wherein the first and second word-line driving circuit is supplied with a power supply voltage through a common voltage feeder line.

12. The semiconductor device according to claim 10, wherein the diode for selection has an anode connected to any one of the plurality of upper-layer word lines and the plurality of lower-layer word lines and a cathode connected to one end of the variable resistance element, and another end of the variable resistance element is connected to any one of the plurality of upper-layer bit lines and the plurality of lower-layer bit lines.

13. The semiconductor device according to claim 10, wherein the bit-line selection circuit has:

a first bit-line selection circuit selecting the plurality of upper-layer bit lines or the plurality of lower-layer bit lines; and a second bit-line selection circuit connecting any one of the plurality of upper-layer bit lines and the plurality of lower-layer bit lines selected by the first bit-line selection circuit to the first global bit line.

14. The semiconductor device according to claim 10, wherein the first and second memory tiles each further have a bit-line driving circuit that sets the diode for selection in a reverse bias state by applying a first voltage to the plurality of upper-layer bit lines and the plurality of lower-layer bit lines according to a control signal.

15. The semiconductor device according to claim 10, wherein the first memory tile and the second memory tile are disposed adjacently in the second direction on one semiconductor substrate, the first and second word-line driving circuits are formed adjacently in the first direction with respect to the first and second memory tiles on the semiconductor substrate, the first and second memory tiles each includes:

a transistor layer in which a transistor configuring the bit-line selection circuit is formed;

a memory cell layer positioned at an upper layer of the transistor layer in a third direction orthogonal to the first direction and the second direction; and a wiring layer positioned at an upper layer of the memory cell layer in the third direction, and, in the memory cell layer, each of the plurality of upper-layer memory cells and each of the plurality of lower-layer memory cells are formed so as to be laminated in the third direction.

16. The semiconductor device according to claim 15, wherein a plurality of wirings extending in the second direction are formed in the wiring layer, the plurality of wirings for connecting the plurality of upper-layer word lines and the plurality of lower layer word lines in the first memory tile and the plurality of upper-layer word lines and the plurality of lower-layer word lines in the second memory tile.

17. The semiconductor device according to claim 15, wherein, in the wring layer, a voltage feeder line extending in the second direction is formed, and the voltage feeder line is connected via vias to the first and second word-line driving circuits formed adjacently to the first and second memory tiles on the semiconductor substrate, and supplies each with a power supply voltage in common.

18. A semiconductor device comprising:

a first global word line extending in a first direction;

a plurality of global bit lines extending in a second direction orthogonal to the first direction and including a first global bit line and a second global bit line;

a first memory block and a second memory block disposed to be aligned in the second direction and each including a plurality of word lines, a plurality of bit lines, and a plurality of memory cells respectively disposed at points of intersection of the plurality of word lines and the plurality of bit lines;

a first local column decoder disposed adjacently to the first memory block in the second direction, selecting, in a rewrite operation, any one of part of the plurality of bit lines in the first memory block and connecting to the first global bit line, and further selecting any one of another part of the plurality of bit lines in the first memory block and connecting to the second global bit line;

a second local column decoder disposed adjacently to the second memory block in the second direction, selecting, in a rewrite operation, any one of part of the plurality of bit lines in the second memory block and connecting to the first global bit line, and further selecting any one of another part of the plurality of bit lines in the second memory block and connecting to the second global bit line; and a common segment-word-line driving circuit adjacently to the first memory block and the second memory block in the first direction and including a first word-line driving circuit controlled by the first global word line, wherein the plurality of memory cells each include a diode for selection and a variable resistance element for storing information, an output from the first word-line driving circuit is commonly connected to any one of the plurality of word lines included in the first memory block and any one of the plurality of word lines included in the second memory block, and, in the rewrite operation, either one of the first local column decoder and the second local column decoder performs the selecting operation.

19. The semiconductor device according to claim 18, wherein the diode for selection has an anode connected to any one of the plurality of word lines and a cathode connected to one end of the variable resistance element, and another end of the variable resistance element is connected to any one of the plurality of bit lines.

\* \* \* \* \*